(12) United States Patent
Taguchi et al.

(10) Patent No.: US 8,053,886 B2
(45) Date of Patent: Nov. 8, 2011

(54) SEMICONDUCTOR PACKAGE AND MANUFACTURING METHOD THEREOF

(75) Inventors: Yuichi Taguchi, Nagano (JP);
Mitsutoshi Higashi, Nagano (JP);
Akinori Shiraishi, Nagano (JP);
Hideaki Sakaguchi, Nagano (JP);
Masahiro Sunohara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 134 days.

(21) Appl. No.: 12/535,751

(22) Filed: Aug. 5, 2009

(65) Prior Publication Data

US 2010/0038772 A1    Feb. 18, 2010

(30) Foreign Application Priority Data

Aug. 12, 2008  (JP) ................................. 2008-207777
Dec. 24, 2008  (JP) ................................. 2008-328258

(51) Int. Cl.
  *H01L 23/48* (2006.01)
(52) U.S. Cl. ................................. 257/698; 257/E23.011
(58) Field of Classification Search .................. 257/698, 257/E23.011
See application file for complete search history.

(56) References Cited

U.S. PATENT DOCUMENTS

| | | | | |
|---|---|---|---|---|
| 5,998,864 A | * | 12/1999 | Khandros et al. | 257/723 |
| 7,279,788 B2 | * | 10/2007 | Canella | 257/692 |
| 7,659,612 B2 | * | 2/2010 | Hembree et al. | 257/698 |
| 7,883,908 B2 | * | 2/2011 | Hembree et al. | 438/15 |
| 2002/0110953 A1 | * | 8/2002 | Ahn et al. | 438/106 |
| 2006/0261491 A1 | | 11/2006 | Soeta et al. | |
| 2007/0132104 A1 | * | 6/2007 | Farnworth et al. | 257/774 |
| 2007/0246819 A1 | * | 10/2007 | Hembree et al. | 257/698 |
| 2009/0127698 A1 | * | 5/2009 | Rathburn | 257/698 |

FOREIGN PATENT DOCUMENTS

| | | |
|---|---|---|
| JP | 2003-188209 | 7/2003 |
| JP | 2006-324393 | 11/2006 |

\* cited by examiner

*Primary Examiner* — Victor A Mandala
(74) *Attorney, Agent, or Firm* — IPUSA, PLLC

(57) ABSTRACT

A semiconductor package includes a wiring board and a semiconductor device mounted on the wiring board. At least one penetration hole extends from one surface of the semiconductor chip to an opposite surface of the semiconductor chip. A penetration electrode is situated inside the penetration hole without contacting a wall of the penetration hole. The penetration electrode has one end fixed to the one surface of the semiconductor chip and an opposite end protruding from the opposite surface of the semiconductor chip. A connection terminal is formed on the opposite end of the penetration electrode and electrically connected to the wiring board.

16 Claims, 68 Drawing Sheets

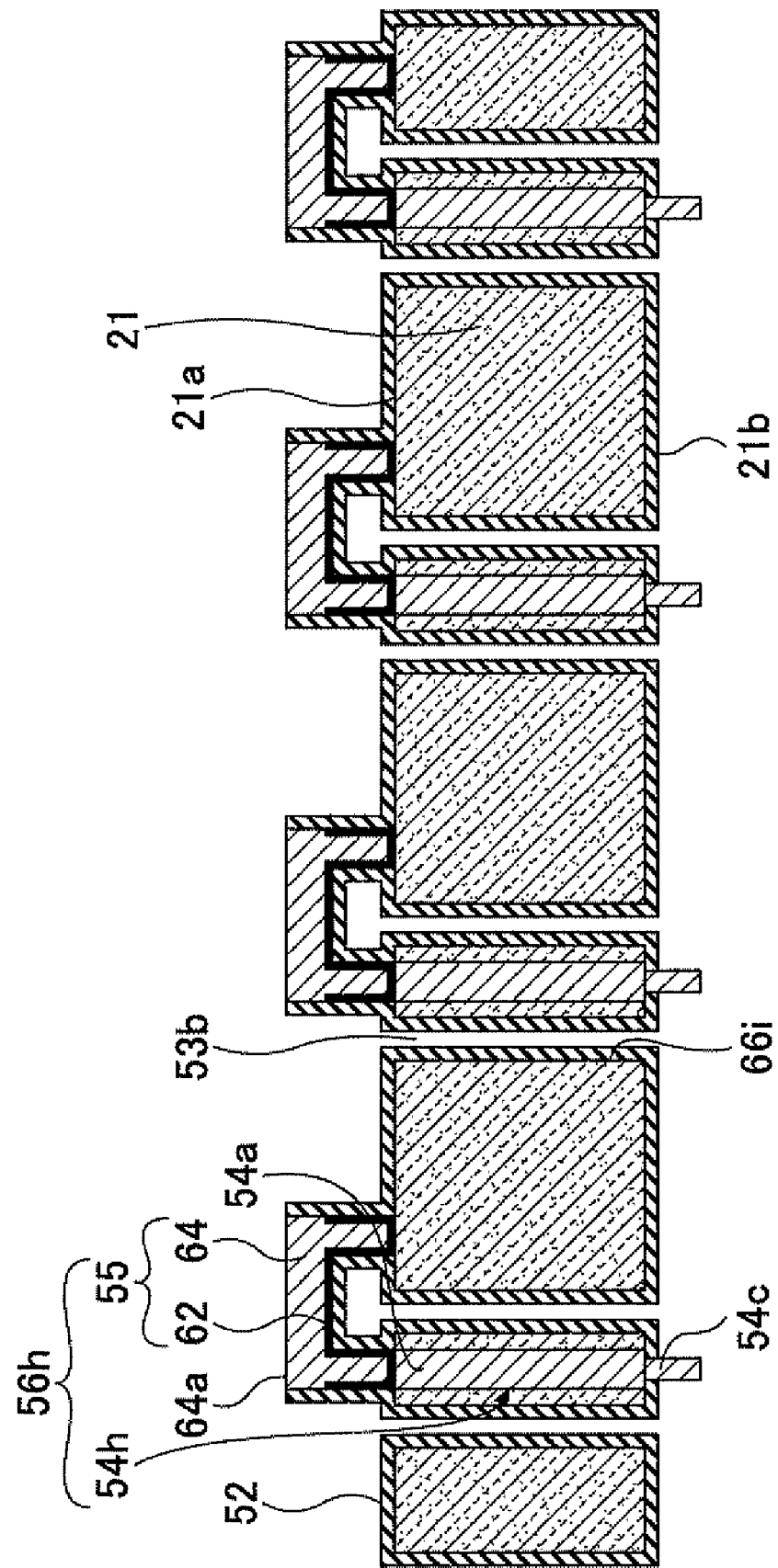

SEMICONDUCTOR PACKAGE AND MANUFACTURING METHOD THEREOF

CROSS-REFERENCE TO RELATED APPLICATIONS

This application is based upon and claims the benefit of priority of the prior Japanese Patent Applications No. 2008-207777, filed on Aug. 12, 2008 and No. 2008-328258 filed on Dec. 24, 2008, the entire contents of which are incorporated herein by reference.

FIELD

The embodiment discussed herein is directed to a semiconductor package having a wiring board and a semiconductor device mounted thereon.

BACKGROUND

Conventionally, there is known a semiconductor package in which a semiconductor device is mounted on a wiring board. FIG. 1 is a cross-sectional view of a part of a conventional semiconductor package 300. Referring to FIG. 1, the semiconductor package 300 includes a semiconductor device 400 and a wiring board 500. The semiconductor device 400 includes a semiconductor chip 410 and connection terminals 420.

The semiconductor chip 410 has a structure in which a semiconductor integrated circuit (not illustrated in the figure) and electrode pads (not illustrated in the figure) are formed on a semiconductor substrate (not illustrated in the figure) formed of a semiconductor material such as silicon. The connection terminals 420 serving as electrodes are formed on the electrode pads. For example, solder bumps may be used as the connection terminals 420.

The wiring board 500 includes an insulation layer 530, wiring layers 540, a solder resist layer 550 and pre-solders 570. In the wiring board 500, the wiring layers 540 are formed on the insulation layer 530, and the solder resist layer 550 having openings 550x is formed over the insulation layer 530 and the wiring layers 540. The pre-solders 570 are formed on portions of the wiring layers 540 exposed in the respective openings 550x. The wiring layers 540 may be formed of, for example, copper (Cu). The insulation layer 530 may be formed of, for example, an epoxy resin or a glass-epoxy, which is an epoxy resin containing a glass fiber cloth.

The connection terminals 420 of the semiconductor device 400 are electrically connected to the pre-solders 570 formed on the wiring layers 540 of the wiring board 500 (for example, refer to Patent Documents 1 and 2).

Patent Document 1: Japanese Laid-Open Patent Application No. 2003-188209

Patent Document 2: Japanese Laid-Open Patent Application No. 2006-324393

If a glass-epoxy is used to form the insulation layer 530, the thermal expansion coefficient of the insulation layer 530 is about 18 ppm/° C. On the other hand, if silicon is used to form the semiconductor substrate of the semiconductor chip 410, the thermal expansion coefficient of the semiconductor chip 410 is about 3 ppm/° C. Accordingly, if a glass-epoxy is used for the insulation layer 530 and silicon is used for the semiconductor substrate of the semiconductor chip 410, there is a large difference in thermal expansion coefficient between the insulation layer 530 and the semiconductor chip 410. Thus, when the semiconductor package 300 is heated, a relatively large stress is generated in joining parts between the connection terminals 420 and the pre-solders 570. Such a stress may cause a problem of cracking in the joining parts.

SUMMARY

It is a general object of the present invention to provide a semiconductor package in which the above-mentioned problem is eliminated.

A more specific object of the present invention is to provide a semiconductor package and a manufacturing method thereof, which can reduce a stress generated in joining parts, which join a semiconductor device to a wiring board in order to prevent the joining parts from cracking.

According to an aspect of the invention, a semiconductor package includes: a wiring board; and a semiconductor device mounted on the wiring board, the semiconductor device including: a semiconductor chip; at least one penetration hole extending from one surface of the semiconductor chip to an opposite surface of the semiconductor chip; a penetration electrode situated inside the penetration hole without contacting a wall of the penetration hole, the penetration electrode having one end fixed to the one surface of the semiconductor chip and an opposite end protruding from the opposite surface of the semiconductor chip; and a connection terminal formed on the opposite end of the penetration electrode and electrically connected to the wiring board.

According to another aspect of the invention, a semiconductor package includes: a wiring board; an interposer connected to the wiring board; and a semiconductor chip connected to the interposer, the interposer including: a substrate; at least one penetration hole extending from one surface of the substrate to an opposite surface of the substrate; a penetration electrode situated inside the penetration hole without contacting a wall of the penetration hole, the penetration electrode having one end fixed to the one surface of the substrate and electrically connected to the semiconductor chip, an opposite end of the penetration electrode protruding from the opposite surface of the substrate; and a connection terminal formed on the opposite end of the penetration electrode and electrically connected to the wiring board.

According to a further aspect of the invention, a manufacturing method of a semiconductor package includes: forming at least one penetration hole in a semiconductor chip; forming a penetration part constituting a portion of a penetration electrode by filling a metal into the penetration hole; forming a support part constituting a portion of the penetration electrode so that one end of the support part is fixed to a surface of the semiconductor chip and an opposite end of the support part is connected to the penetration part; forming a gap between the support part and the semiconductor chip; forming a space around the penetration part to expose a side surface of the penetration part by removing a base material of the semiconductor chip at a portion contacting the side surface of the penetration part so that the penetration hole is enlarged; causing one end of the penetration part to protrude from an opposite surface of the semiconductor chip; forming a connection terminal on the one end of the penetration part; and electrically connecting the connection terminal to a wiring board on which the semiconductor chip is mounted.

According to yet another aspect of the invention, a manufacturing method of a semiconductor package includes: forming at least one penetration hole in a semiconductor chip; forming a penetration part constituting a portion of a penetration electrode by filling a metal into the penetration hole; forming a support part constituting a portion of the penetration electrode so that one end of the support part is fixed to a surface of the semiconductor chip and an opposite end of the support part is connected to the penetration part; forming a gap between the support part and the semiconductor chip; forming a space around the penetration part so that a base material of the semiconductor chip remains on a side surface of the penetration part by removing the base material of the semiconductor chip at a portion surrounding the penetration part so that the penetration hole is enlarged; causing one end of the penetration part to protrude from an opposite surface of the semiconductor chip; forming a connection terminal on the one end of the penetration part; and electrically connecting the connection terminal to a wiring board on which the semiconductor chip is mounted.

According to another aspect of the invention a manufacturing method of a semiconductor package includes: forming at least one penetration hole in a substrate of an interposer to which a semiconductor chip is connected; forming a penetration part constituting a portion of a penetration electrode by filling a metal into the penetration hole; forming a support part constituting a portion of the penetration electrode so that one end of the support part is fixed to a surface of the substrate and an opposite end of the support part is connected to the penetration part; forming a gap between the support part and the substrate; forming a space around the penetration part to expose a side surface of the penetration part by removing a base material of the substrate at a portion contacting the side surface of the penetration part so that the penetration hole is enlarged; causing one end of the penetration part to protrude from an opposite surface of the substrate; forming a connection terminal on the one end of the penetration part; and electrically connecting the connection terminal to a wiring board on which the semiconductor chip is mounted with the interposer interposed therebetween.

According to a further aspect of the invention, a manufacturing method of a semiconductor package includes: forming at least one penetration hole in a substrate of an interposer to which a semiconductor chip is connected; forming a penetration part constituting a portion of a penetration electrode by filling a metal into the penetration hole; forming a support part constituting a portion of the penetration electrode so that one end of the support part is fixed to a surface of the substrate and an opposite end of the support part is connected to the penetration part; forming a gap between the support part and the substrate; forming a space around the penetration part so that a base material of the substrate remains on a side surface of the penetration part by removing the base material of the substrate at a portion surrounding the penetration part so that the penetration hole is enlarged; causing one end of the penetration part to protrude from an opposite surface of the substrate; forming a connection terminal on the one end of the penetration part; and electrically connecting the connection terminal to a wiring board on which the semiconductor chip is mounted with the interposer interposed therebetween.

According to the above-mentioned invention, when heat is applied to the semiconductor package, the stress generated in the joining parts, which join the semiconductor device to the wiring board, can be reduced, thereby preventing a generation of cracking in the joining parts.

The object and advantages of the embodiment will be realized and attained by means of the elements and combinations particularly pointed out in the appended claims.

It is to be understood that both the foregoing general description and the following detailed description are exemplary explanatory only and are not restrictive of the invention, as claimed.

BRIEF DESCRIPTION OF DRAWINGS

FIG. 65 is a cross-sectional view illustrating a third step of the manufacturing method of the semiconductor package illustrated in FIG. 62.

DESCRIPTION OF EMBODIMENT(S)

Preferred embodiments of the present invention will be explained with reference to the accompanying drawings.

First Embodiment

Figure 1:
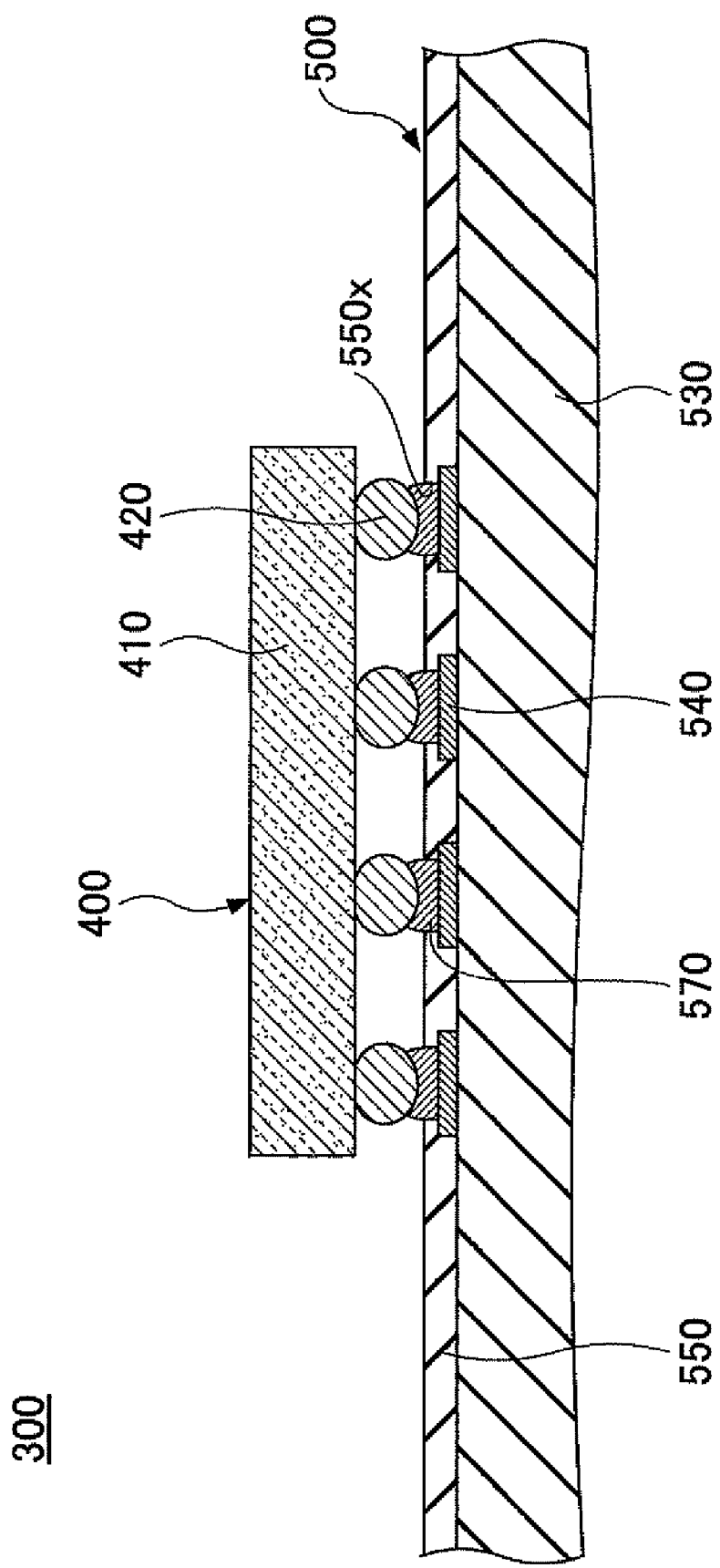
FIG. 1 is a cross-sectional view of a part of a conventional semiconductor package.
Figure 2:
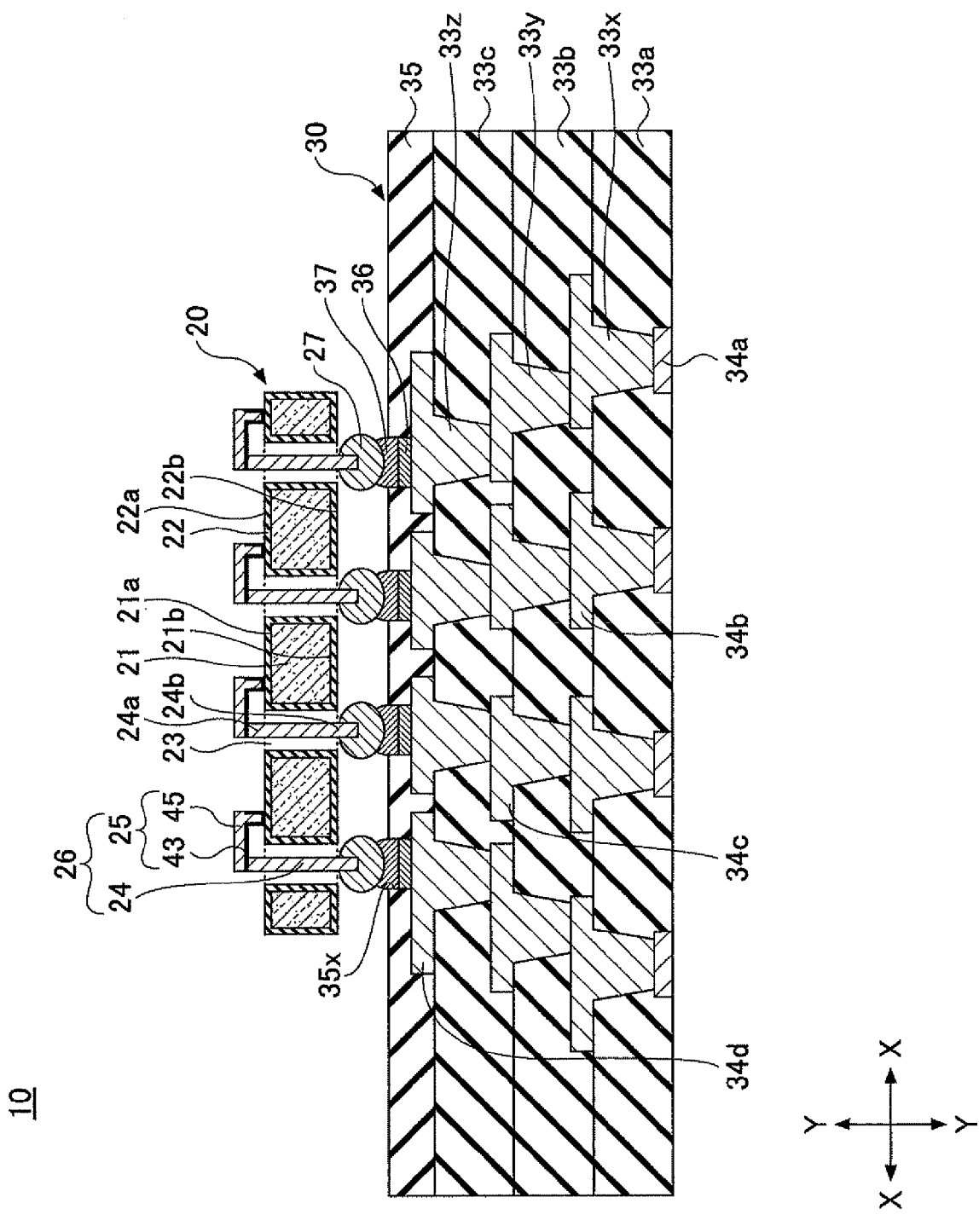
FIG. 2 is a cross-sectional view of a semiconductor package according to a first embodiment of the present invention.
Figure 3:
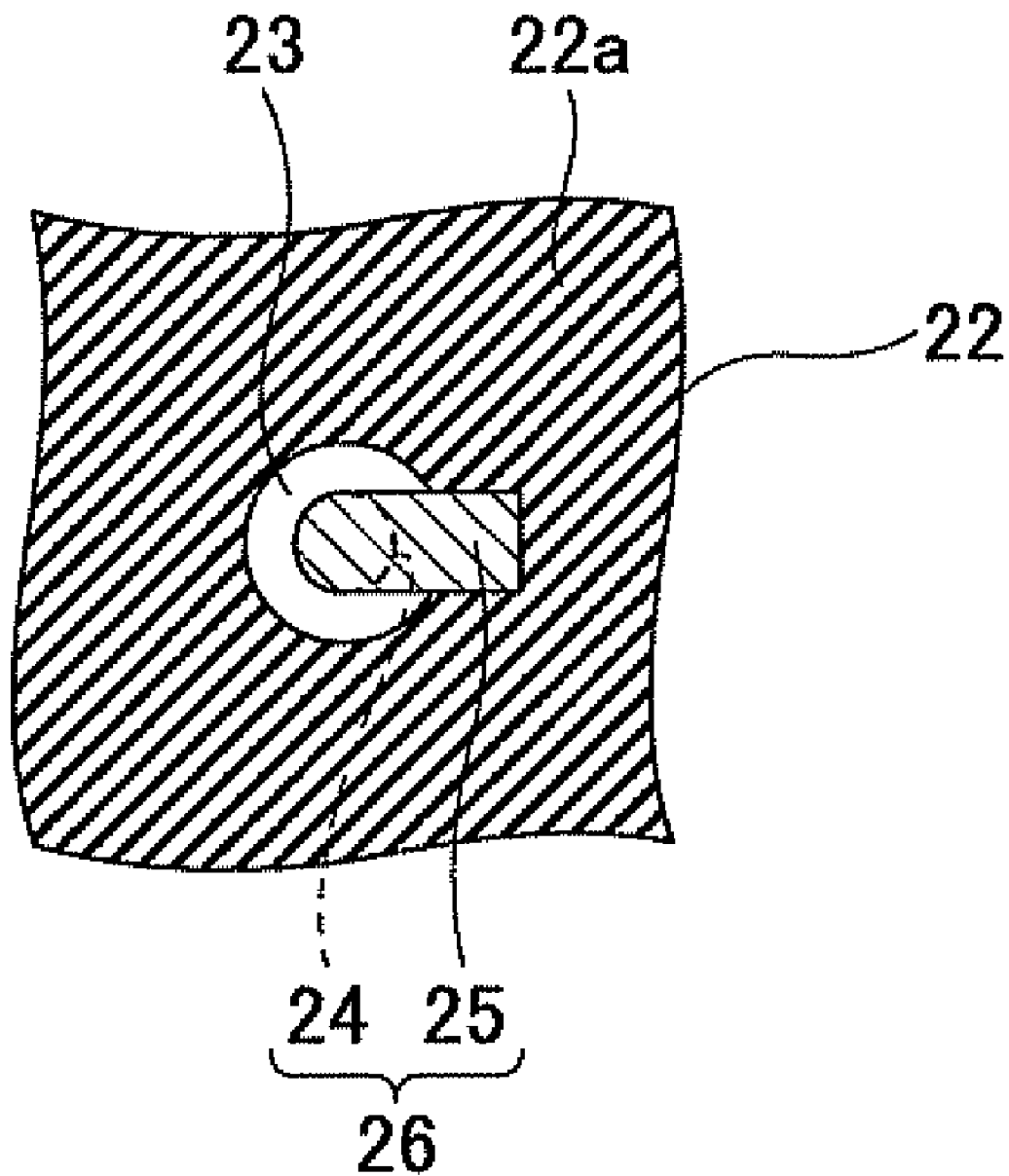
FIG. 3 is a plan view of a penetration electrode part illustrated in FIG. 2.

A description will be given first of a structure of a semiconductor package according to a first embodiment of the present invention. FIG. 2 is a cross-sectional view of a semiconductor package 10 according to the first embodiment of the present invention. FIG. 3 is a plan view of a penetration electrode part illustrated in FIG. 2. In FIG. 2, an X-X direction indicates a direction parallel to a top surface 21a of a semiconductor chip 21 mentioned later, and a Y-Y direction indicates a direction perpendicular to the X-X direction. In FIG. 3, parts that are the same as the parts illustrated in FIG. 2 are given the same reference numerals, and descriptions thereof will be omitted.

With reference to FIG. 2 and FIG. 3, the semiconductor package 10 according to the first embodiment includes a semiconductor device 20 and a wiring board 30. The semiconductor device 20 includes a semiconductor chip 21, an insulation film 22, penetration holes 23, penetration electrodes 26 and connection terminals 27.

The semiconductor chip 21 is provided with a semiconductor integrated circuit (not illustrated in the figure), which is formed by a diffusion layer, vias and wiring layers. For example, silicon is used to form the semiconductor chip 21. The thickness of the semiconductor chip 21 can be set to, for example, 300 μm.

The insulation film 22 is provided to cover surfaces of the semiconductor chip 21, which surfaces include inner surfaces of the penetration holes 23. The insulation film 22 is a film for insulating the semiconductor chip 21 and the penetration electrodes from each other. For example, an oxidized film such as a thermally-oxidized film may be used to form the insulation film 22. If a thermally-oxidized film is used as the insulation film 22, the thickness of the insulation film 22 can be set to, for example, 0.5 μm to 1.0 μm.

The penetration holes 23 penetrate through the semiconductor chip 21. The penetration holes 23 are provided in portions of the semiconductor chip 21 where no semiconductor integrated circuit is formed. Each of the penetration holes 23 has a circular shape in a plan view, and a diameter of each of the penetration holes 23 can be set to, for example, 50 μm. The interval or pitch of the penetration holes 23 can be set to, for example, 100 μm, but not limited to 100 μm and other intervals or pitches are selectable.

Each of the penetration electrodes 26 includes a penetration part 24 and a support part 25. The penetration part 24 is formed of an electrically conductive material, and arranged in the penetration hole 23 so that the penetration part 24 does not contact the semiconductor chip 21 and the insulation film 22. One end 24a of the penetration part 24 protrudes from a surface 22a of the insulation film 22 provided on an upper surface 21a of the semiconductor chip 21.

The end 24a of the penetration part 24 is integrally formed with the support part 25. The other end 24b of the penetration part 24 protrudes from a surface 22b of the insulation film 22 provided on a lower surface 21b of the semiconductor chip 21. The penetration part 24 has a circular shape in a plan view, and a diameter of the penetration part 24 can be set to, for example, 30 μm.

The support part 25 constituting the penetration electrode 26 includes a seed layer 43 and a plated film 45. The seed layer 43 is formed of an electrically conductive material. One end of the support part 25 is integrally formed with the end 24a of the penetration part 24, and the other end of the support part 25 is fixed to the upper surface 21a of the semiconductor chip 21 via the insulation film 22 so that the support part 25 is electrically connected to a wiring layer (not illustrated in the figure) formed on the semiconductor chip 21. The wiring layer extends from a semiconductor integrated circuit (not illustrated in the figure).

The support part 25 has a spring characteristic in order to movably support the entire penetration part 24 in the Y-Y direction and movably support the end 24b of the penetration part 24 in the X-X direction. A portion of the support part 25 contacting the surface 22a of the insulation film 22 has a circular shape in a plan view, and a diameter of the portion of the support part can be set to, for example, 30 μm.

It is desirable to form the penetration part 24 of the penetration electrode 26 by an electrically conductive material such as copper (Cu), and form the support part 25 by a brass (Cu—Zn alloy). If the support part 25 is formed of copper (Cu), a spring characteristic can be given to the support part 25 and the support part 25 can be easily formed by using a plating method.

The connection terminal 27 is formed on the end 24b of the penetration part 24. The connection terminal 27 is not fixed to the surface 22b of the insulation film 22. Although the connection terminal 27 can be brought into contact with the surface 22b of the insulation film 22, it is desirable to form a small gap (for example, about 50 μm) between the connection terminal 27 and the insulation film 22 so that the connection terminal 27 and the insulation film 22 do not contact each other. The connection terminal 27 is supported by the support part 25 through the penetration part 24. The penetration part 24 and the connection terminal 27 are electrically connected with each other.

The connection terminal 27 is provided to electrically connect the semiconductor device 20 to the wiring board 30. A terminal material such as a solder bump, a gold (Au) bump, a conductive paste or the like may be used to form the connection terminal 27. If a solder ball is selected as a material of the connection terminal 27, an alloy containing Pb, an alloy of Sn and Cu, an alloy of Sn and Ag, an alloy of Sn, Ag and Cu, etc., may be used.

The wiring board 30 is provided with a built-up wiring layer having a first insulation layer 33a, a second insulation layer 33b, a third insulation layer 33c, a first wiring layer 34a, a second wiring layer 34b, a third wiring layer 34c, a fourth wiring layer 34d, a solder resist layer 35, a metal layer 36, and a pre-solder 37.

In the wiring substrate 30, the first wiring layer 34a is formed as a lowermost layer. The first insulation layer 33a is formed to cover the first wiring layer 34a. The second wiring layer 34b is formed on the first insulation layer 33a. The second insulation layer 33b is formed to cover the second wiring layer 34b. The third wiring layer 34c is formed on the second insulation layer 33b. The third insulation layer 33c is formed to cover the third wiring layer 34c. The fourth wiring layer 34d is formed on the third insulation layer 33c. The first wiring layer 34a is exposed from the first insulation layer 33a in order to serve as an electrode pad to be connected to a motherboard or the like.

The first wiring layer 34a and the second wiring layer 34b are electrically connected to each other through a first via hole 33x formed in the first insulation layer 33a. The second wiring layer 34b and the third wiring layer 34c are electrically connected to each other through a second via hole 33y formed in the second insulation layer 33b. The third wiring layer 34c and the fourth wiring layer 34d are electrically connected to each other through a third via hole 33z formed in the third insulation layer 33c.

A solder resist layer 35 having openings 35x is formed to cover the fourth wiring layer 34d. The metal layer 36 is formed on the fourth wiring layer 34d in the openings 35x of the solder resist layer 35. The metal layer 36 may be a Ni/Au plated layer formed on the fourth wiring layer 34d in the openings 35x of the solder resist layer 35. The Ni/Au plated layer is formed by laminating a nickel (Ni) plated layer and a gold (Au) plated layer on the fourth wiring layer 34d in that order.

The pre-solder 37 is formed on the metal layer 36 by applying a solder paste or the like. The pre-solder 37 of the wiring board 30 and the connection terminal 27 of the semiconductor device 20 are electrically connected with each other. If the connection terminal 27 is formed of a solder, the connection terminal 27 and the pre-solder 37 are heated, when the semiconductor device 20 is mounted on the wiring board 30, which results in formation of a bump by the connection terminal 27 and the pre-solder 37 being melted and formed into an alloy.

As mentioned above, the semiconductor device 20 is mechanically and electrically connected to the pre-solder 37 of the wiring board 30 via the connection terminal 27. The support part 25 has a spring characteristic and movably supports the entire penetration part 24 in the Y-Y direction and movably supports the end 24b of the penetration part 24 in the X-X direction, and the end 24b of the penetration part 24 is formed with the connection terminal 27. Additionally, the connection terminal 27 is not fixed to the surface 22b of the insulation layer 22. That is, the connection terminal 27 is movably supported in the Y-Y direction and X-X direction by the support part 25 through the penetration part 24.

Here, considering a case where heat is applied to the semiconductor package 10, a stress may be generated in the joining part (the connection terminal 27 and the pre-solder 37) because a difference in thermal expansion coefficients exists between the semiconductor device 20 and the wiring board 30. However, because the connection terminal 27 is supported by the support part 25 in the movable state in the Y-Y direction and the X-X direction, the stress generated in the joining part (the connection terminal 27 and the pre-solder 37) can be reduced greatly. Thus, the joining part (the connection terminal 27 and the pre-solder 37) is prevented from cracking.

A description will be given below of a manufacturing method of the semiconductor package according to the present embodiment. FIG. 4 through FIG. 19 are cross-sectional views for explaining a manufacturing process of the semiconductor package according to the first embodiment of the present invention. In FIG. 4 through FIG. 19, parts that are the same as the parts illustrated in FIG. 2 are given the same reference numerals, and descriptions thereof will be omitted.

Figure 4:
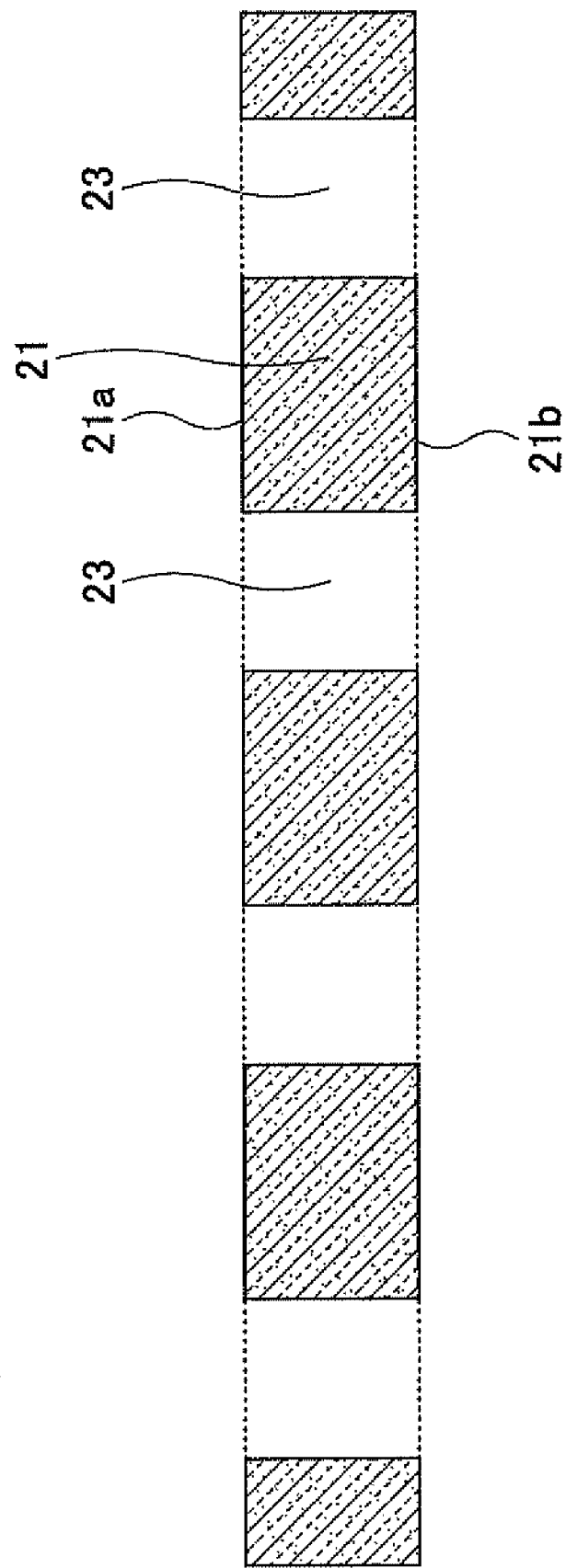
FIG. 4 is a cross-sectional view illustrating a first step of a manufacturing process of the semiconductor package illustrated in FIG. 2.

First, in a first step of the manufacturing process illustrated in FIG. 4, a plurality of penetration holes 23 are formed in the semiconductor chip 21, which constitutes the semiconductor device 20. The penetration holes 23 penetrate the semiconductor chip 21 to extend from the upper surface 21a to the lower surface 21b. The semiconductor chip 21 is formed of, for example, silicon. The thickness of the semiconductor chip 21 is, for example, 300 μm.

If the semiconductor chip 21 is formed of silicon, the penetration holes 23 can be formed by an anisotropic etching method such as, for example, a dry-etching method. Each of the penetration holes 23 has a circular shape in a plan view, and the diameter of each of the penetration holes can be set to, for example, 50 μm. The pitch of the penetration holes 23 can be set to, for example, 100 μm. In the present embodiment, a description will be given on the assumption that semiconductor chip 21 is formed of silicon.

Figure 5:
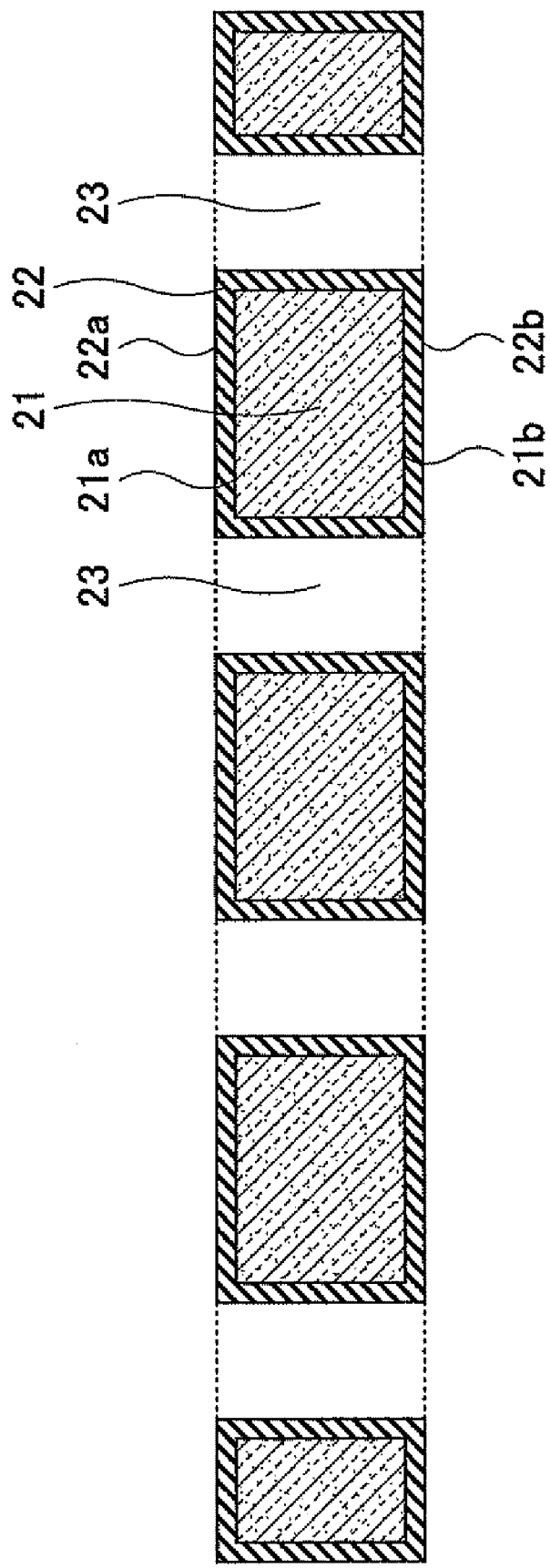
FIG. 5 is a cross-sectional view illustrating a second step of the manufacturing process of the semiconductor package illustrated in FIG. 2.

Subsequently, in a second step of the manufacturing process illustrated in FIG. 5, the insulation film 22 is formed on the surfaces of the semiconductor chip 21 to cover the surfaces of the semiconductor chip 21 including inner walls of the through holes 23. An oxidation film such as, for example, a thermally-oxidized film may be used as the insulation film 22. When the semiconductor chip 21 is formed of silicon, a thermally-oxidized film covering the surfaces of the semiconductor chip 21 can be formed by thermally-oxidizing the semiconductor chip 21. In such a case, the thickness of the insulation film 22 formed by the thermally-oxidized film can be set to, for example, 0.5 μm to 1.0 μm. In FIG. 5, reference symbols 22a and 22b indicate surfaces of the insulation film 22.

Figure 6:
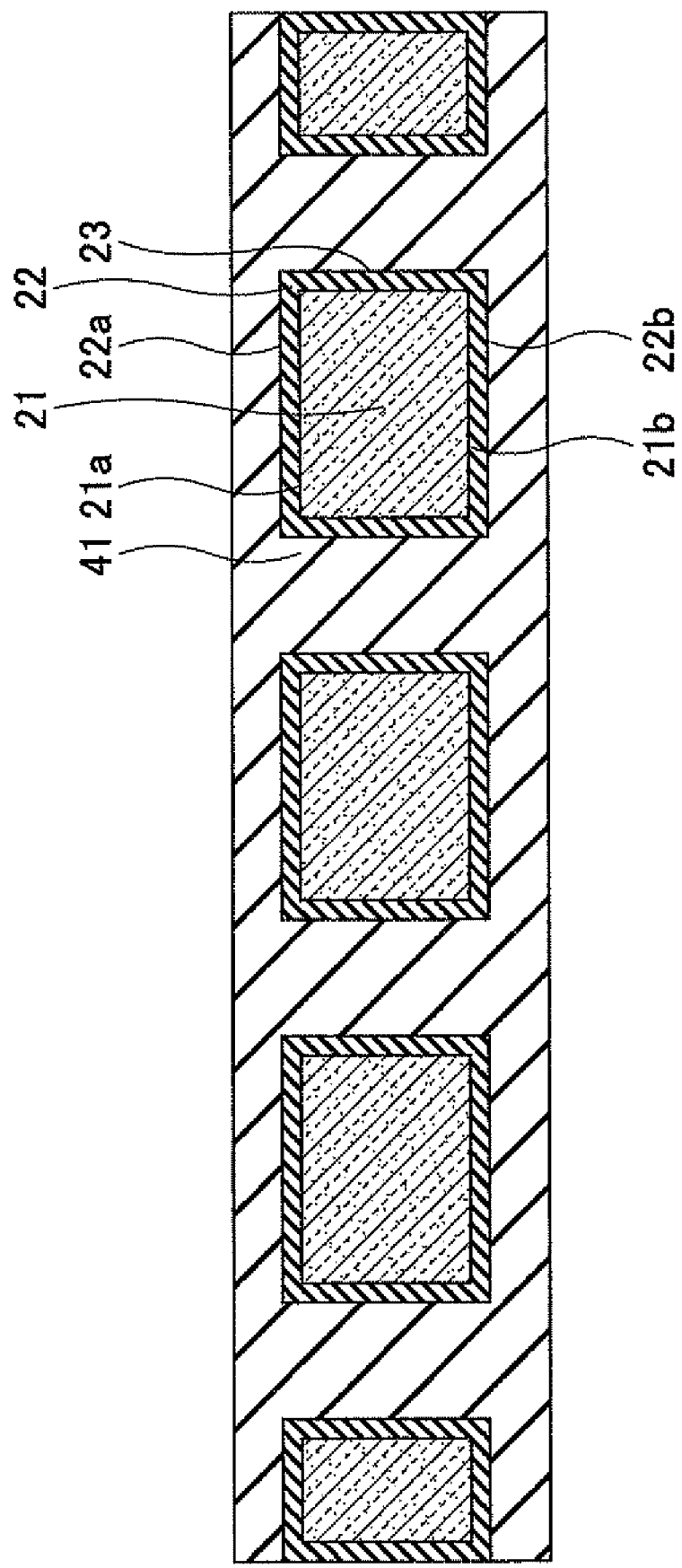
FIG. 6 is a cross-sectional view illustrating a third step of the manufacturing process of the semiconductor package illustrated in FIG. 2.

Subsequently, in a third step of the manufacturing process illustrated in FIG. 6, the resist film 41 is formed on both surfaces 22a and 22b of the insulation film 22 so that the surfaces 22a and 22b are covered by the resist film 41 and also the plurality of penetration holes 23 are filled with the resist material of the resist film 41. The resist film 41 can be formed by applying a liquid resist onto the surface 22a of the insulation film 22 and then applying the liquid resist onto the surface 22b of the insulation film 22. The thickness of the resist film 41 formed on the surfaces 22a and 22b of the insulation film 22 can be set to, for example, 20 μm.

Figure 7:
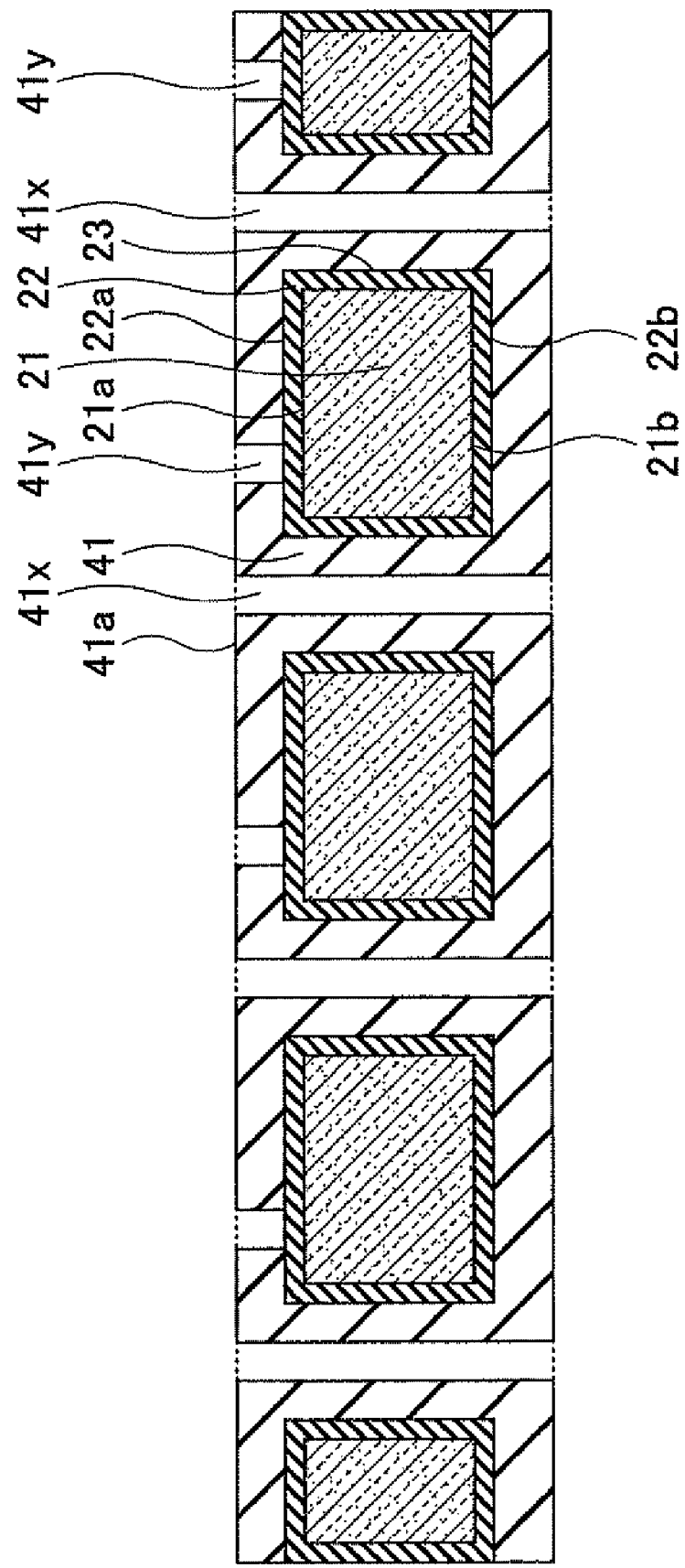
FIG. 7 is a cross-sectional view illustrating a fourth step of the manufacturing process of the semiconductor package illustrated in FIG. 2.

Subsequently, in a fourth step of the manufacturing process illustrated in FIG. 7, openings 41x and 41y are formed in the resist film 41 by exposing the resist film 41 and then developing the exposed resist film 41. The opening 41x is formed to penetrate the resist film 41 filled in the through hole 23. The opening 41x forms a space, which corresponds to the penetration part 24 constituting the penetration electrode 26. The opening 41x has a circular shape in a plan view, and the diameter of the opening 41x can be set to, for example, 30 μm. The opening part 41y is formed to expose a portion of the surface 22a of the insulation film 22 corresponding to a formation area of the support part 25. The opening 41y has, for example, a circular shape in a plan view, and the diameter of the opening 41y can be set to, for example, 30 μm. In FIG. 7, the reference symbol 41a indicates an upper surface of the resist film 41.

Figure 8:
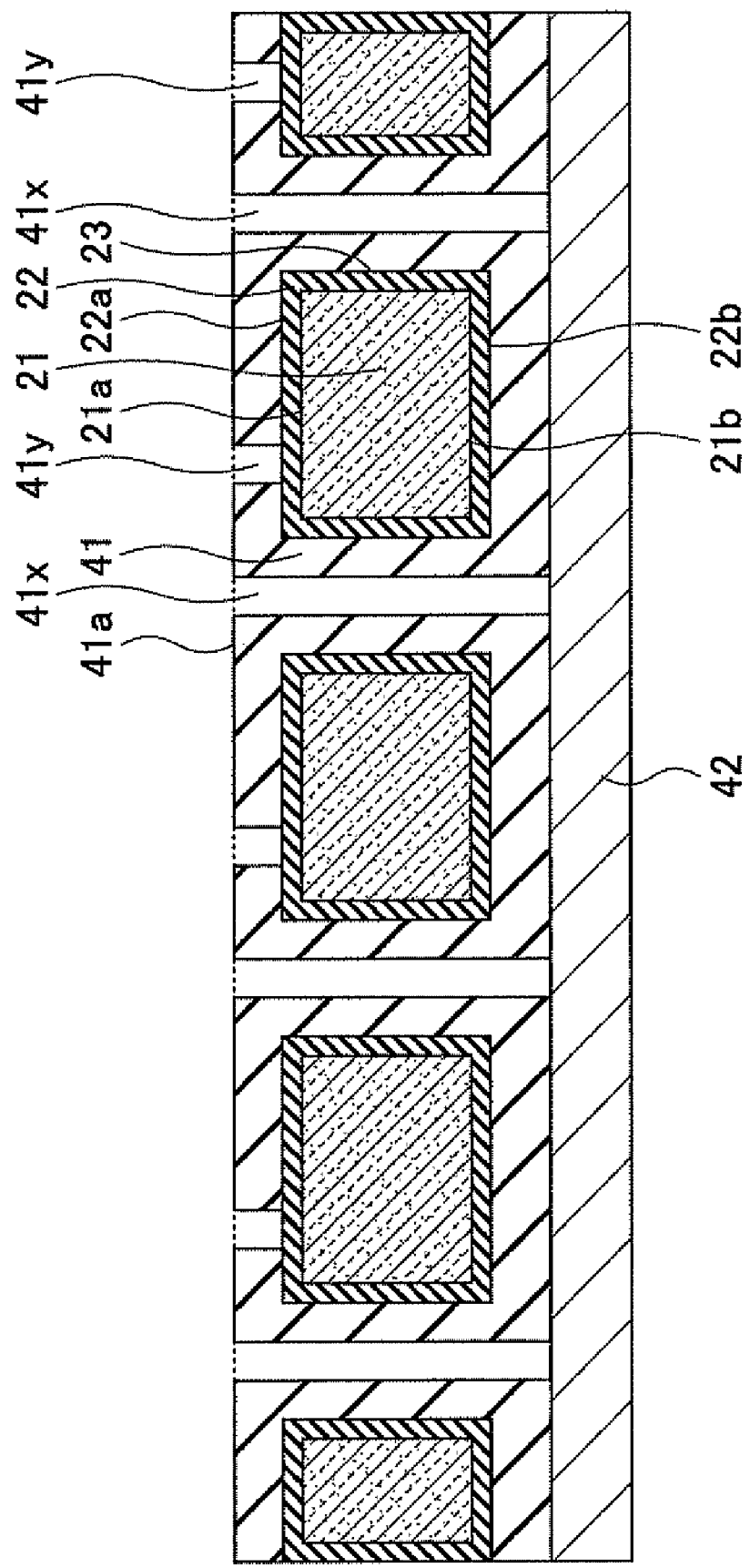
FIG. 8 is a cross-sectional view illustrating a fifth step of the manufacturing process of the semiconductor package illustrated in FIG. 2.

Subsequently, in a fifth step of the manufacturing process illustrated in FIG. 8, the metal plate 42 is applied onto the lower surface of the structure illustrated in FIG. 7. The metal plate 42 serves as a power supply layer when forming the penetration part 24 constituting the penetration electrode 26 according to an electrolytic plating method. The metal plate 42 can be formed of a copper (Cu) plate. In the step illustrated in FIG. 8, a metal foil may be applied, instead of the metal plate 42, onto the lower surface of the structure illustrated in FIG. 7.

Subsequently, in a sixth step of the manufacturing process illustrated in FIG. 9, the penetration part 24 is formed by depositing a plated film to fill the opening 41y according to an electrolytic plating method using the metal plate 42 as a power supply layer. For example, a copper (Cu) plated film can be used as the plated film constituting the penetration part 24.

Figure 9:
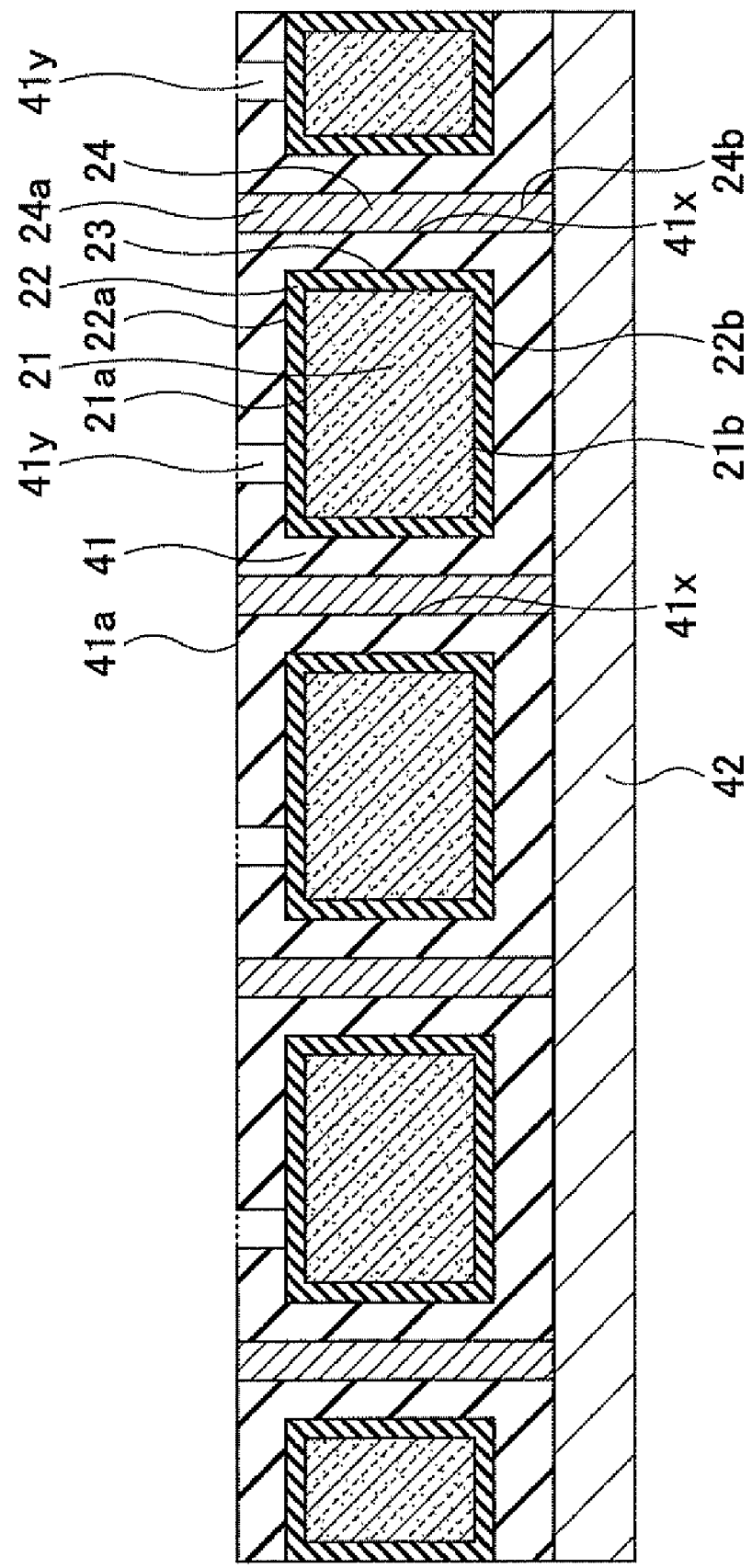
FIG. 9 is a cross-sectional view illustrating a sixth step of the manufacturing process of the semiconductor package illustrated in FIG. 2.
Figure 10:
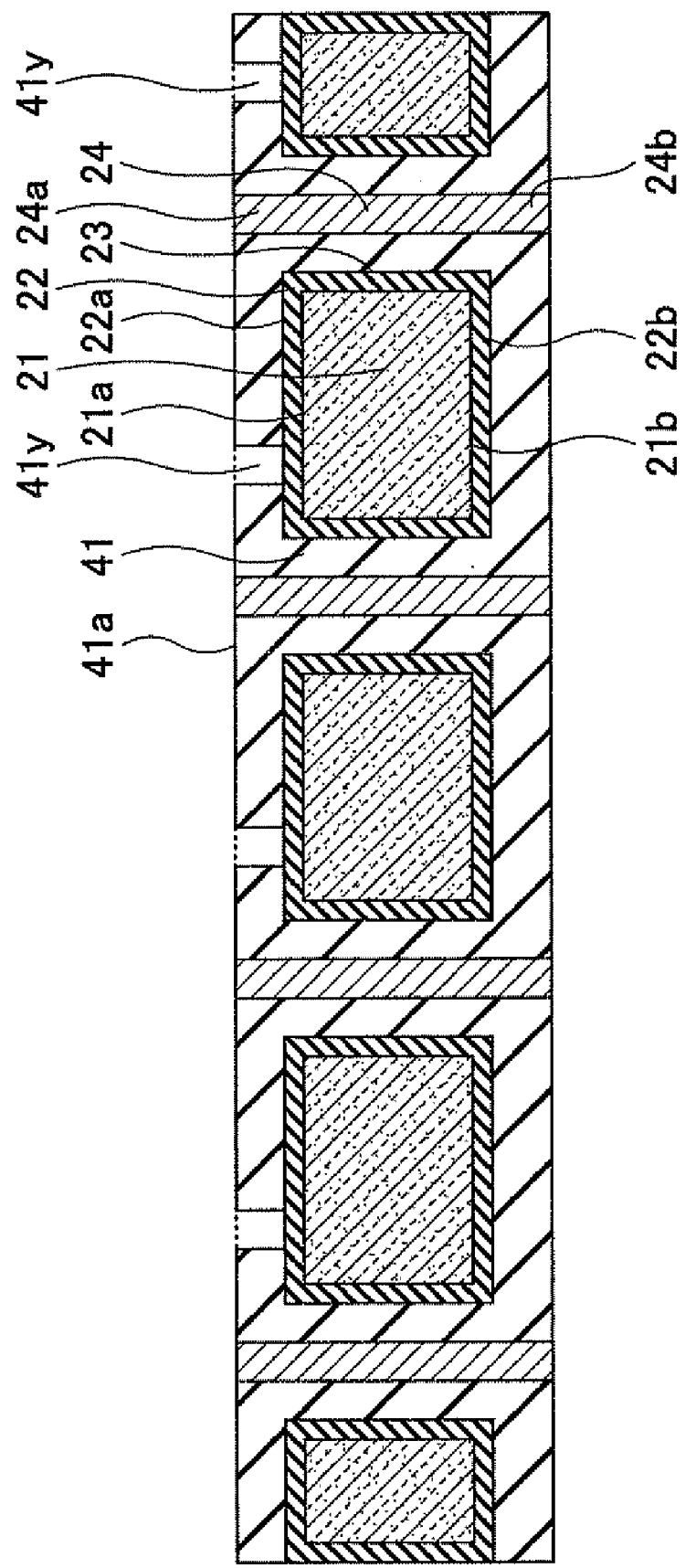
FIG. 10 is a cross-sectional view illustrating a seventh step of the manufacturing process of the semiconductor package illustrated in FIG. 2.
Figure 11:
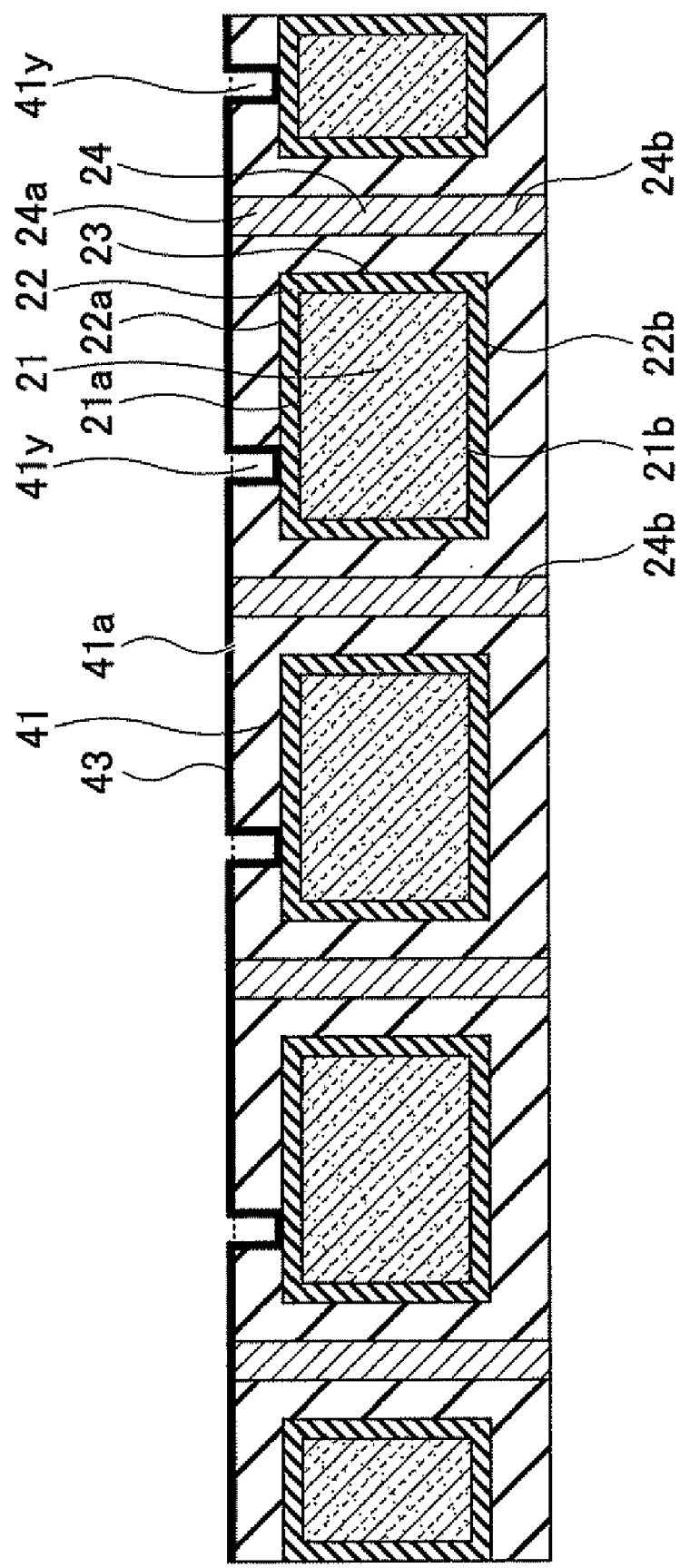
FIG. 11 is a cross-sectional view illustrating an eighth step of the manufacturing process of the semiconductor package illustrated in FIG. 2.

Subsequently, in a seventh step of the manufacturing process illustrated in FIG. 10, the metal plate 42 provided in the structure illustrated in FIG. 9 is removed. Specifically, the metal plate 42 is removed from the insulation film 22. Then, in an eighth step of the manufacturing process illustrated in FIG. 11, the seed layer 43 is formed to cover the upper surface 41a of the resist film 41 and the bottom and side surfaces of the opening 41y.

The seed layer 43 is used as a power supply layer when forming the support part 25 constituting the penetration electrode 26 according to an electrolytic plating method. The seed layer 43 can be formed by methods such as, for example, a sputtering method or an electroless plating method. A copper (Cu) layer may be used as the seed layer 43. If a copper (Cu) layer is used as the seed layer 43, the thickness of the seed layer 43 can be set to, for example, 0.3 μm.

Figure 12:
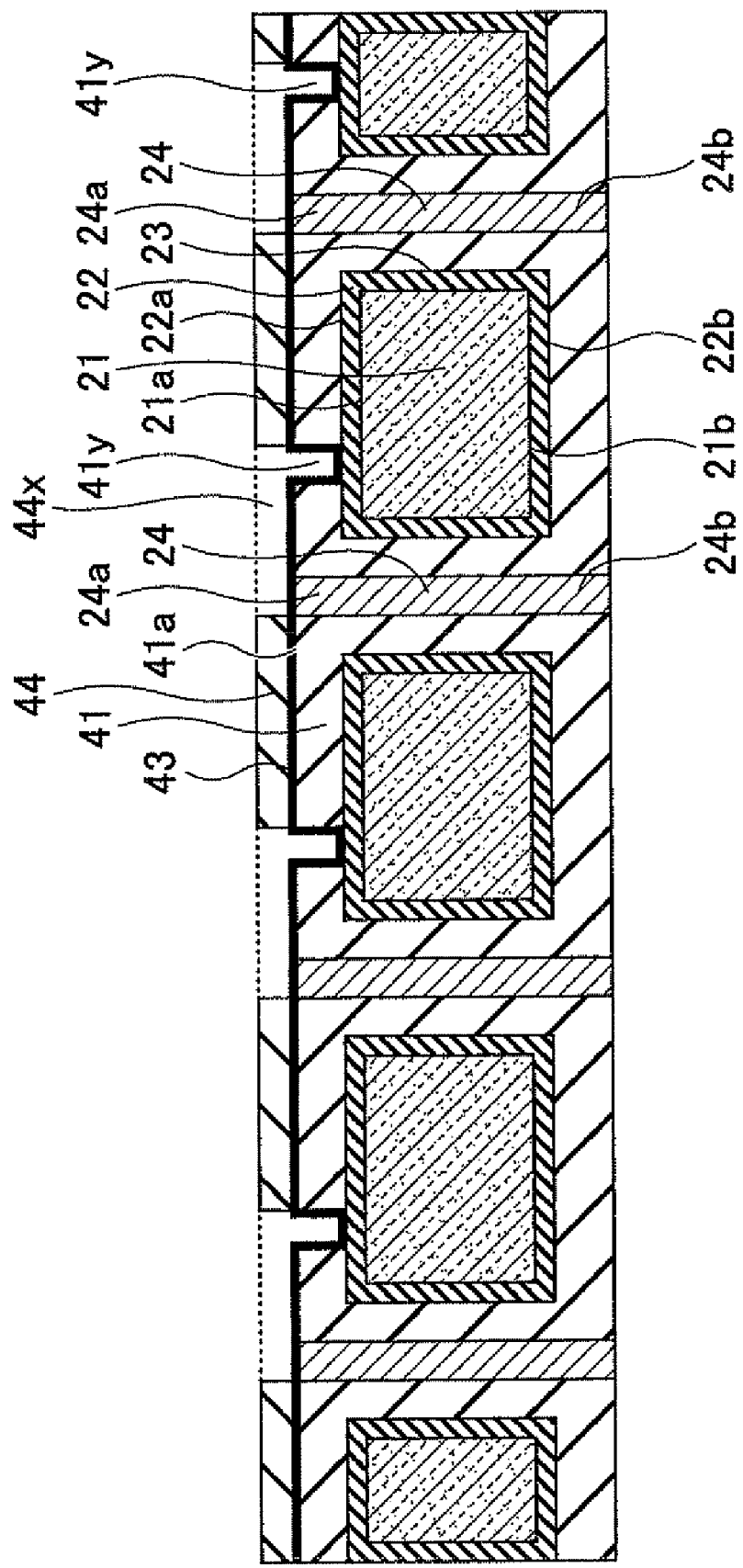
FIG. 12 is a cross-sectional view illustrating a ninth step of the manufacturing process of the semiconductor package illustrated in FIG. 2.
Figure 13:
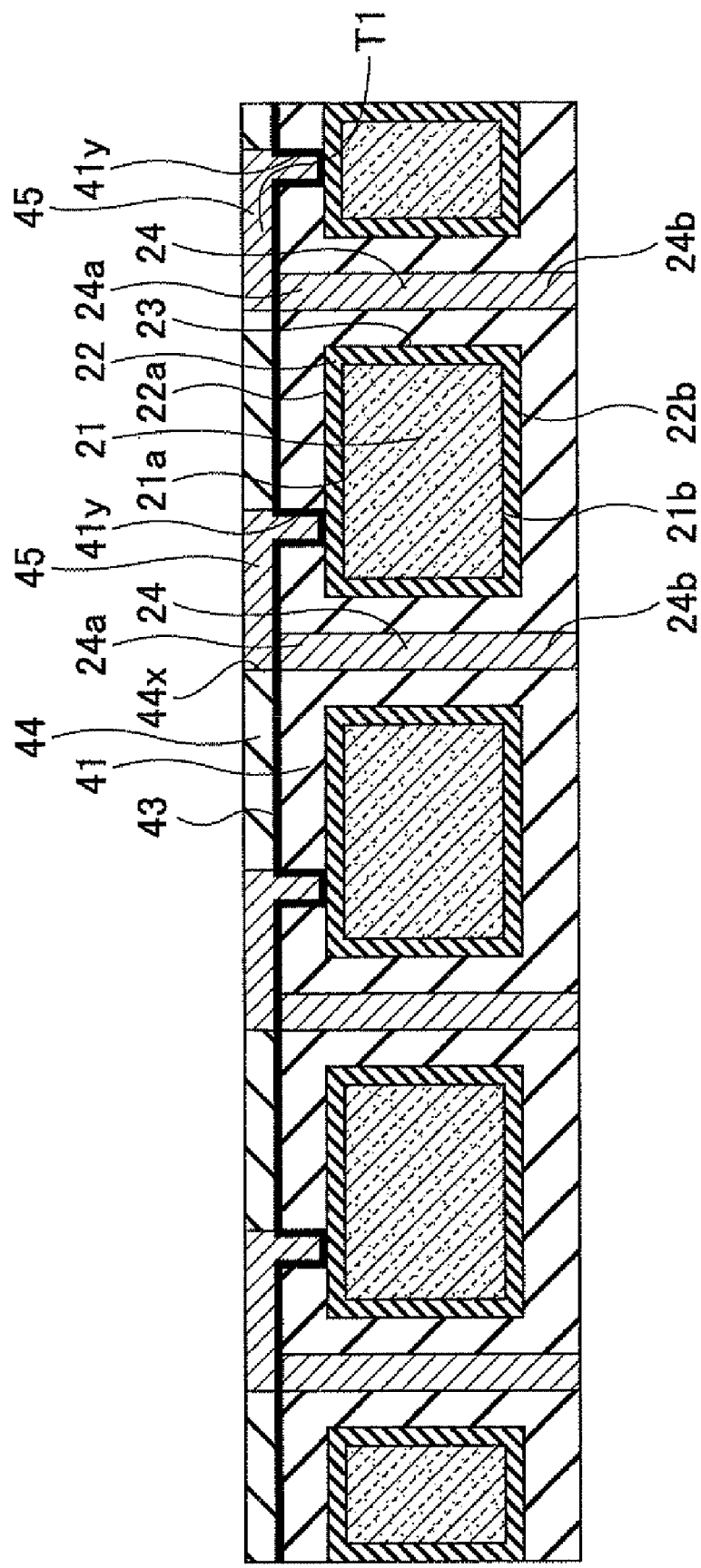
FIG. 13 is a cross-sectional view illustrating a tenth step of the manufacturing process of the semiconductor package illustrated in FIG. 2.

Subsequently, in a ninth step of the manufacturing process illustrated in FIG. 12, the resist film 44 having openings 44x is formed on the seed layer 43. Each opening 44x is formed so that a portion of the seed layer 43 corresponding to the formation area of the support part 25 is exposed. Then, in a tenth step of the manufacturing process illustrated in FIG. 13, the plated film 45, which fills the openings 41y and 44x, is deposited and grown according an electrolytic plating method using the seed layer 43 as a power supply layer. The plated film 45 is one of structural elements of the support part 25. For example, a copper (Cu) layer may be used as the plated film 45. If a copper (Cu) layer is used as the plated film 45, the thickness Ti of the plated film 45 can be set to, for example, 130 μm.

Figure 14:
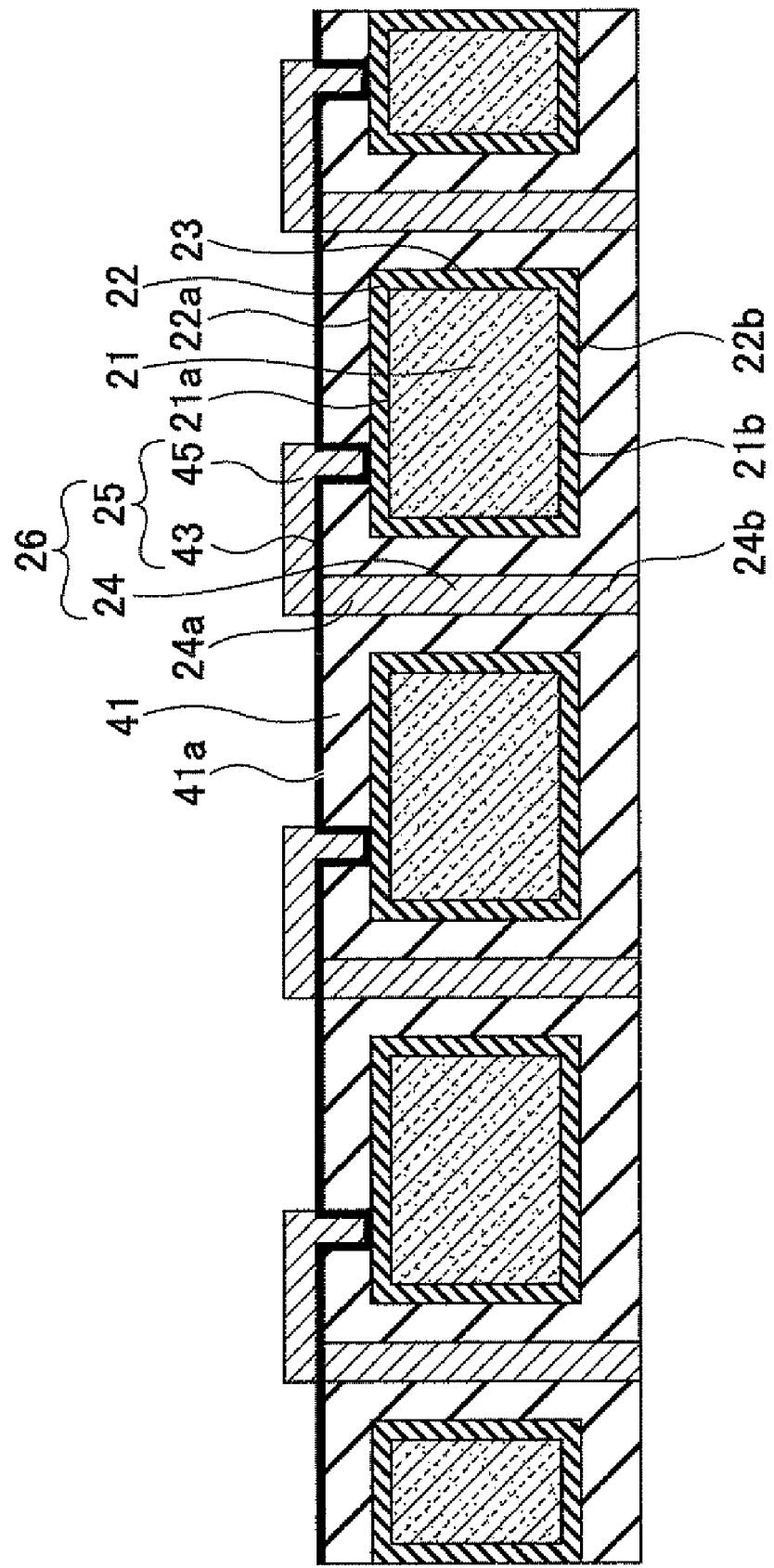
FIG. 14 is a cross-sectional view illustrating an eleventh step of the manufacturing process of the semiconductor package illustrated in FIG. 2.
Figure 15:
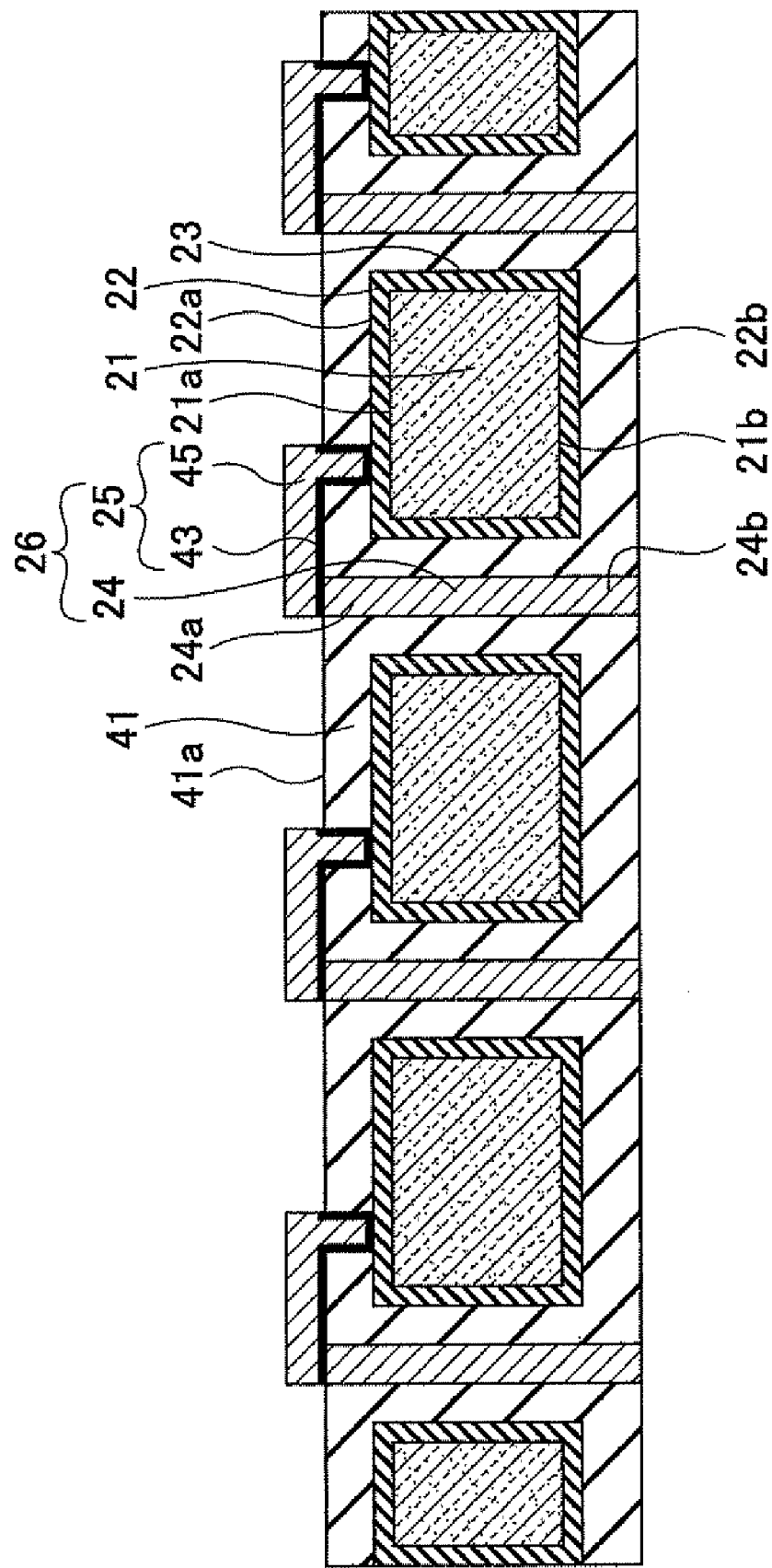
FIG. 15 is a cross-sectional view illustrating a twelfth step of the manufacturing process of the semiconductor package illustrated in FIG. 2.

Subsequently, in an eleventh step of the manufacturing process illustrated in FIG. 14, the resist film 44 formed on the seed layer 43 is removed. Then, in a twelfth step of the manufacturing process illustrated in FIG. 15, portions of the seed layer 43, which portions are unnecessary and not covered by the plated film 45, are removed. The unnecessary portions of the seed layer 43 can be removed by, for example, etching. Thereby, the penetration electrodes 26, each of which includes the penetration part 24 and the support part 25 having the seed layer 43 and the plated film 45, are formed.

Figure 16:
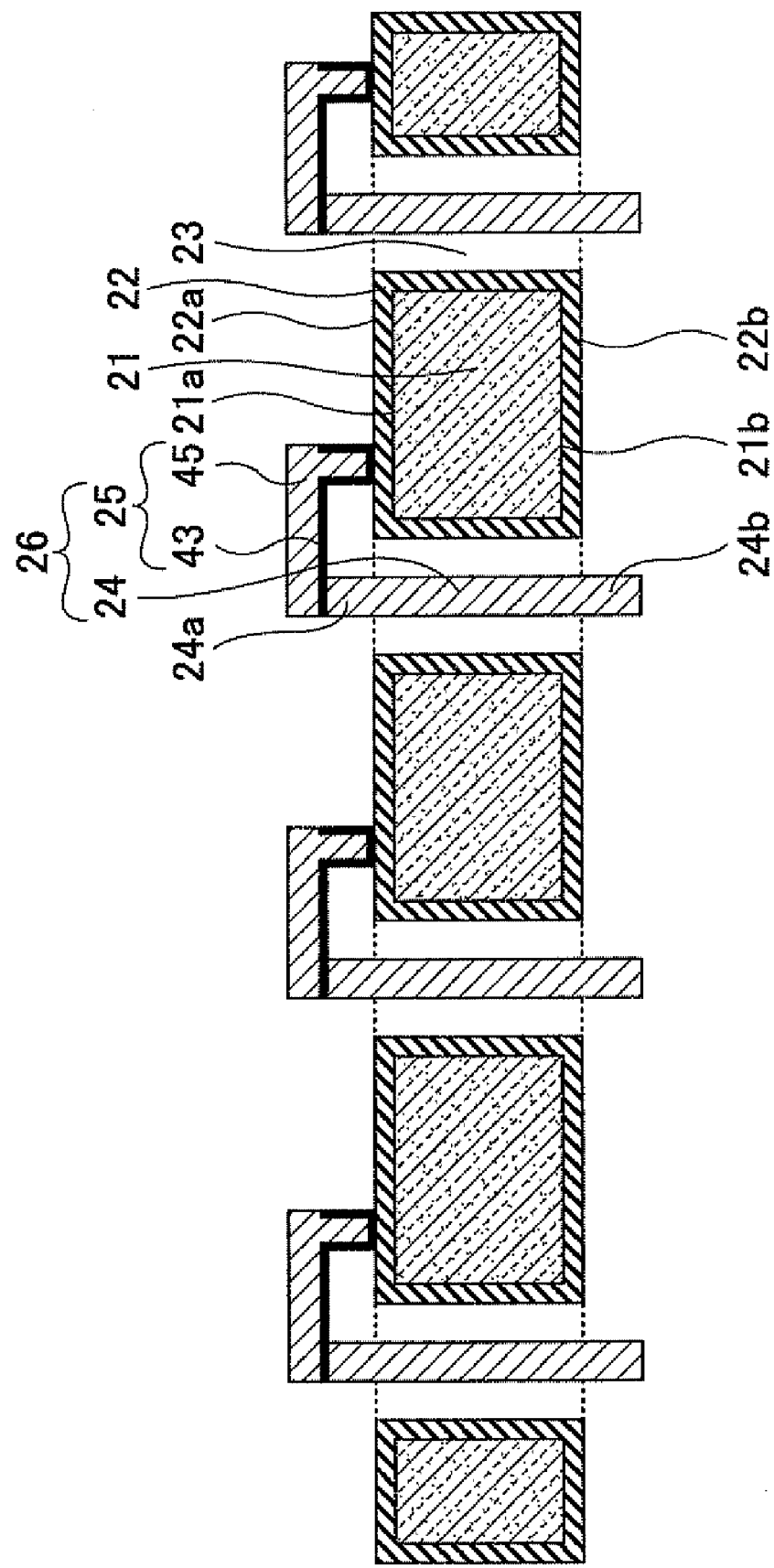
FIG. 16 is a cross-sectional view illustrating a thirteenth step of the manufacturing process of the semiconductor package illustrated in FIG. 2.

Subsequently, in a thirteenth step of the manufacturing process illustrated in FIG. 16, the resist film 41 is removed. Then, in a fourteenth step of the manufacturing process illustrated in FIG. 17, the connection terminal 27 is formed on the end 24b of each penetration part 24. It is desirable to form a gap between the connection terminal 27 and the surface 22b of the insulation film 22 so that the connection terminal 27 does not contact the surface 22b of the insulation film 22. Thereby, the connection terminal 27 is supported by the support part 25 through the penetration part 24 in a movable state in the Y-Y direction and the X-X direction.

Figure 18:
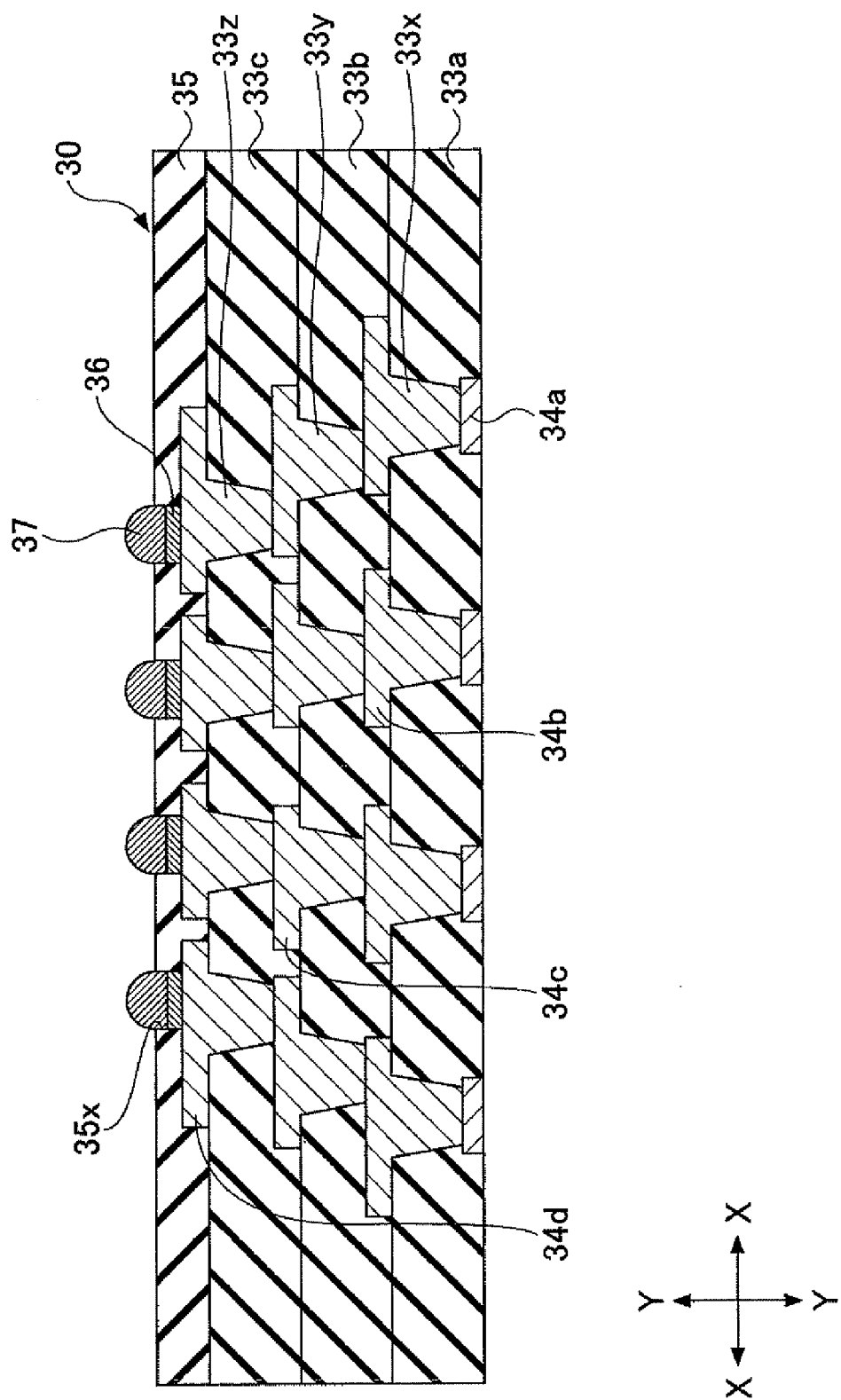
FIG. 18 is a cross-sectional view illustrating a fifteenth step of the manufacturing process of the semiconductor package illustrated in FIG. 2.
Figure 19:
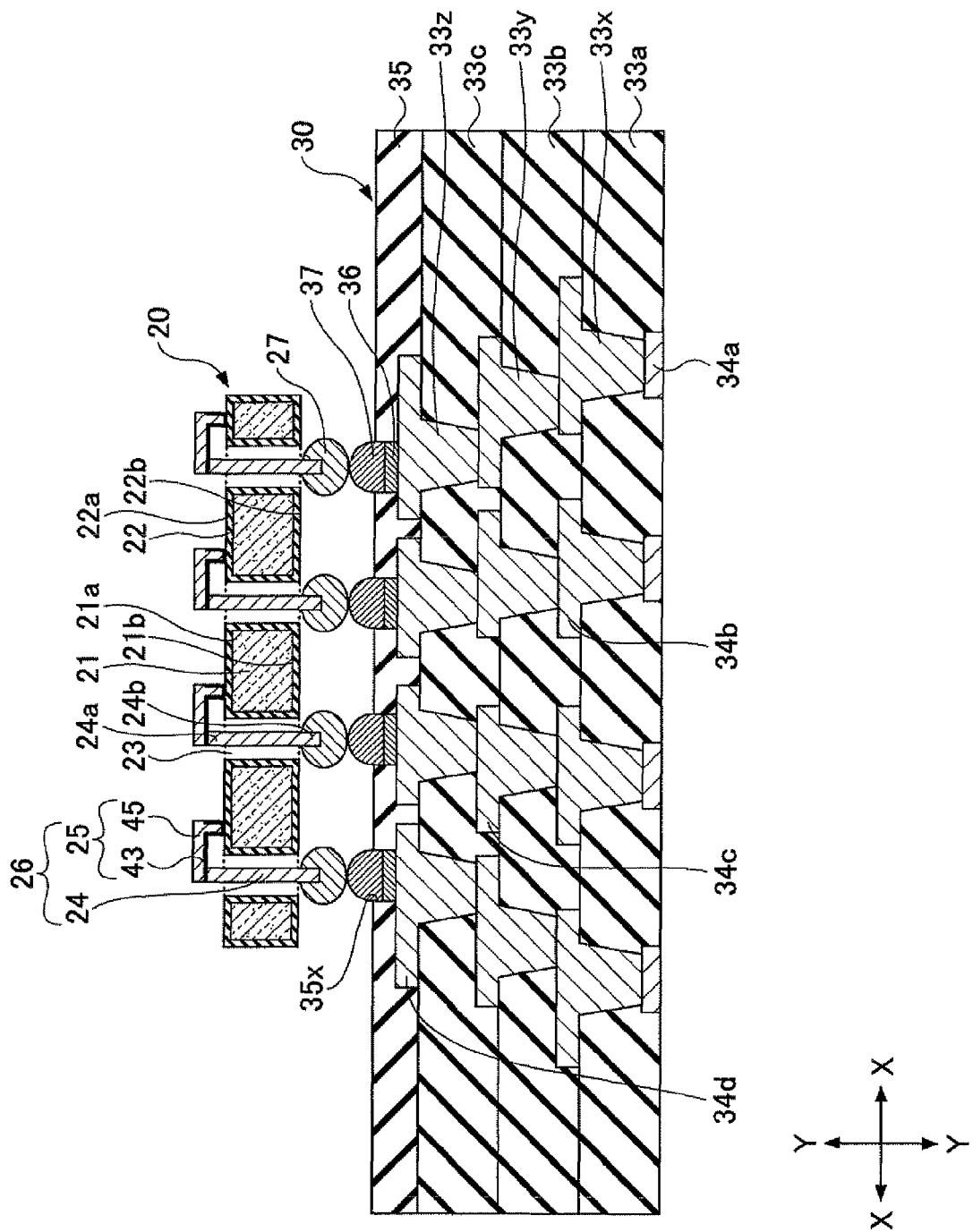
FIG. 19 is a cross-sectional view illustrating a sixteenth step of the manufacturing process of the semiconductor package illustrated in FIG. 2.

Subsequently, in a fifteenth step of the manufacturing process illustrated in FIG. 18, the wiring board 30 is prepared. The pre-solder 37 is formed on the metal layer 36 of the wiring board 30. The pre-solder 37 is provided by applying a solder paste onto the metal layer 36 and reflowing the solder paste on the metal layer 36. Because the wiring board 30 can be manufactured by a known method, a description of manufacturing the wiring board 30 is omitted.

Finally, in a sixteenth step of the manufacturing process, the connection terminal 27 of the semiconductor device 20 and the pre-solder 37 of the wiring board 30 are electrically connected to each other. The connection between the connection terminal 27 and the pre-solder 37 is carried out by heating the pre-solder 37 at a temperature of, for example, 230° C. to melt the solder of the pre-solder 37. If the connection terminal 27 of the semiconductor device 20 is made of a solder, both the connection terminal 27 and the pre-solder 37 are melted and mixed to form an alloy, which forms a single bump. Then, the manufacturing process is ended, and the semiconductor package 10 as illustrated in FIG. 2 is completed.

According to the semiconductor package 10 of the present embodiment, the connection terminal 27 connecting the semiconductor device 20 to the wiring board 30 is movably supported by the support part 25 through the penetration part 24 in the Y-Y direction and the X-X direction. As a result, even if heat is applied to the semiconductor package 10, a stress generated in the joining part (the connection terminal 27 and the pre-solder 37) due to a difference in thermal expansion coefficients between the semiconductor device 20 and the wiring board 30 is reduced greatly. Thus, the joining part (the connection terminal 27 and the pre-solder 37) is prevented from cracking.

Second Embodiment

Figure 20:
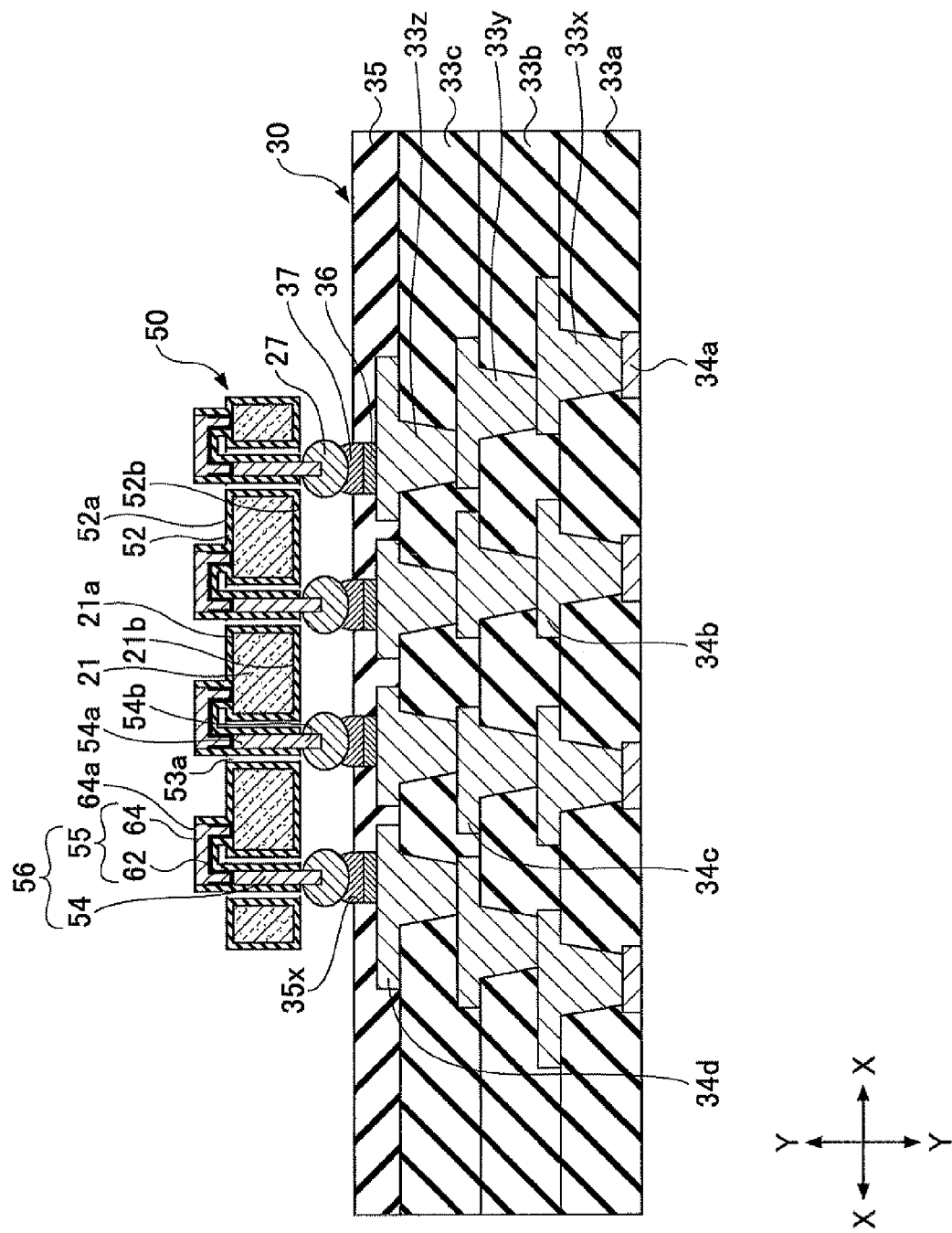
FIG. 20 is a cross-sectional view of a semiconductor package according to a second embodiment of the present invention.

A description will be given first of a structure of a semiconductor package according to a second embodiment of the present invention. The description is focused on structures of the semiconductor package according to the second embodiment different from the semiconductor package 10 according to the above-mentioned first embodiment. FIG. 20 is a cross-sectional view of the semiconductor package according to the second embodiment of the present invention. In FIG. 20, parts that are the same as the parts illustrated in FIG. 2 are given the same reference numerals, and descriptions thereof will be omitted. In FIG. 20, the X-X direction indicates a direction parallel to the top surface 21a of the semiconductor chip 21, and the Y-Y direction indicates a direction perpendicular to the X-X direction.

With reference to FIG. 20, the semiconductor package 11 according to the second embodiment has the same structure as the semiconductor package 10 illustrated in FIG. 2 except that the semiconductor device 20 is replaced by a semiconductor package 50. A description is given below of the semiconductor package 50. The semiconductor device 50 includes the semiconductor chip 21, an insulation film 52, penetration holes 53a, penetration electrodes 56 and the connection terminals 27.

The insulation film 52 is provided to cover the surfaces of the semiconductor chip 21, which surfaces include inner surfaces of the penetration holes 53a. The insulation film 52 also covers a penetration part 54 of each penetration electrode 56 except for an end 54b thereof, and covers a support part 55 of each penetration electrode 56 except for an upper surface 64a thereof. The insulation film 52 is a film for insulating the semiconductor chip 21 and the penetration electrode 56 from each other. For example, the insulation film 52 can be formed of $SiO_2$. The thickness of the insulation film 52 can be set to, for example, 0.5 μm to 1.0 μm.

The penetration holes 53a penetrate through the semiconductor chip 21. The penetration holes 53a are provided in portions of the semiconductor chip 21 where no semiconductor integrated circuit (not illustrated in the figure) is formed. Each of the penetration holes 53a has a circular shape in a plan view, and a diameter of each of the penetration holes 53a can be set to, for example, 50 μm. The pitch of the penetration holes 53a can be set to, for example, 100 μm.

Each of the penetration electrodes 56 includes a penetration part 54 and a support part 55. The penetration part 54 is formed of an electrically conductive material, and arranged in the penetration hole 53a so that the penetration part 54 does not contact with the semiconductor chip 21 and the insulation film 52. One end 54a of the penetration part 54 is substantially at the same level with the upper surface 21a of the semiconductor chip 21.

The end 54a of the penetration part 54 is integrally formed with the support part 55. The other end 54b of the penetration part 54 protrudes from a surface 52b of the insulation film 52 provided on the lower surface 21b of the semiconductor chip 21. The penetration part 54 has a circular shape in a plan view, and a diameter of the penetration part 54 can be set to, for example, 30 μm.

The support part 55 constituting the penetration electrode 56 includes a seed layer 62 and a plated film 64. The seed layer 62 is formed of an electrically conductive material. One end of the support part 55 is integrally formed with the end 54a of the penetration part 54, and the other end of the support part 55 is fixed to the upper surface 21a of the semiconductor chip 21 so that the support part 55 is electrically connected to a wiring layer (not illustrated in the figure) formed on the semiconductor chip 21. The wiring layer extends from a semiconductor integrated circuit (not illustrated in the figure).

The support part 55 has a spring characteristic in order to movably support the entire penetration part 54 in the Y-Y direction and movably support the end 54b of the penetration part 54 in the X-X direction. A portion of the support part 55 contacting the upper surface 21a of the semiconductor chip 21 has a circular shape in a plan view, and a diameter of the portion of the support part 55 can be set to, for example, 30 μm.

The penetration electrode 56 formed by the penetration part 54 and the support part 55 may be formed of an electrically conductive material. If the penetration part 54 is formed of copper (Cu) and the support part 55 is formed by a brass (Cu-Zn alloy), a spring characteristic can be given to the support part 55 and the penetration electrode 56 can be easily formed by using a plating method.

The connection terminal 27 is formed on the end 54b of the penetration part 54. The connection terminal 27 is not fixed to the surface 52b of the insulation film 52. Although the connection terminal 27 can be brought into contact with the surface 52b of the insulation film 52, it is desirable to form a small gap (for example, about 50 μm) so that the connection terminal 27 and the insulation film 52 do not contact each other. The connection terminal 27 is supported by the support part 55 through the penetration part 54. The penetration part 54 and the connection terminal 27 are electrically connected with each other.

A description will be given below of a manufacturing method of the semiconductor package 11 according to the second embodiment of the present embodiment. FIG. 21 through FIG. 35 are cross-sectional views for explaining a manufacturing process of the semiconductor package 12 according to the second embodiment of the present invention. In FIG. 21 through FIG. 35, parts that are the same as the parts illustrated in FIG. 20 are given the same reference numerals, and descriptions thereof will be omitted.

Figure 21:
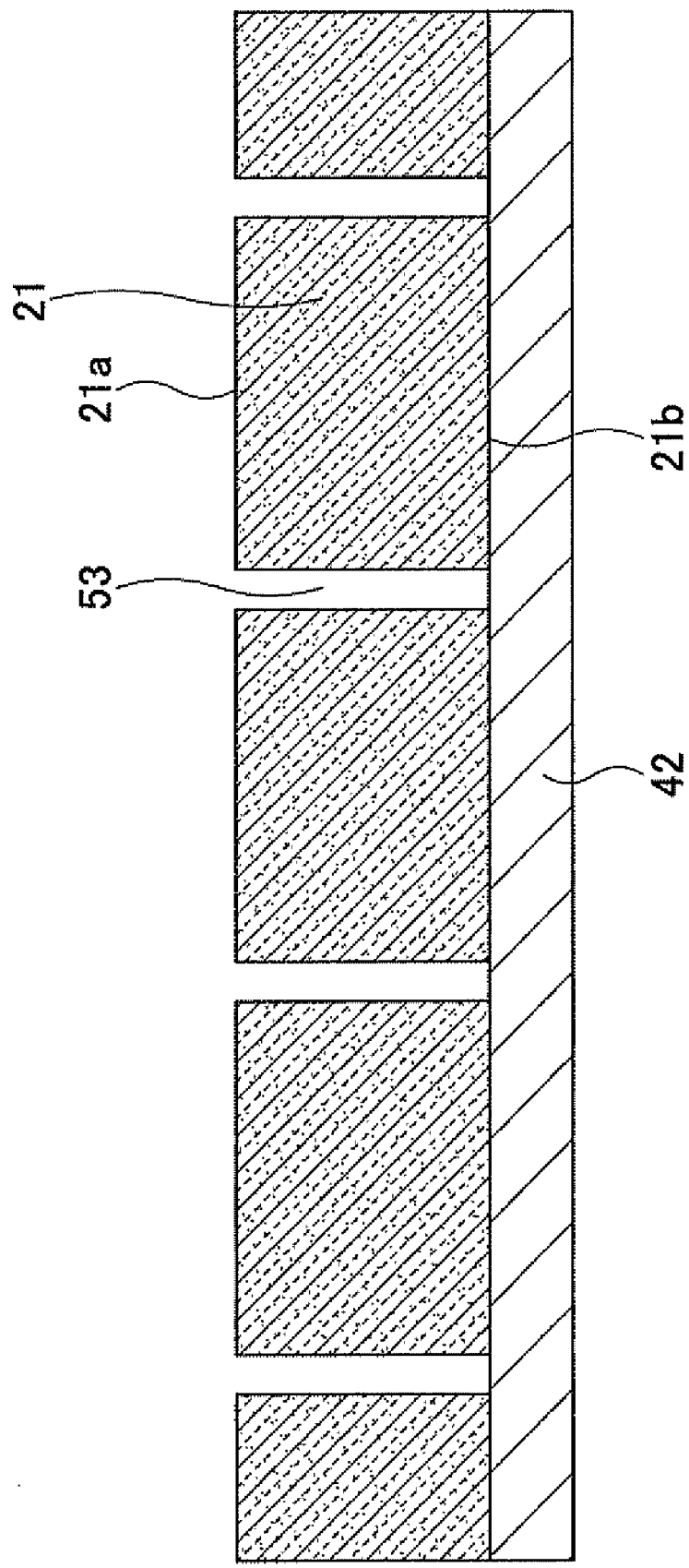
FIG. 21 is a cross-sectional view illustrating a first step of a manufacturing process of the semiconductor package illustrated in FIG. 20.

First, in a first step of the manufacturing process illustrated in FIG. 21, a plurality of penetration holes 53 are formed in the semiconductor chip 21, which constitutes the semiconductor device 50. The penetration holes 53 penetrate the semiconductor chip 21 to extend from the upper surface 21a to the lower surface 21b. The penetration holes 53 can be formed by an anisotropic etching method such as, for example, a dry-etching method. Each of the penetration holes 53 has a circular shape in a plan view, and the diameter of each of the penetration holes 53 can be set to, for example, 30 μm. Then, the metal plate 42 is applied onto the lower surface 21b of the semiconductor chip 21. The metal plate 42 serves as a power supply layer when forming the penetration part 54 constituting the penetration electrode 56 according to an electrolytic plating method. The metal plate 42 can be formed of a copper (Cu) plate. In the step illustrated in FIG. 21, a metal foil such as, for example, a copper (Cu) foil may be applied, instead of the metal plate 42, onto the lower surface 21b of the semiconductor chip 21.

Figure 22:
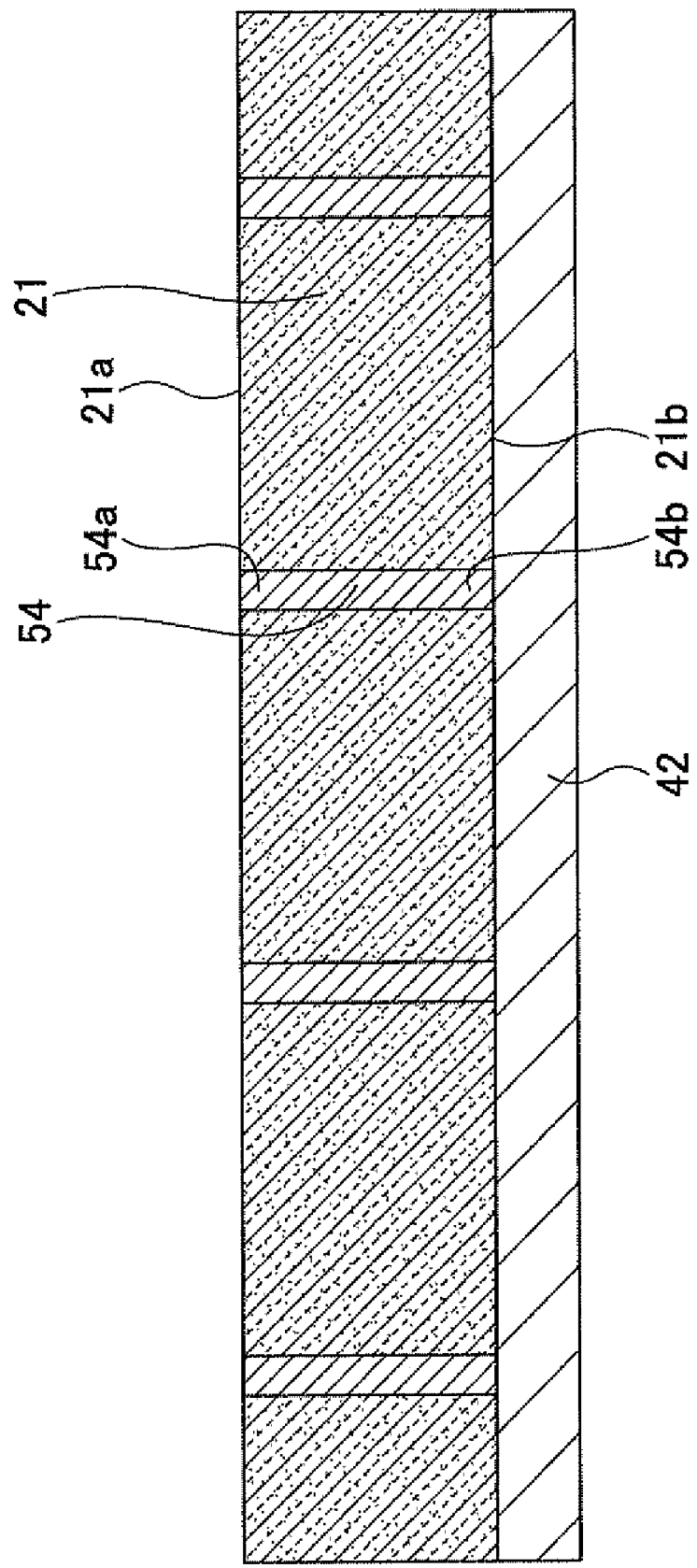
FIG. 22 is a cross-sectional view illustrating a second step of the manufacturing process of the semiconductor package illustrated in FIG. 20.

Subsequently, in a second step of the manufacturing process illustrated in FIG. 22, the penetration part 54 is formed by depositing a plated film to fill the penetration hole 53 according to an electrolytic plating method using the metal plate 42 as a power supply layer. For example, a copper (Cu) plated film can be used as the plated film constituting the penetration part 54. Then, similar to the step illustrated in FIG. 10, the metal plate 42 provided in the structure illustrated in FIG. 22 is removed.

Figure 23:
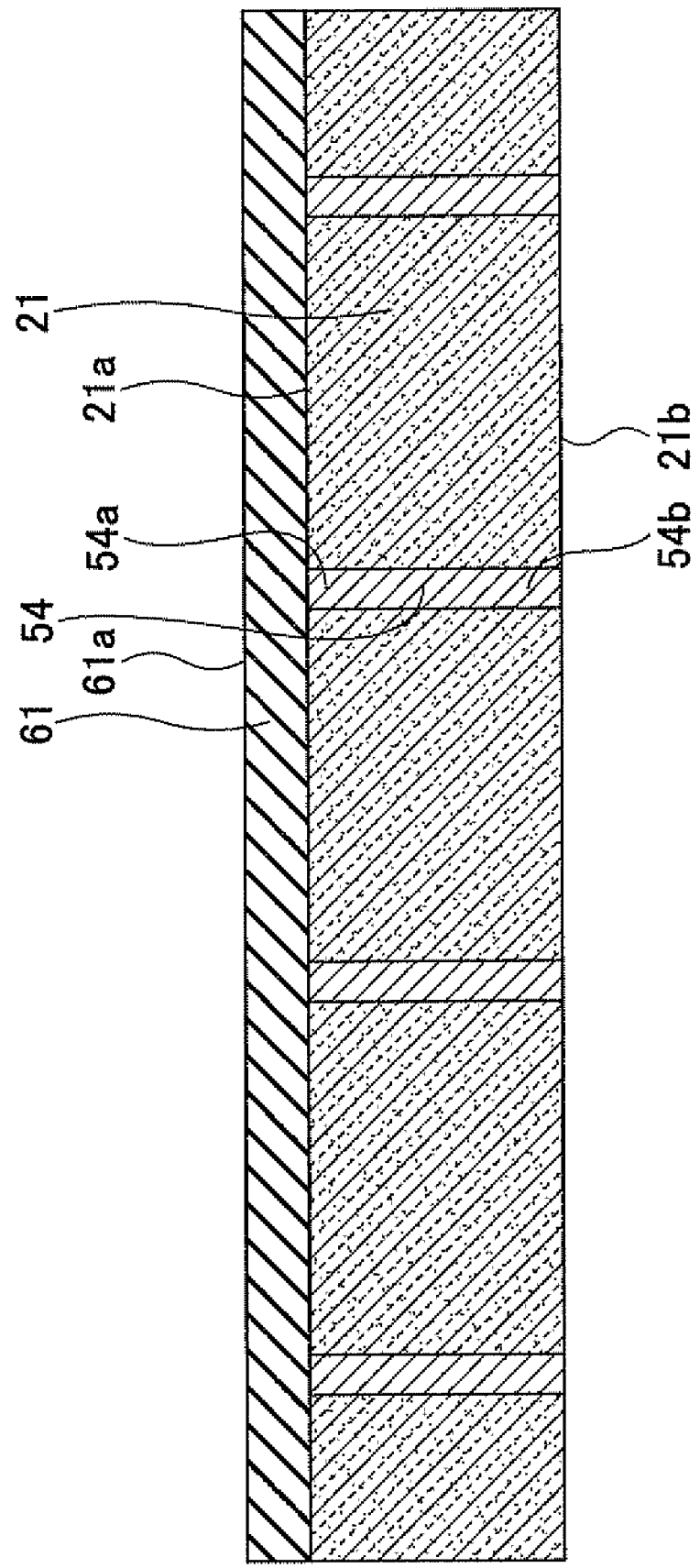
FIG. 23 is a cross-sectional view illustrating a third step of the manufacturing process of the semiconductor package illustrated in FIG. 20.

Subsequently, in a third step of the manufacturing process illustrated in FIG. 23, a resist film 61 is formed on the upper surface 21a of the semiconductor chip 21. The resist film 61 can be formed by applying a liquid resist onto the upper surface 21a of the semiconductor chip 21. The thickness of the resist film 61 can be set to, for example, 20 μm.

Figure 24:
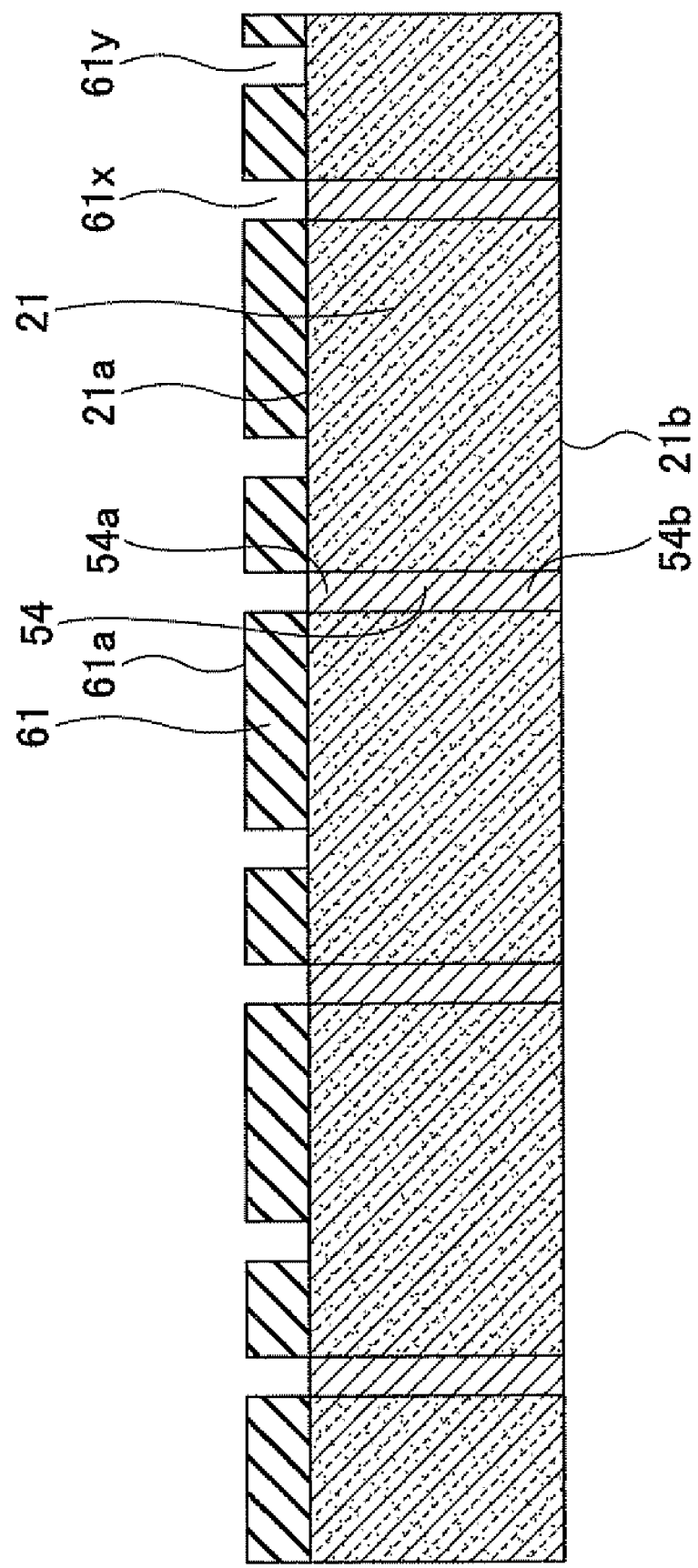
FIG. 24 is a cross-sectional view illustrating a fourth step of the manufacturing process of the semiconductor package illustrated in FIG. 20.

Subsequently, in a fourth step of the manufacturing process illustrated in FIG. 24, openings 61x and 61y are formed in the resist film 61 by exposing the resist film 61 and then developing the exposed resist film 61. Each opening 61x is provided for exposing a portion of the upper surface of the penetration part 54. The opening 61x has a circular shape in a plan view, and the diameter of the opening 61x is set to, for example, 30 μm. Each opening 61y is provided for exposing a portion of the upper surface 21a of the semiconductor chip 21, which portion corresponds to the formation area of the support part 55. The opening 61y has a circular shape in a plan view, and the diameter of the opening 61y is set to, for example, 30 μm.

Figure 25:
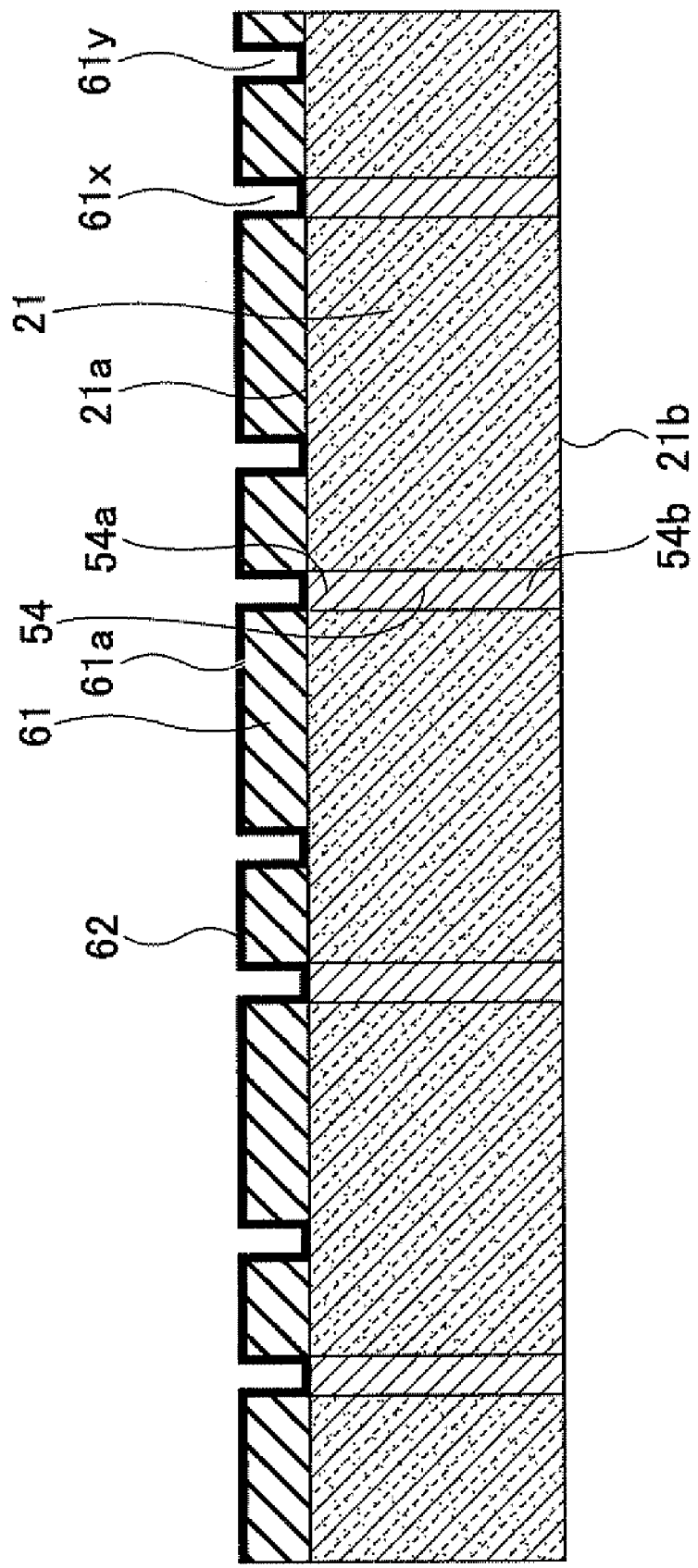
FIG. 25 is a cross-sectional view illustrating a fifth step of the manufacturing process of the semiconductor package illustrated in FIG. 20.

Subsequently, in a fifth step of the manufacturing process illustrated in FIG. 25, a seed layer 62 is formed to cover an upper surface 61a of the resist film 61 and bottom and side surfaces of the openings 61x and 61y. The seed layer 62 is used as a power supply layer when forming the support part 55 constituting the penetration electrode 56 according to an electrolytic plating method. The seed layer 62 can be formed by methods such as, for example, a sputtering method or an electroless plating method. A copper (Cu) layer may be used as the seed layer 62. If a copper (Cu) layer is used as the seed layer 62, the thickness of the seed layer 62 can be set to, for example, 0.3 μm.

Figure 26:
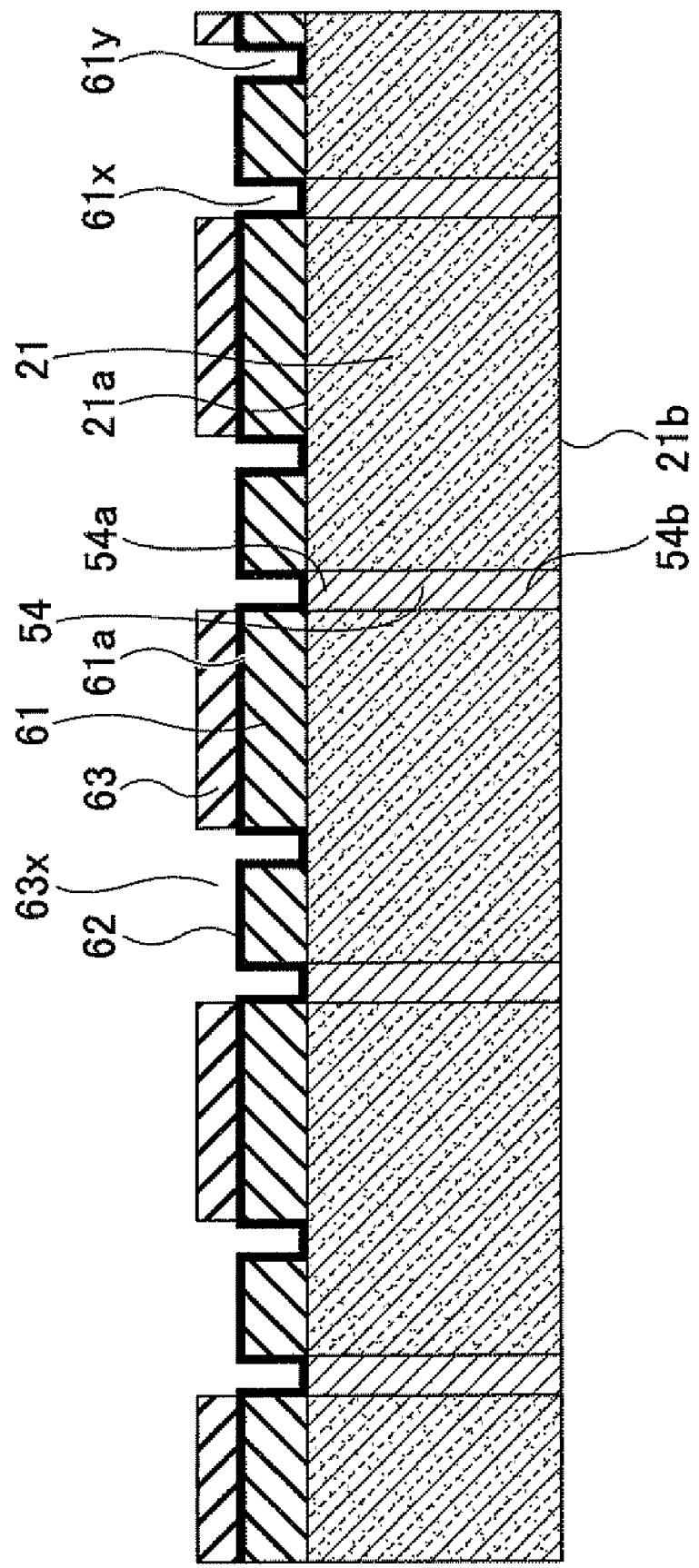
FIG. 26 is a cross-sectional view illustrating a sixth step of the manufacturing process of the semiconductor package illustrated in FIG. 20.

Subsequently, in a sixth step of the manufacturing process illustrated in FIG. 26, a resist film 63 is formed to cover the seed layer 62. The thickness of the resist film 63 can be set to, for example, 20 μm. Then, an opening 63x is formed in a portion corresponding to each formation area of the support part 55 in the resist film 63 by exposing and developing the resist film 63.

Figure 27:
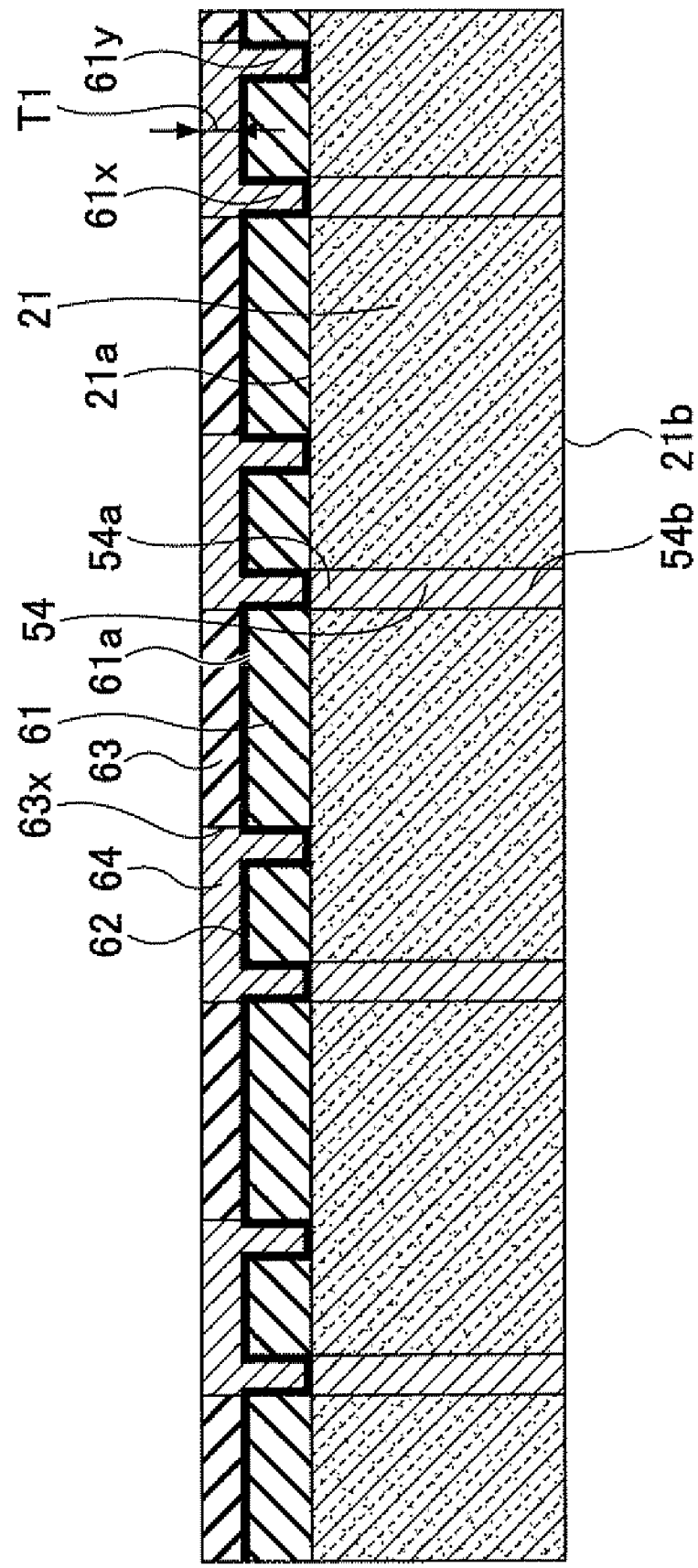
FIG. 27 is a cross-sectional view illustrating a seventh step of the manufacturing process of the semiconductor package illustrated in FIG. 20.

Subsequently, in a seventh step of the manufacturing process illustrated in FIG. 27, a plated film 64 is deposited and grown according to an electrolytic plating method using the seed layer 62 as a power supply layer in order to fill the plated film 64 in the openings Six, 61y and 63x. The plated film 64 is one of the structural elements of the support part 55. For example, a copper (Cu) plated film can be used as the plated film 64. If a copper (Cu) plated layer is used as the plated film 64, the thickness T1 of the plated film 64 can be set to, for example, 10 μm.

Figure 28:
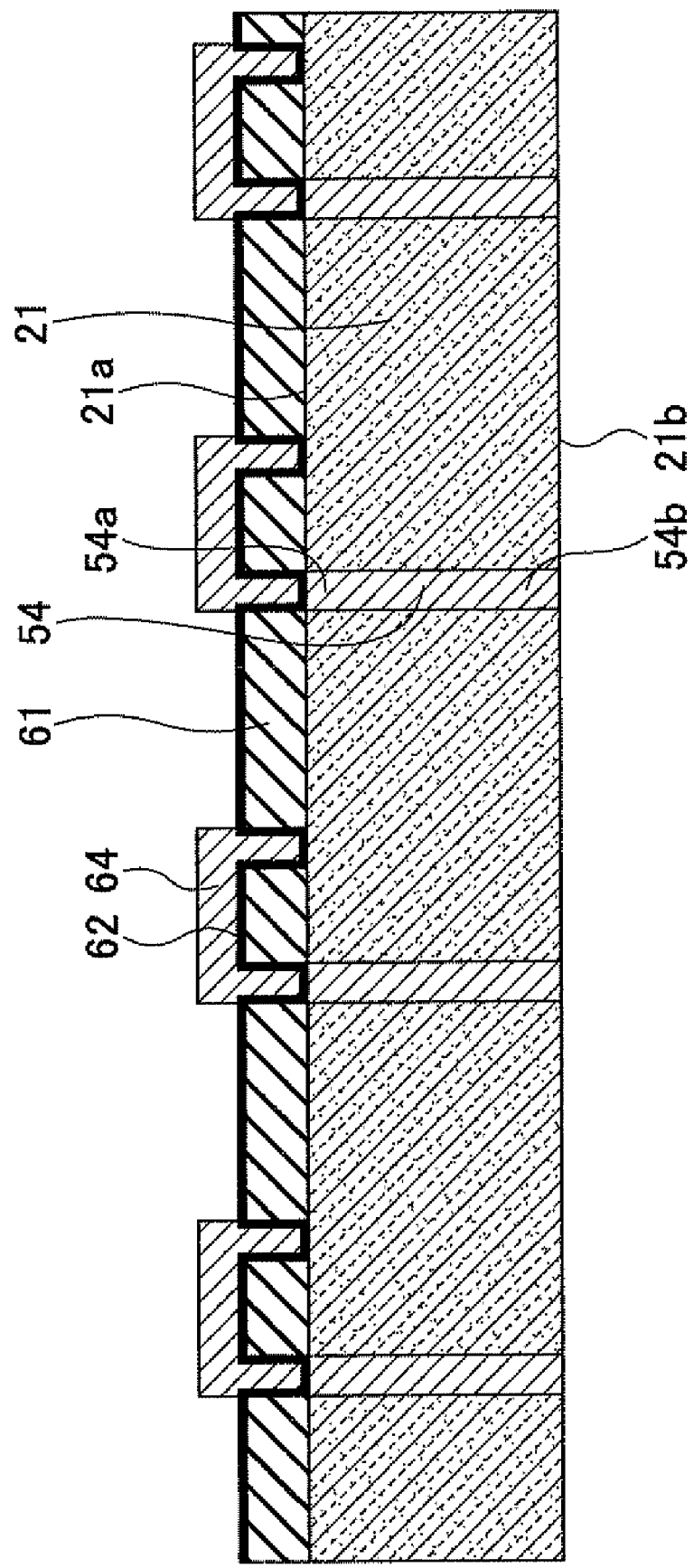
FIG. 28 is a cross-sectional view illustrating an eighth step of the manufacturing process of the semiconductor package illustrated in FIG. 20.
Figure 29:
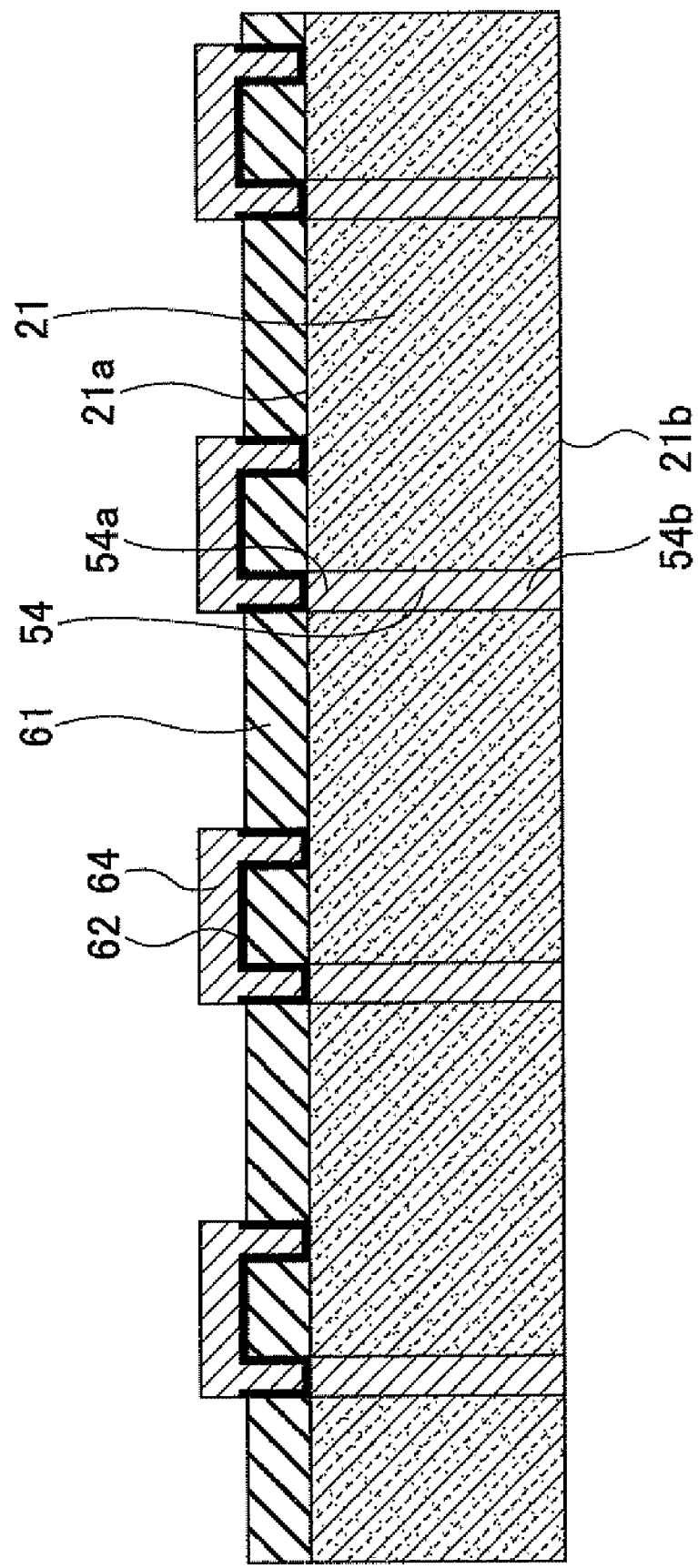
FIG. 29 is a cross-sectional view illustrating a ninth step of the manufacturing process of the semiconductor package illustrated in FIG. 20.
Figure 30:
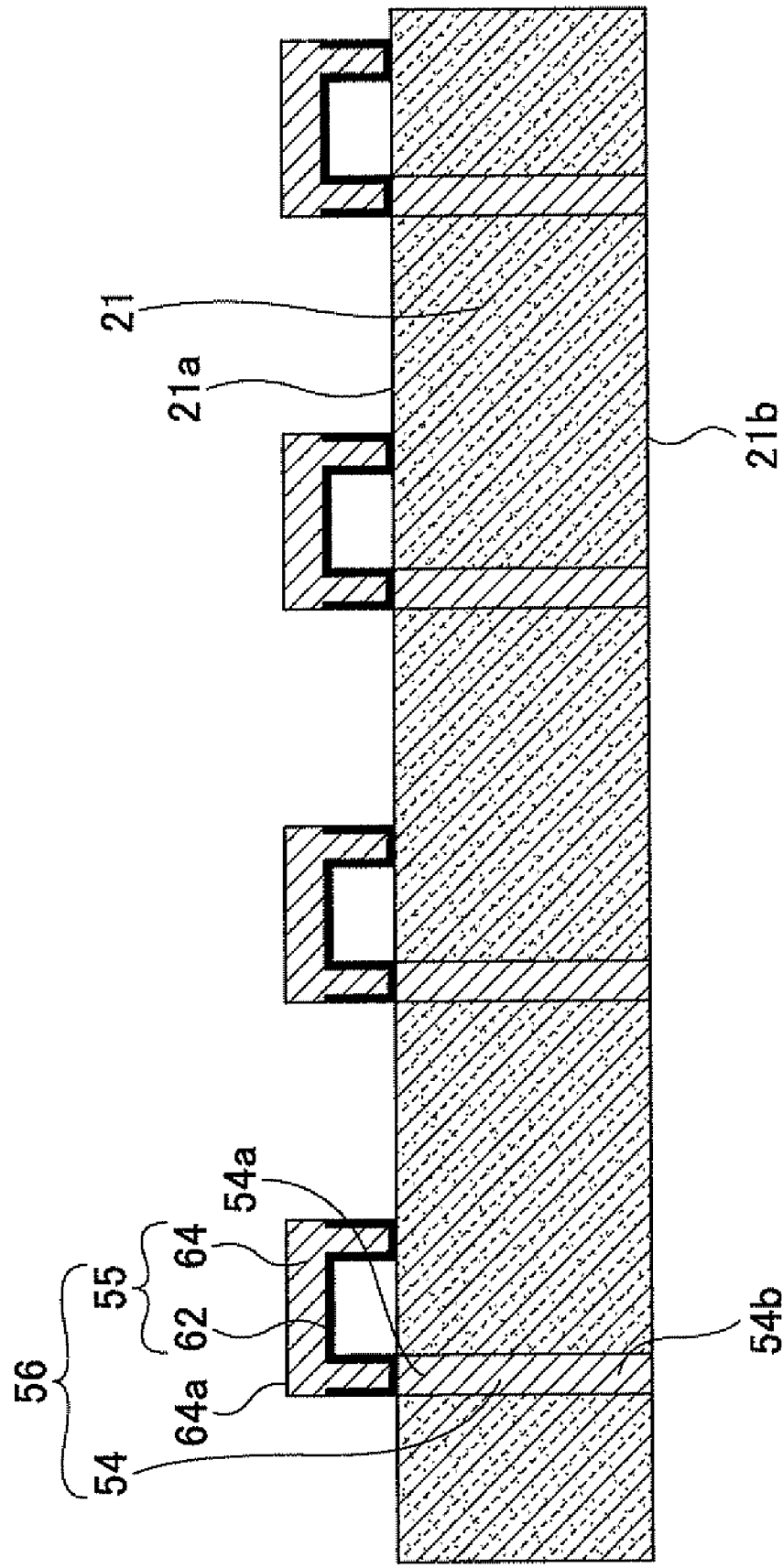
FIG. 30 is a cross-sectional view illustrating a tenth step of the manufacturing process of the semiconductor package illustrated in FIG. 20.

Subsequently, in an eighth step of the manufacturing process illustrated in FIG. 28, the resist film 63 formed on the seed layer 62 is removed. Then, in a ninth step of the manufacturing process illustrated in FIG. 29, portions of the seed layer 62, which portions are unnecessary and not covered by the plated film 64, are removed. The unnecessary portions of the seed layer 62 can be removed by, for example, etching. Then, in a tenth step of the manufacturing process illustrated in FIG. 30, the resist film 61 formed on the upper surface 21a of the semiconductor chip 21 is removed. Thereby, the penetration electrode 56 including the penetration part 54 and the support part 55 having the seed layer 62 and the plated film 64 are formed.

Subsequently, in an eleventh step of the manufacturing process illustrated in FIG. 31, a resist film 65 is formed to cover the lower surface 21b of the semiconductor chip 21. The thickness of the resist film 65 formed on the lower surface 21b of the semiconductor chip 21 can be set to, for example, 20 µm. Then, openings 65x are formed by exposing the resist film 65 through a mask and developing the exposed resist film 65. Each opening 65x is formed so that the penetration part 54 and a portion of the semiconductor chip 21 surrounding the penetration part 54 are exposed. Each opening 65x has a circular shape in a plan view, and the diameter of the opening 65x can be set to, for example, 50 µm.

Figure 32:
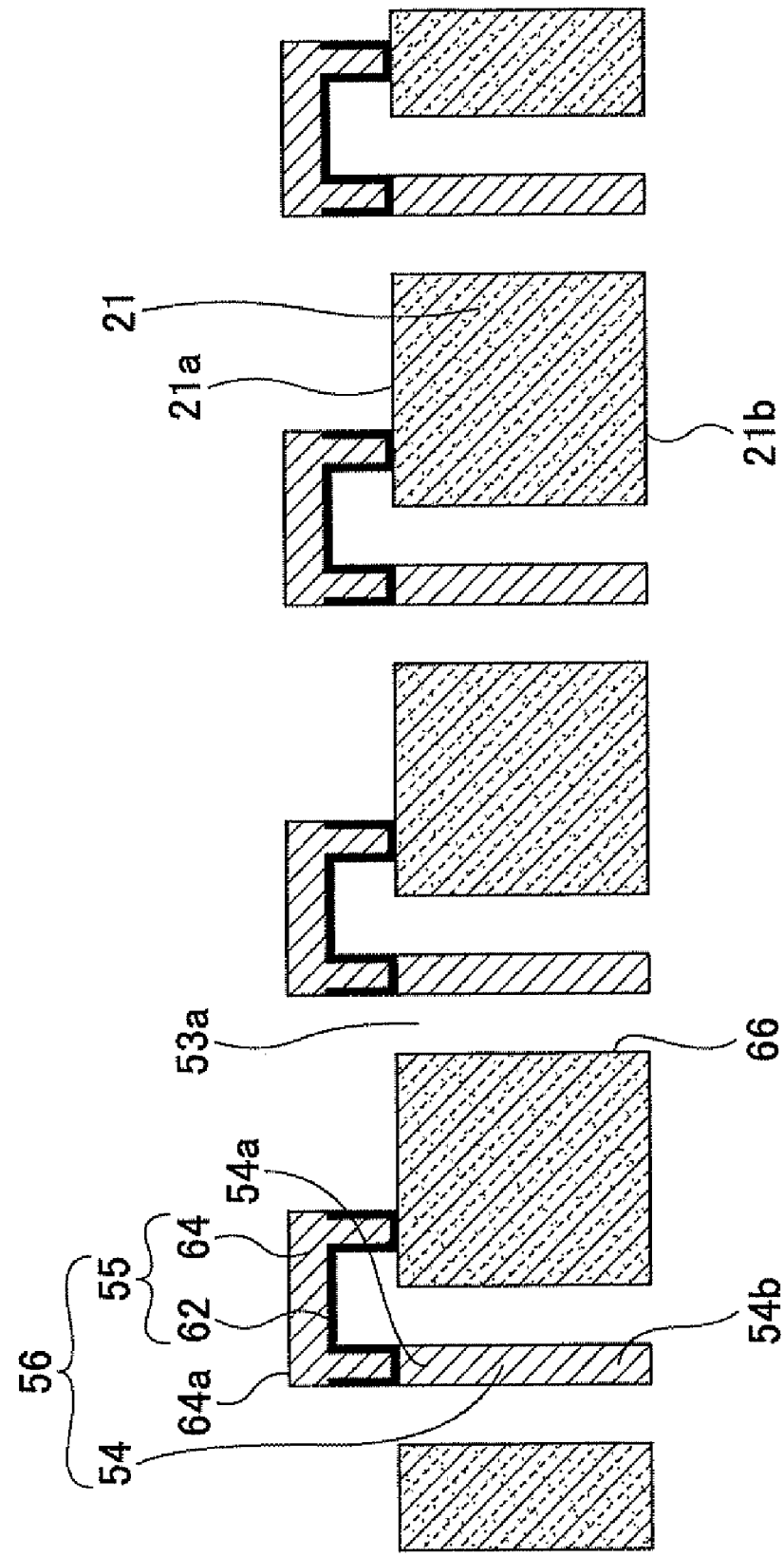
FIG. 32 is a cross-sectional view illustrating a twelfth step of the manufacturing process of the semiconductor package illustrated in FIG. 20.

Subsequently, in a twelfth step of the manufacturing process illustrated in FIG. 32, the penetration hole 53 is enlarged to form a space 66 around the penetration part 54 so that the entire side surface of the penetration part 54 is exposed. The enlarged penetration hole 53 corresponds to the penetration hole 53a. The space 66 can be formed by an anisotropic etching method such as, for example, a dry-etching method. The space 66 has an annular shape in a plan view, and the diameter of the space 66 (corresponding to the diameter of the penetration hole 53a) can be set to, for example, 30 µm. After formation of the space 66, the resist film 65 is removed. Thereby, the penetration part 54 penetrates through the semiconductor chip 21 without contacting the semiconductor chip 21.

Figure 33:
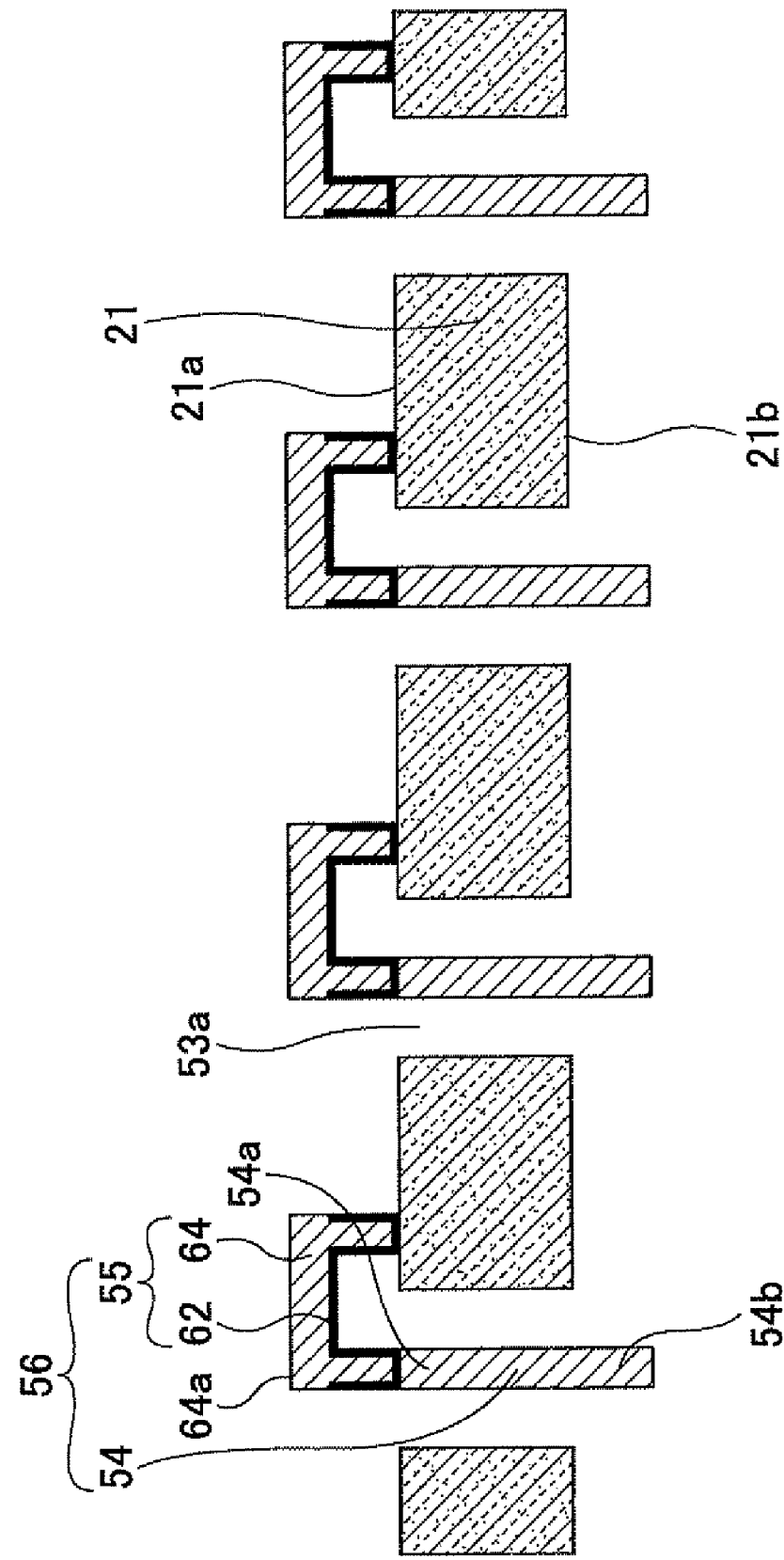
FIG. 33 is a cross-sectional view illustrating a thirteenth step of the manufacturing process of the semiconductor package illustrated in FIG. 20.

Subsequently, in a thirteenth step of the manufacturing process illustrated in FIG. 33, the lower surface 21b of the semiconductor chip 21 is etched by an anisotropic etching method such as, for example, a dry-etching method to have the end 54b of the penetration part 54 to be exposed on the lower surface 21b of the semiconductor chip 21. Then, in a fourteenth step of the manufacturing process illustrated in FIG. 34, an insulation film 52 is formed over the entire surface of the semiconductor chip 21 and the entire surface of the penetration electrode 56. The entire surface of the semiconductor chip 21 includes the inner surface of the through hole 53a. The insulation film 52 can be formed of $SiO_2$ using a CVD method. The thickness of the insulation film 52 can be set to, for example, 0.5 µm to 1.0 µm.

Figure 35:
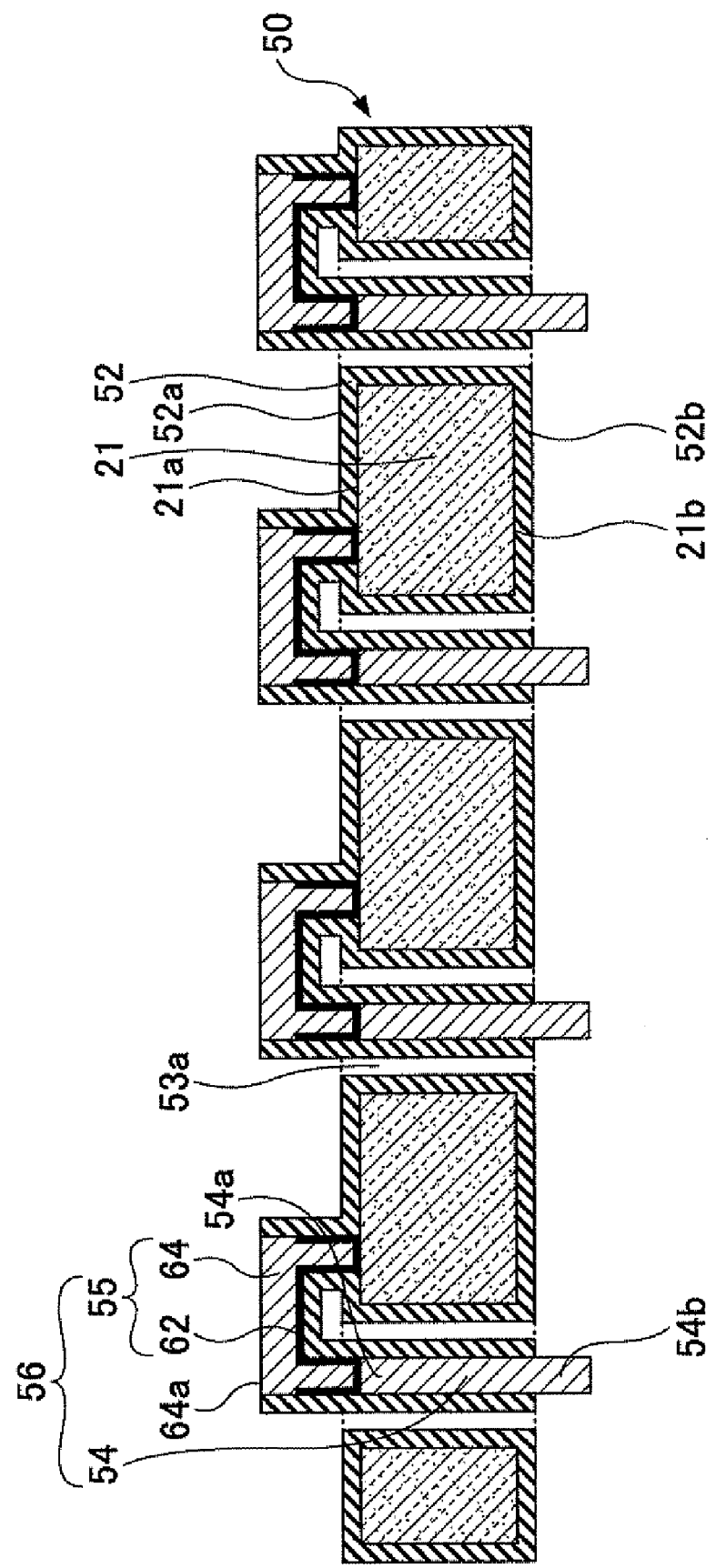
FIG. 35 is a cross-sectional view illustrating a fifteenth step of the manufacturing process of the semiconductor package illustrated in FIG. 20.

Subsequently, in a fifteenth step of the manufacturing process illustrated in FIG. 35, a portion of the insulation film 52 covering the end 54b of the penetration part 54 and a portion of the insulation film 52 covering an upper surface 64a of the plated film 64 are removed. The portions of the insulation film 52 can be removed by an anisotropic etching method such as, for example, a dry-etching using a resist film having openings corresponding to locations where the portions of the insulation film 52 are to be removed.

Figure 17:
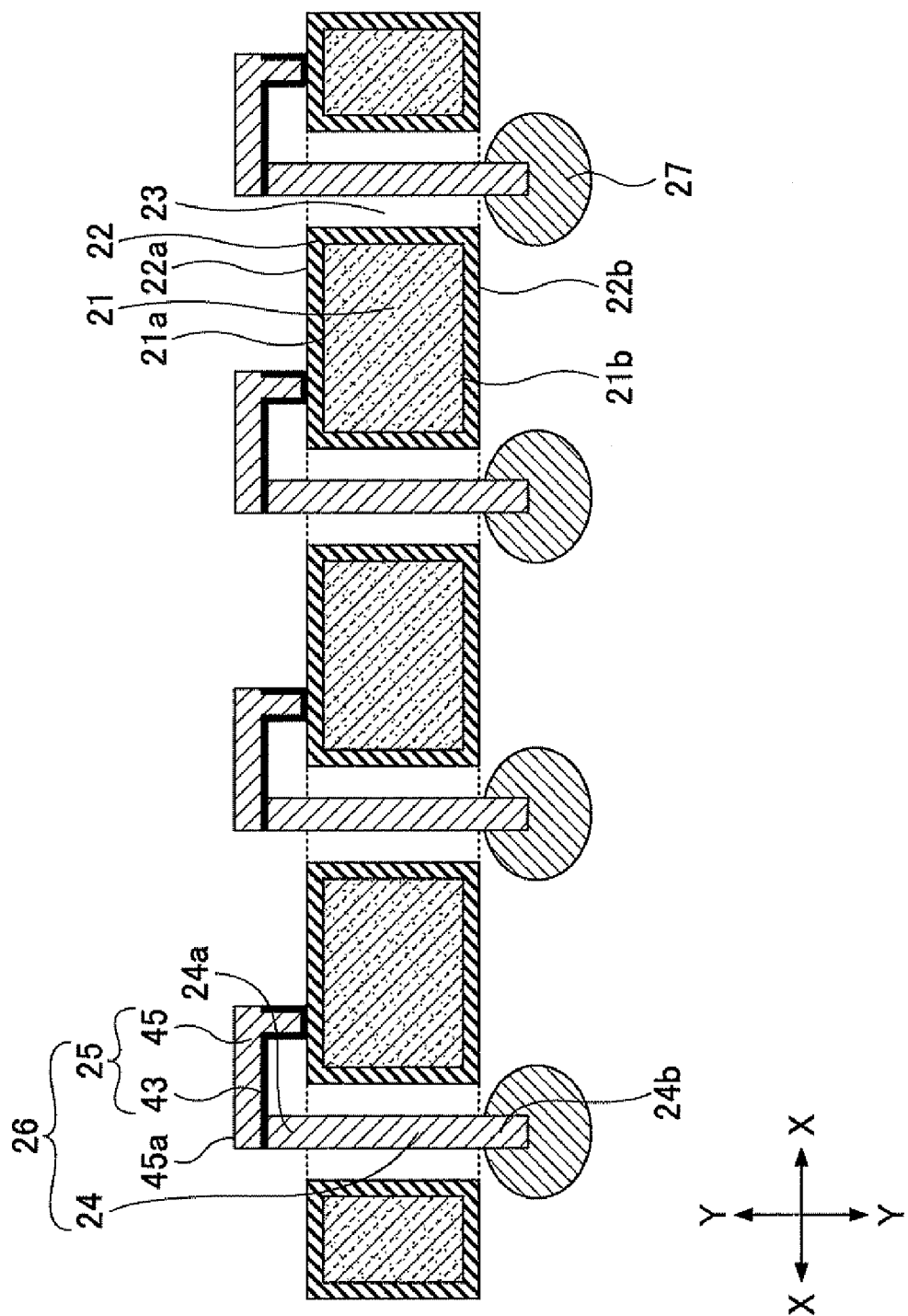
FIG. 17 is a cross-sectional view illustrating a fourteenth step of the manufacturing process of the semiconductor package illustrated in FIG. 2.

Subsequently, in a step similar to the step illustrated in FIG. 17, the connection terminal 27 is formed on the end 54b of the penetration part 54. It is desirable to form a small gap between the connection terminal 27 and the surface 52b of the insulation film 52 so that connection terminal 27 does not contact the insulation film 52. Thereby, the connection terminal can be movably supported by the support part 55 through the penetration part 54 in the Y-Y direction and the X-X direction.

The semiconductor package 11 according to the present embodiment provides the same effects as the semiconductor package 10 according to the first embodiment of the present invention.

Third Embodiment

Figure 36:
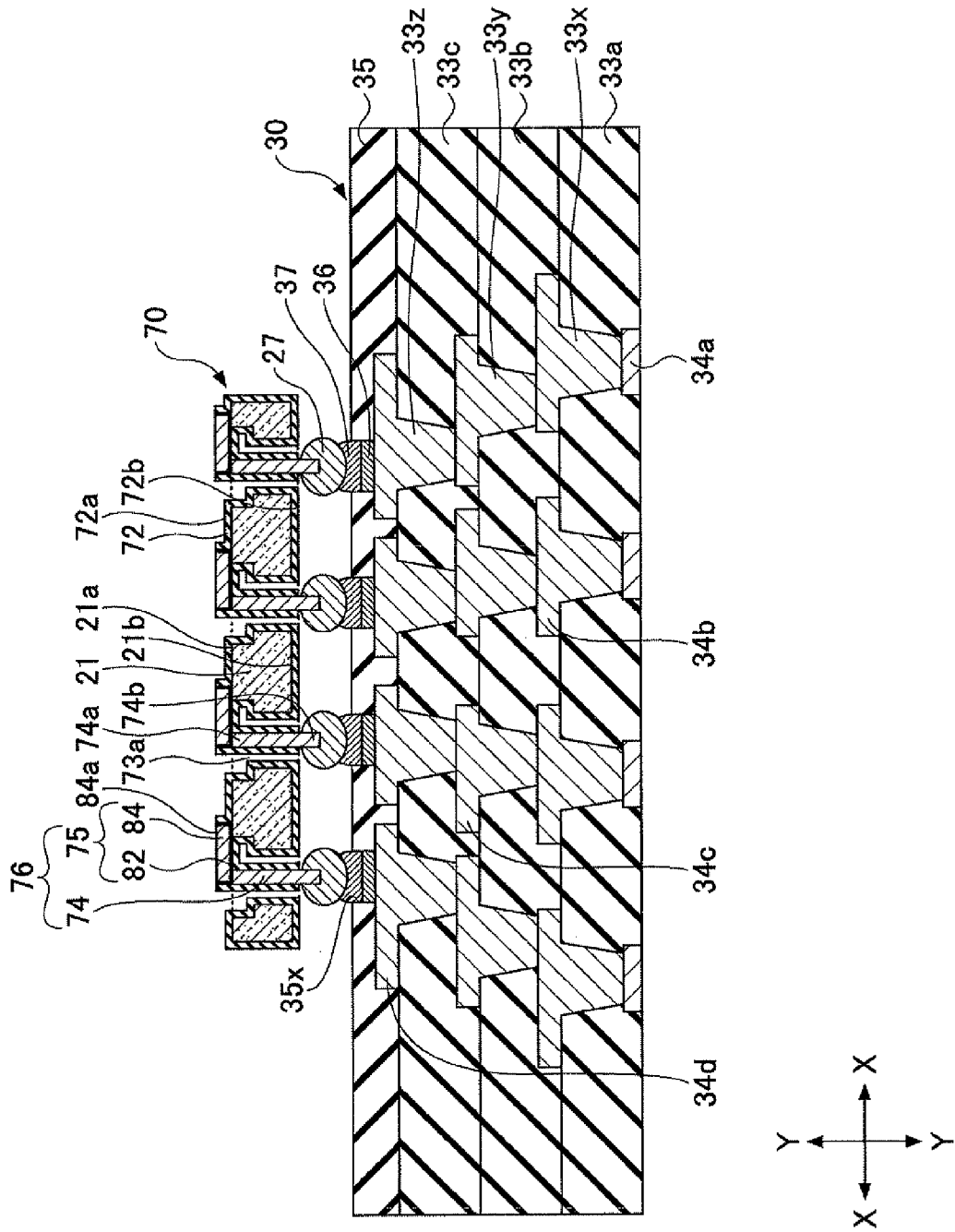
FIG. 36 is a cross-sectional view of a semiconductor package according to a third embodiment of the present invention.

A description will be given of a structure of a semiconductor package according to a third embodiment of the present invention. The description is focused on structures of the semiconductor package according to the third embodiment different from the semiconductor packages 10 and 11 according to the above-mentioned first and second embodiments. FIG. 36 is a cross-sectional view of the semiconductor package according to the third embodiment of the present invention. In FIG. 36, parts that are the same as the parts illustrated in FIG. 2 are given the same reference numerals, and descriptions thereof will be omitted. In FIG. 36, the X-X direction indicates a direction parallel to the top surface 21a of the semiconductor chip 21, and the Y-Y direction indicates a direction perpendicular to the X-X direction.

With reference to FIG. 36, the semiconductor package 12 according to the third embodiment has the same structure as the semiconductor package 10 illustrated in FIG. 2 except that the semiconductor device 20 is replaced by a semiconductor package 70. A description is given below of the semiconductor package 70. The semiconductor device 70 includes the semiconductor chip 21, an insulation film 72, penetration holes 73a, penetration electrodes 76 and the connection terminals 27.

The insulation film 72 is provided to cover the surfaces of the semiconductor chip 21, which surfaces include inner surfaces of the penetration holes 73a. The insulation film 72 also covers a penetration part 74 of each penetration electrode 56 except for an end 74b thereof, and covers a support part 75 of each penetration electrode 76 except for an upper surface thereof. The insulation film 72 is a film for insulating the semiconductor chip 21 and the penetration electrode 76 from each other. For example, the insulation film 72 can be formed of $SiO_2$. The thickness of the insulation film 72 can be set to, for example, 0.5 µm to 1.0 µm.

The penetration holes 73a penetrate through the semiconductor chip 21. The penetration holes 73a are provided in portions of the semiconductor chip 21 where no semiconductor integrated circuit (not illustrated in the figure) is formed. Each of the penetration holes 73a has a circular shape in a plan view, and a diameter of each of the penetration holes 73a can be set to, for example, 50 µm. The pitch of the penetration holes 73a can be set to, for example, 100 µm.

Each of the penetration electrodes 76 includes a penetration part 74 and a support part 75. The penetration part 74 is formed of an electrically conductive material, and arranged in the penetration hole 73a so that the penetration part 74 does not contact with the semiconductor chip 21 and the insulation film 72. One end 74a of the penetration part 74 is substantially at the same level with the upper surface 21a of the semiconductor chip 21.

The end 74a of the penetration part 74 is integrally formed with the support part 75. The other end 74b of the penetration part 54 protrudes from a surface 72b of the insulation film 72 provided on the lower surface 21b of the semiconductor chip 21. The penetration part 74 has a circular shape in a plan view, and a diameter of the penetration part 74 can be set to, for example, 30 µm.

The support part 75 constituting the penetration electrode 76 includes a seed layer 82 and a plated film 84. The seed layer 82 is formed of an electrically conductive material. One end of the support part 75 is integrally formed with the end 74a of the penetration part 74, and the other end of the support part 75 is fixed to the upper surface 21a of the semiconductor chip 21 so that the support part 75 is electrically connected to a wiring layer (not illustrated in the figure) formed on the semiconductor chip 21. The wiring layer extends from a semiconductor integrated circuit (not illustrated in the figure).

The support part 75 has a spring characteristic in order to movably support the entire penetration part 74 in the Y-Y direction and movably support the end 74b of the penetration part 74 in the X-X direction. The penetration electrode 76 formed by the penetration part 74 and the support part 75 is formed of an electrically conductive material such as copper (Cu) and a brass (Cu—Zn alloy). If the penetration part 74 is formed of copper (Cu) and the support part 75 is formed of a brass (Cu—Zn alloy), a spring characteristic can be given to the penetration electrode 76 and the penetration electrode 76 can be easily formed by using a plating method.

The connection terminal 27 is formed on the end 74b of the penetration part 74. The connection terminal 27 is not fixed to the surface 72b of the insulation film 72. Although the connection terminal 27 can be brought into contact with the surface 72b of the insulation film 72, it is desirable to form a small gap (for example, about 50 μm) so that the connection terminal 27 and the insulation film 72 do not contact each other. The connection terminal 27 is supported by the support part 75 through the penetration part 74. The penetration part 74 and the connection terminal 27 are electrically connected with each other.

A description will be given below of a manufacturing method of the semiconductor package 12 according to the third embodiment of the present embodiment. FIG. 37 through FIG. 49 are cross-sectional views for explaining a manufacturing process of the semiconductor package 12 according to the third embodiment of the present invention. In FIG. 37 through FIG. 49, parts that are the same as the parts illustrated in FIG. 36 are given the same reference numerals, and descriptions thereof will be omitted.

Figure 37:
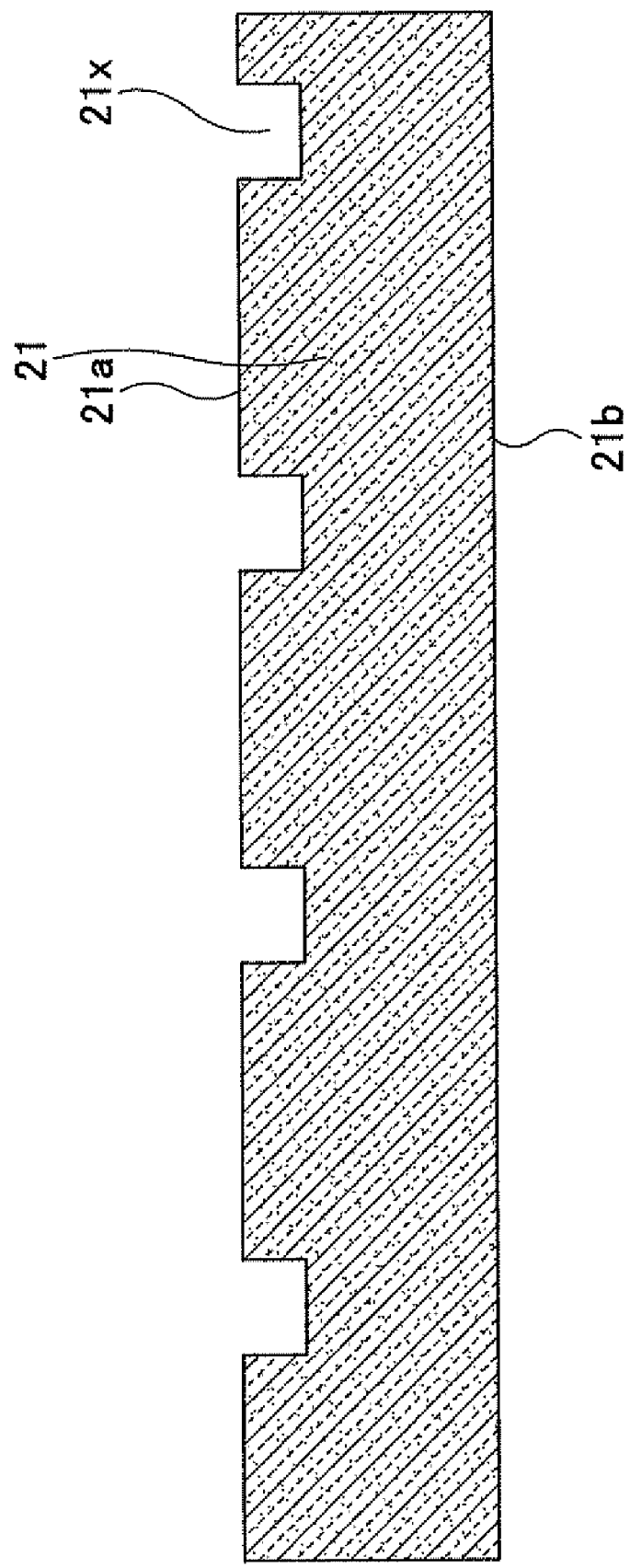
FIG. 37 is a cross-sectional view illustrating a first step of a manufacturing process of the semiconductor package illustrated in FIG. 36.
Figure 38:
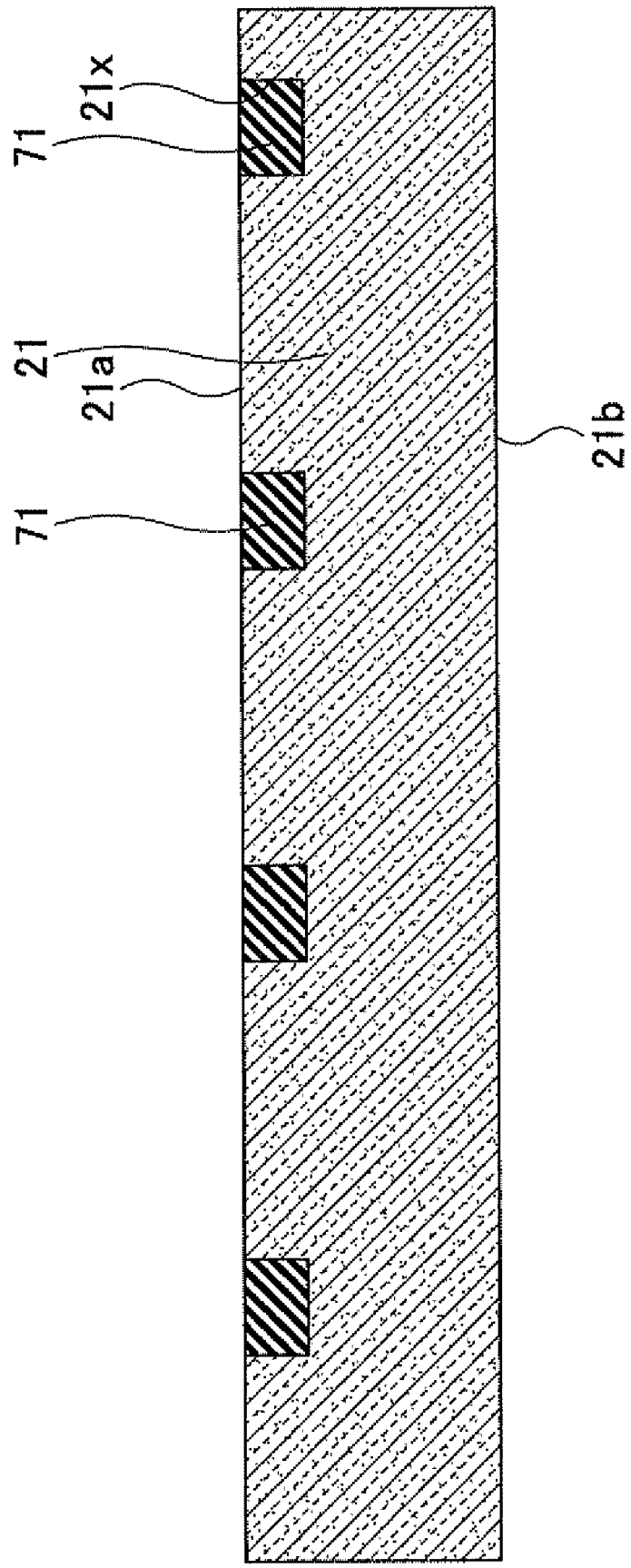
FIG. 38 is a cross-sectional view illustrating a second step of the manufacturing process of the semiconductor package illustrated in FIG. 36.

First, in a first step of the manufacturing process illustrated in FIG. 37, a plurality of recessed parts 21x are formed in the semiconductor chip 21, which constitutes the semiconductor device 70. The recessed parts 21x can be formed by an anisotropic etching method such as, for example, a dry-etching method. Each of the recessed parts 21x has a square shape in a plan view. Then, in a second step of the manufacturing process illustrated in FIG. 38, resist films 71 are formed in the recessed parts 21x by filling a resist in the recessed parts 21x. The resist films 71 can be formed by forming a resist layer on the upper surface 21a of the semiconductor chip 21 including the recessed parts 21x and removing unnecessary portions of the resist layer by exposing the resist layer though a mask and developing the exposed resist layer.

Figure 39A:
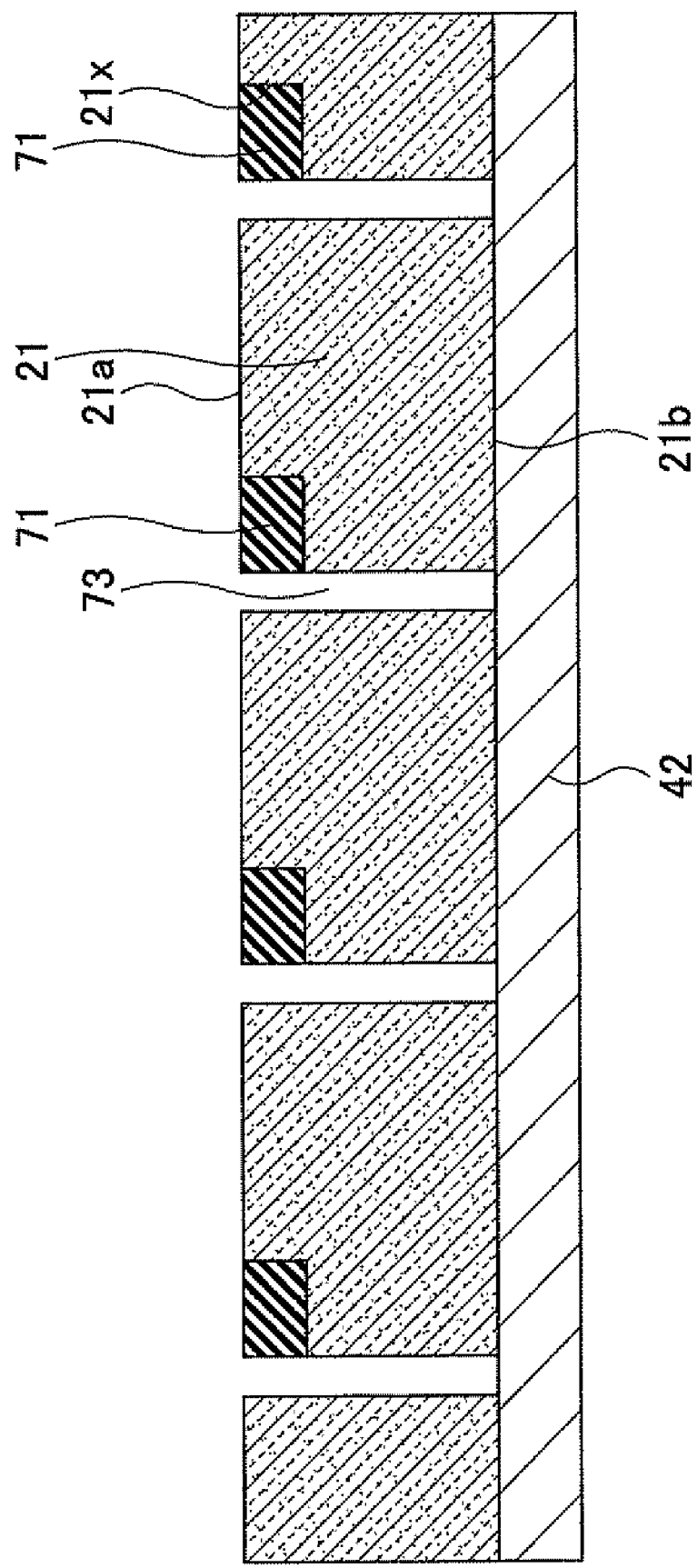
FIG. 39A is a cross-sectional view illustrating a third step of the manufacturing process of the semiconductor package illustrated in FIG. 36.
Figure 39B:
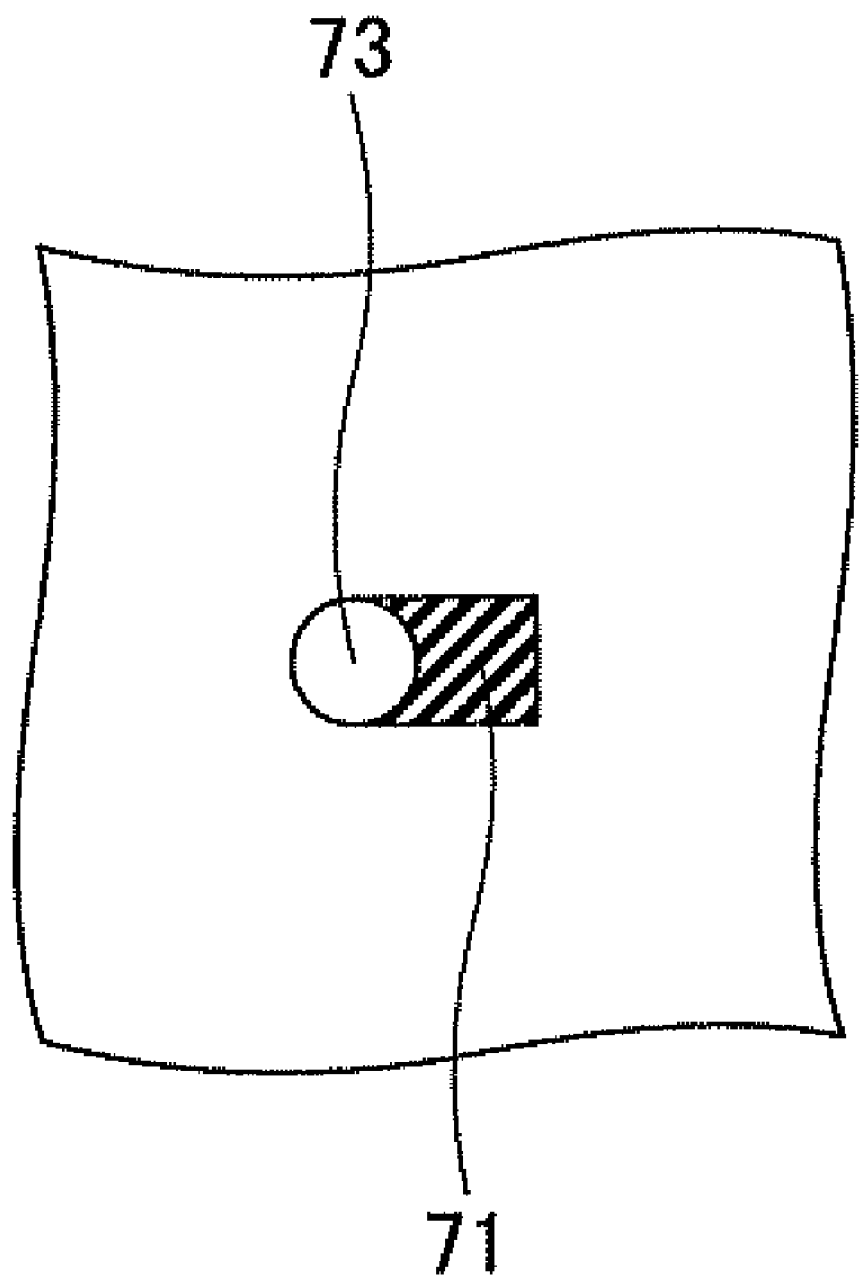
FIG. 39B is a plan view of an penetration hole and a resist film illustrated in FIG. 39A.

Subsequently, in a third step of the manufacturing process illustrated in FIG. 39A, a plurality of penetration holes 73 are formed in the semiconductor chip 21. The penetration holes 73 penetrate the semiconductor chip 21 to extend from the upper surface 21a to the lower surface 21b. The penetration holes 73 can be formed by an anisotropic etching method such as, for example, a dry-etching method. As illustrated in FIG. 39B, each of the penetration holes 73 has a circular shape in a plan view, and the diameter of each of the penetration holes 73 can be set to, for example, 30 μm. In the plan view, each penetration hole 73 is arranged adjacent to the respective resist film 71. Then, the metal plate 42 is applied onto the lower surface 21b of the semiconductor chip 21. The metal plate 42 serves as a power supply layer when forming the penetration part 74 constituting the penetration electrode 76 according to an electrolytic plating method. The metal plate 42 can be formed of a copper (Cu) plate. In the step illustrated in FIG. 39A, a metal foil such as, for example, a copper (Cu) foil may be applied, instead of the metal plate 42, onto the lower surface 21b of the semiconductor chip 21.

Figure 40:
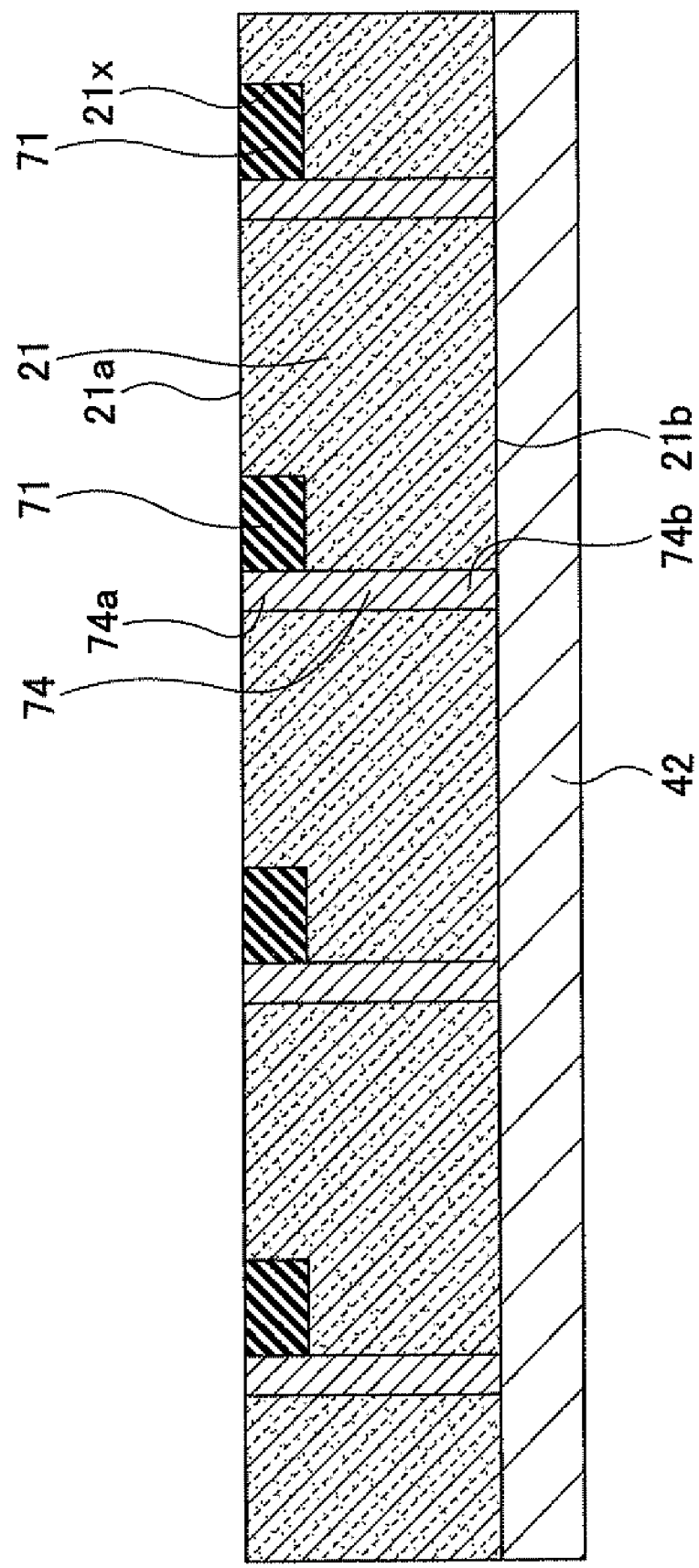
FIG. 40 is a cross-sectional view illustrating a fourth step of the manufacturing process of the semiconductor package illustrated in FIG. 36.

Subsequently, in a fourth step of the manufacturing process illustrated in FIG. 40, the penetration part 74 is formed by depositing a plated film to fill the penetration hole 73 according to an electrolytic plating method using the metal plate 42 as a power supply layer. For example, a copper (Cu) plated film can be used as the plated film constituting the penetration part 74. Then, similar to the step illustrated in FIG. 10, the metal plate 42 provided in the structure illustrated in FIG. 40 is removed.

Figure 41:
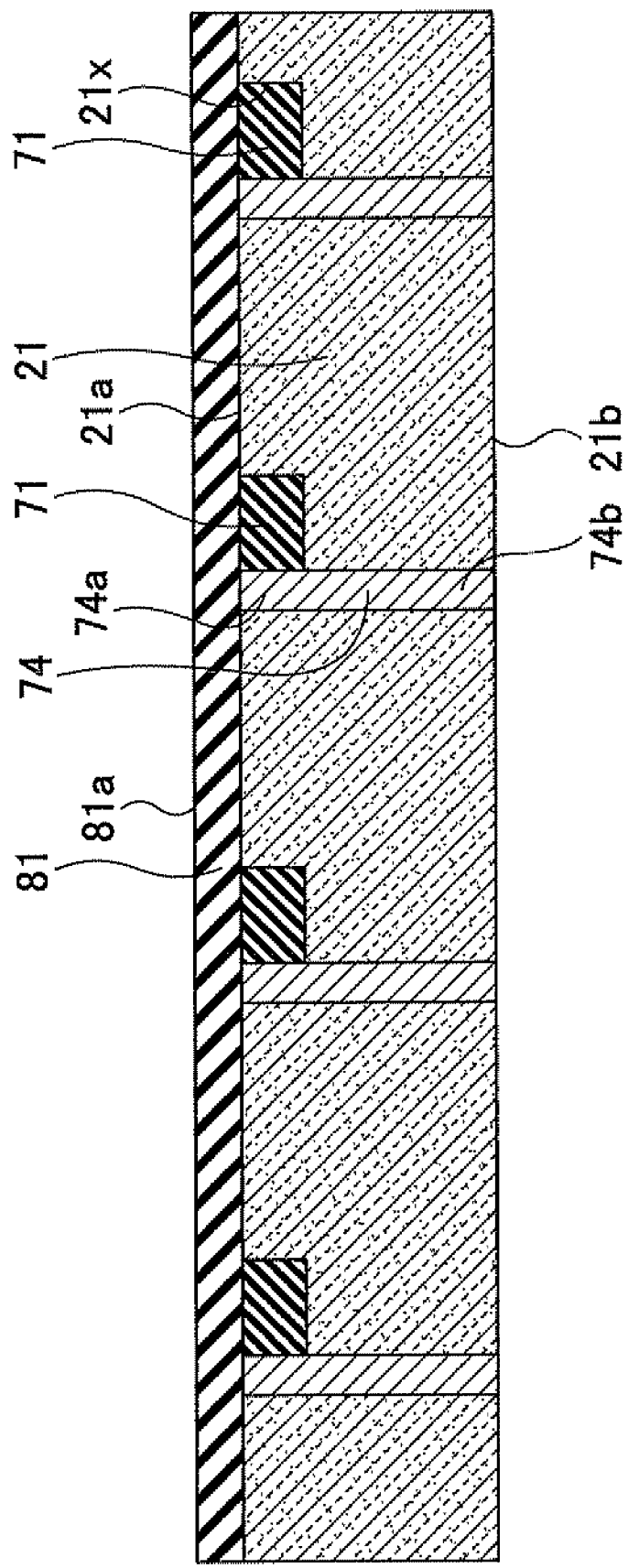
FIG. 41 is a cross-sectional view illustrating a fifth step of the manufacturing process of the semiconductor package illustrated in FIG. 36.

Subsequently, in a fifth step of the manufacturing process illustrated in FIG. 41, a resist film 81 is formed on the upper surface 21a of the semiconductor chip 21. The resist film 81 can be formed by applying a liquid resist onto the upper surface 21a of the semiconductor chip 21. The thickness of the resist film 81 can be set to, for example, 20 μm.

Figure 42A:
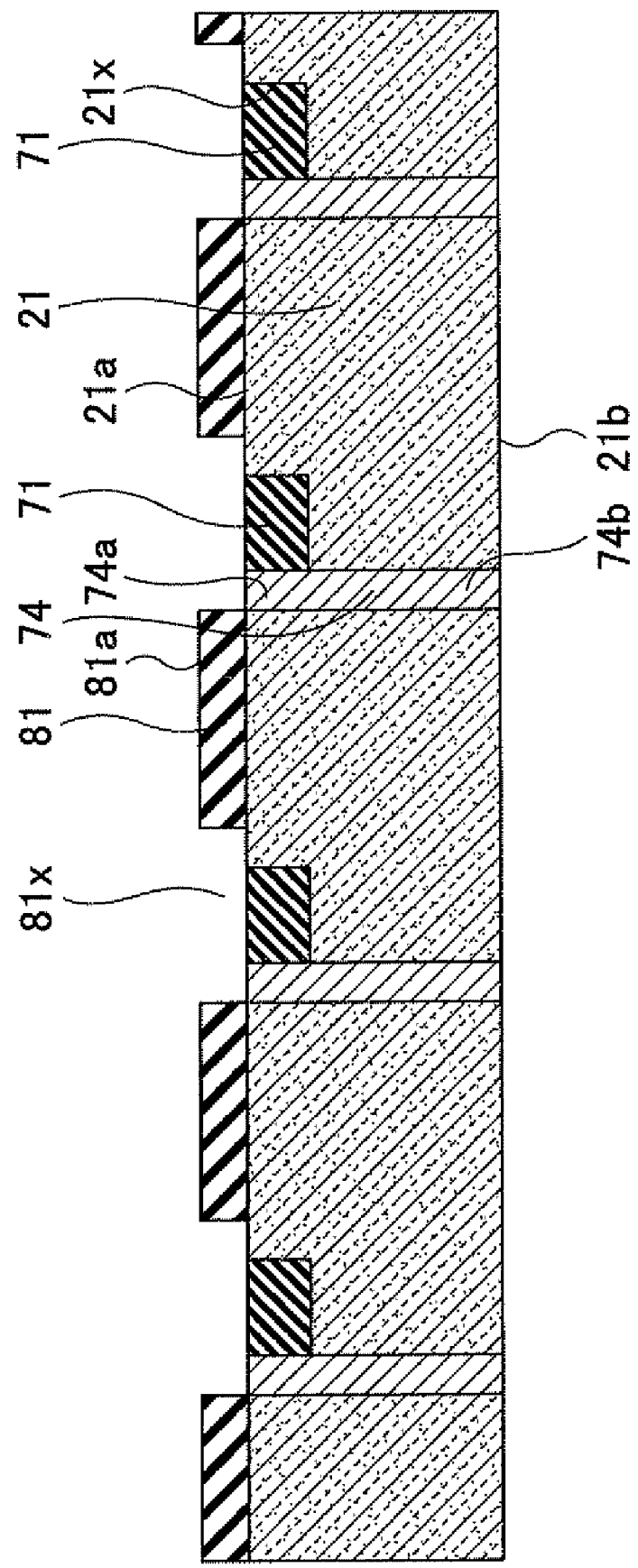
FIG. 42A is a cross-sectional view illustrating a sixth step of the manufacturing process of the semiconductor package illustrated in FIG. 36.
Figure 42B:
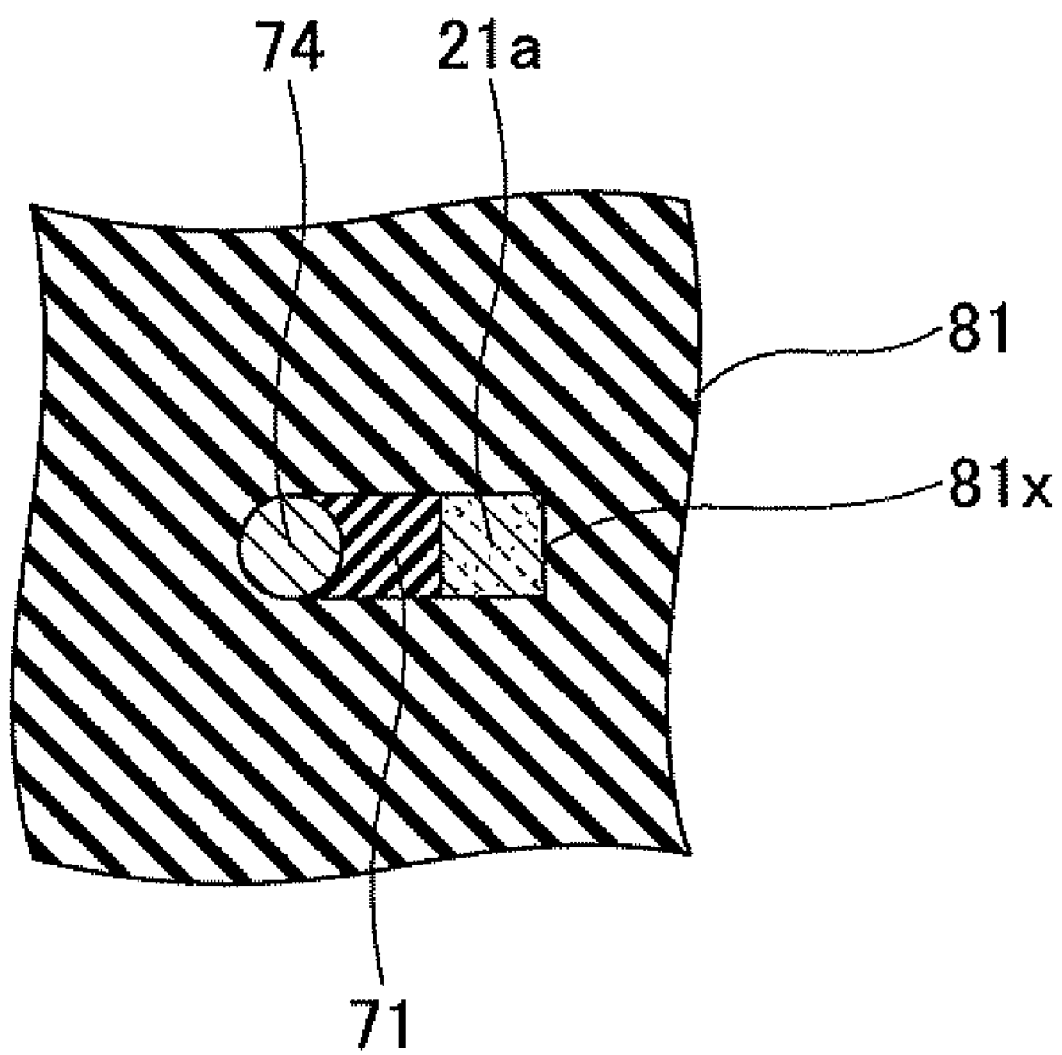
FIG. 42B is a plan view of a penetration part and a resist film illustrated in FIG. 42A.

Subsequently, in a sixth step of the manufacturing process illustrated in FIG. 42A, openings 81x are formed in the resist film 81 by exposing the resist film 81 through a mask and then developing the exposed resist film 81. Each opening 81x is provided for exposing an upper surface of the penetration part 74, an upper surface of the resist film 71 and a portion of the upper surface 21a of the semiconductor chip 21.

Figure 43:
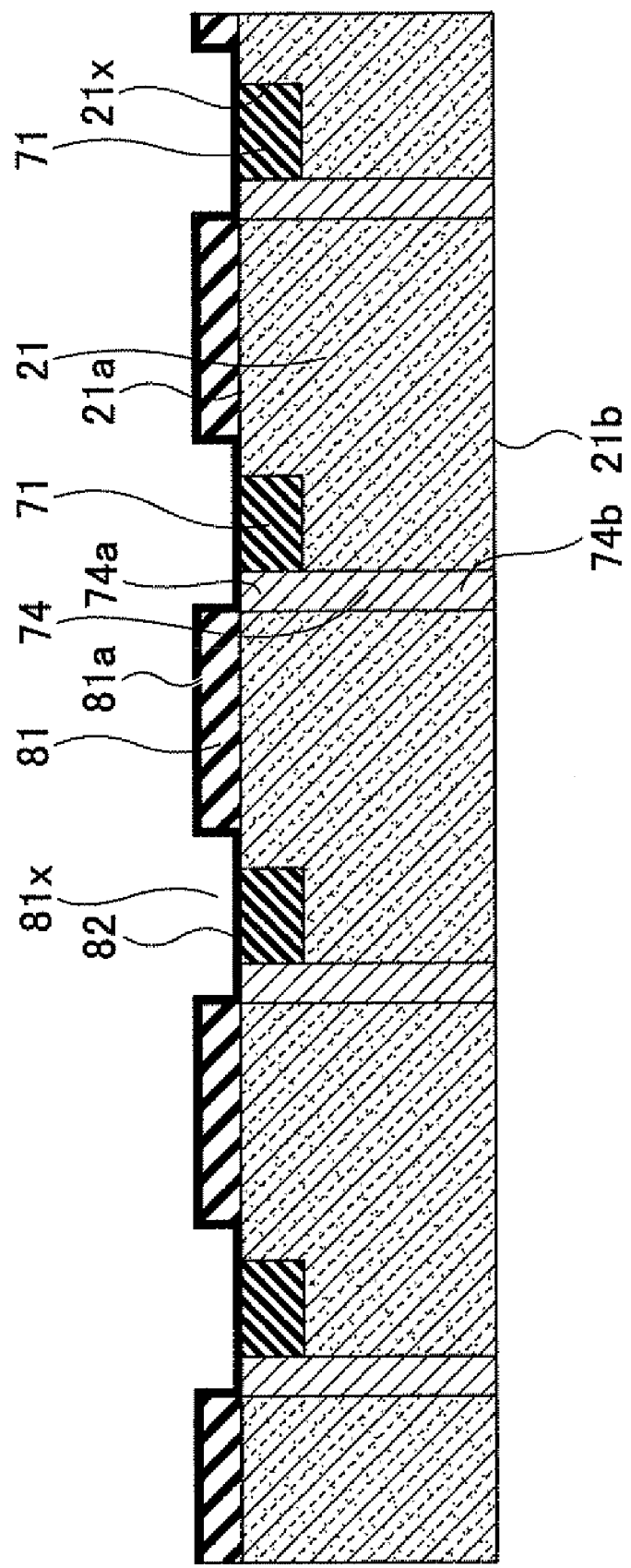
FIG. 43 is a cross-sectional view illustrating a seventh step of the manufacturing process of the semiconductor package illustrated in FIG. 36.

Subsequently, in a seventh step of the manufacturing process illustrated in FIG. 43, a seed layer 82 is formed to cover an upper surface 81a of the resist film 81 and bottom and side surfaces of the openings 81x. The seed layer 82 is used as a power supply layer when forming the support part 75 constituting the penetration electrode 76 according to an electrolytic plating method. The seed layer 82 can be formed by methods such as, for example, a sputtering method or an electroless plating method. A copper (Cu) layer may be used as the seed layer 82. If a copper (Cu) layer is used as the seed layer 82, the thickness of the seed layer 82 can be set to, for example, 0.3 μm.

Figure 44:
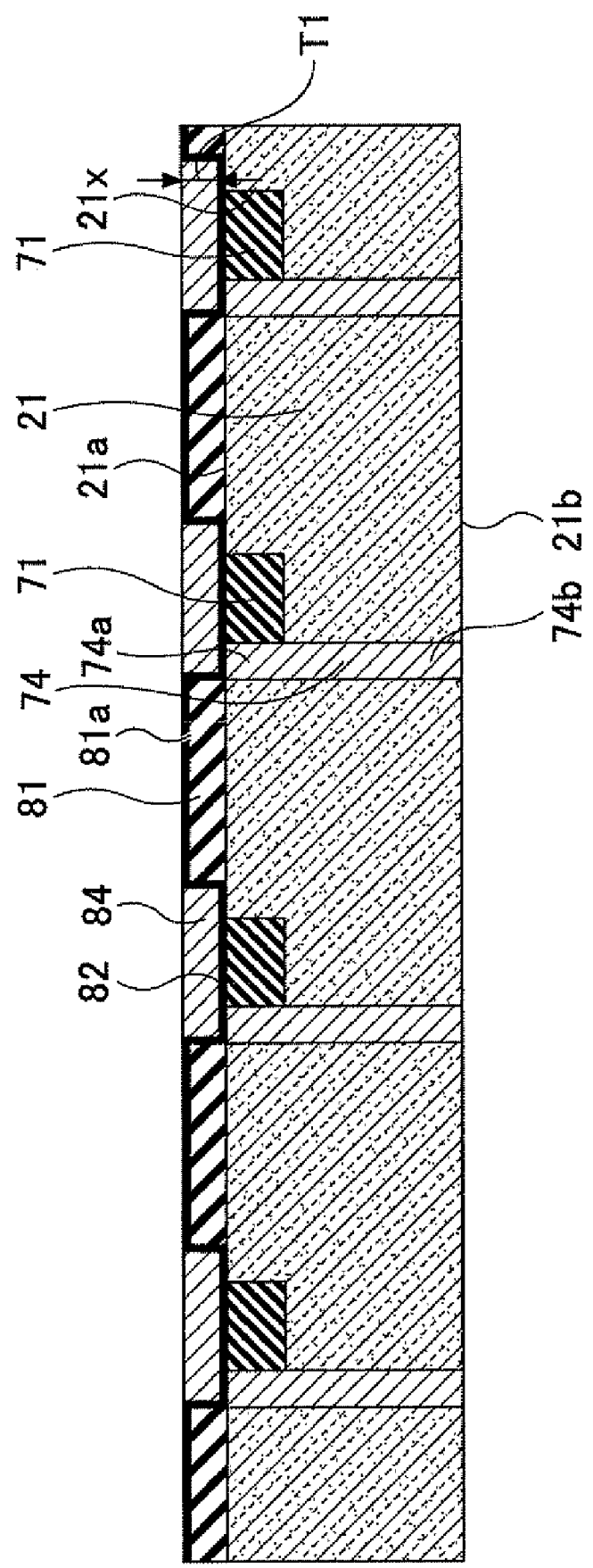
FIG. 44 is a cross-sectional view illustrating an eighth step of the manufacturing process of the semiconductor package illustrated in FIG. 36.

Subsequently, in an eighth step of the manufacturing process illustrated in FIG. 44, a plated film 84 is deposited and grown according to an electrolytic plating method using the seed layer 82 as a power supply layer in order to fill the plated film 84 in the openings 81x. The plated film 84 is one of the structural elements of the support part 75. For example, a copper (Cu) plated film can be used as the plated film 84. If a copper (Cu) plated film is used as the plated film 84, the thickness T1 of the plated film 84 can be set to, for example, 10 μm.

Figure 45:
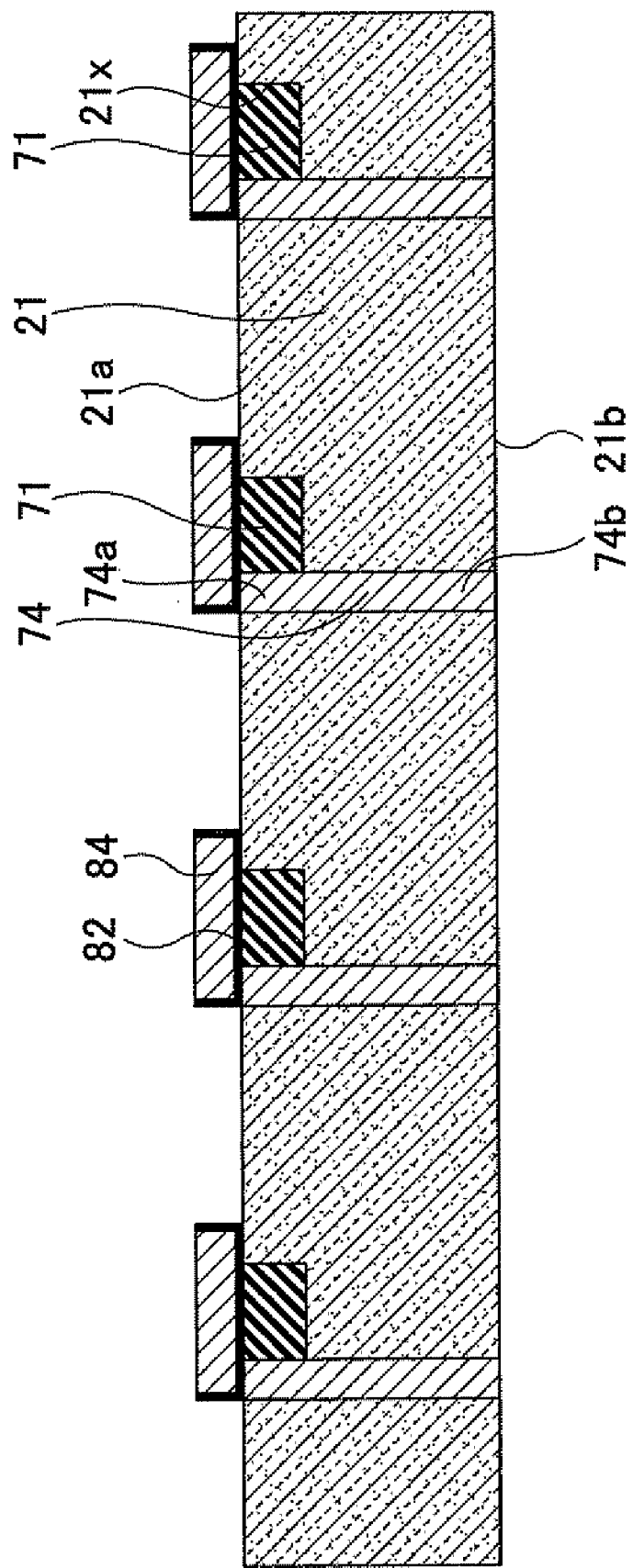
FIG. 45 is a cross-sectional view illustrating a ninth step of the manufacturing process of the semiconductor package illustrated in FIG. 36.

Subsequently, in a ninth step of the manufacturing process illustrated in FIG. 45, portions of the seed layer 82, which portions are not covered by the plated film 84, are removed. The unnecessary portions of the seed layer 82 can be removed by, for example, etching. Then, the resist film 81 formed on the upper surface 21a of the semiconductor chip 21 is removed.

Figure 46A:
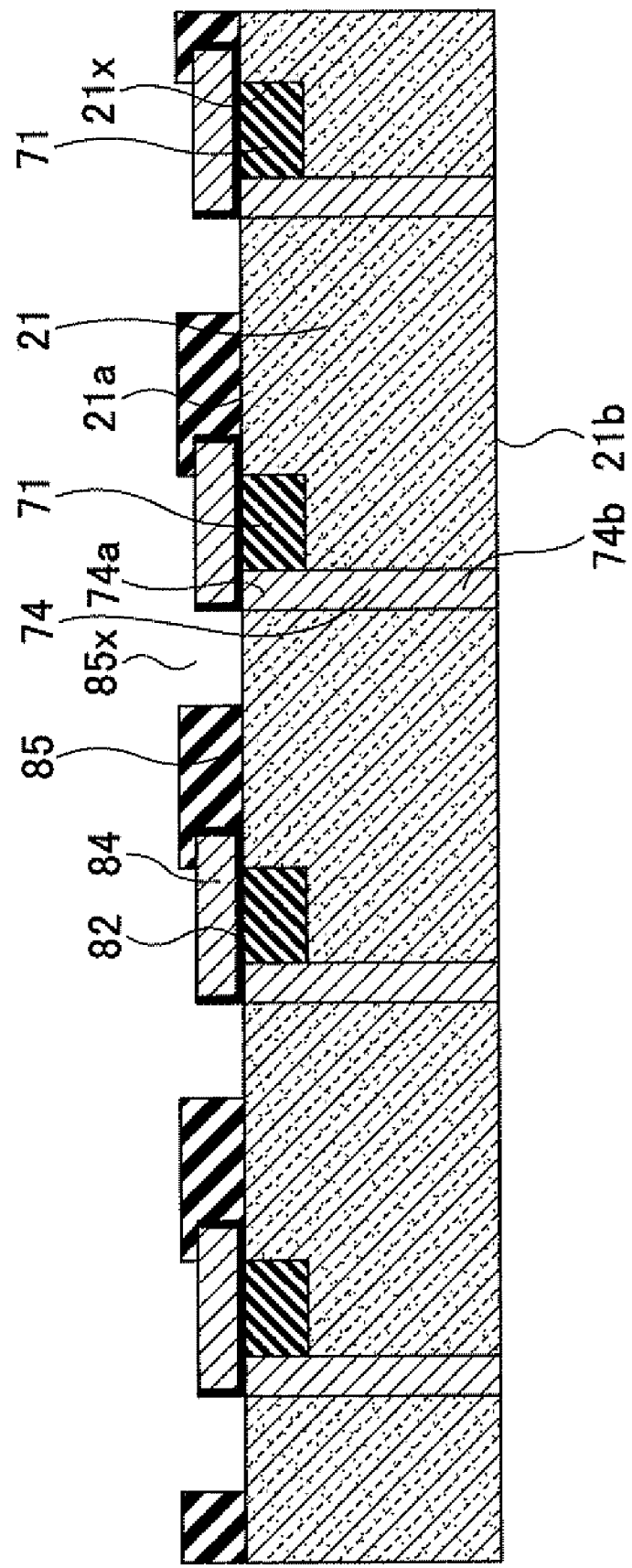
FIG. 46A is a cross-sectional view illustrating a tenth step of the manufacturing process of the semiconductor package illustrated in FIG. 36.
Figure 46B:
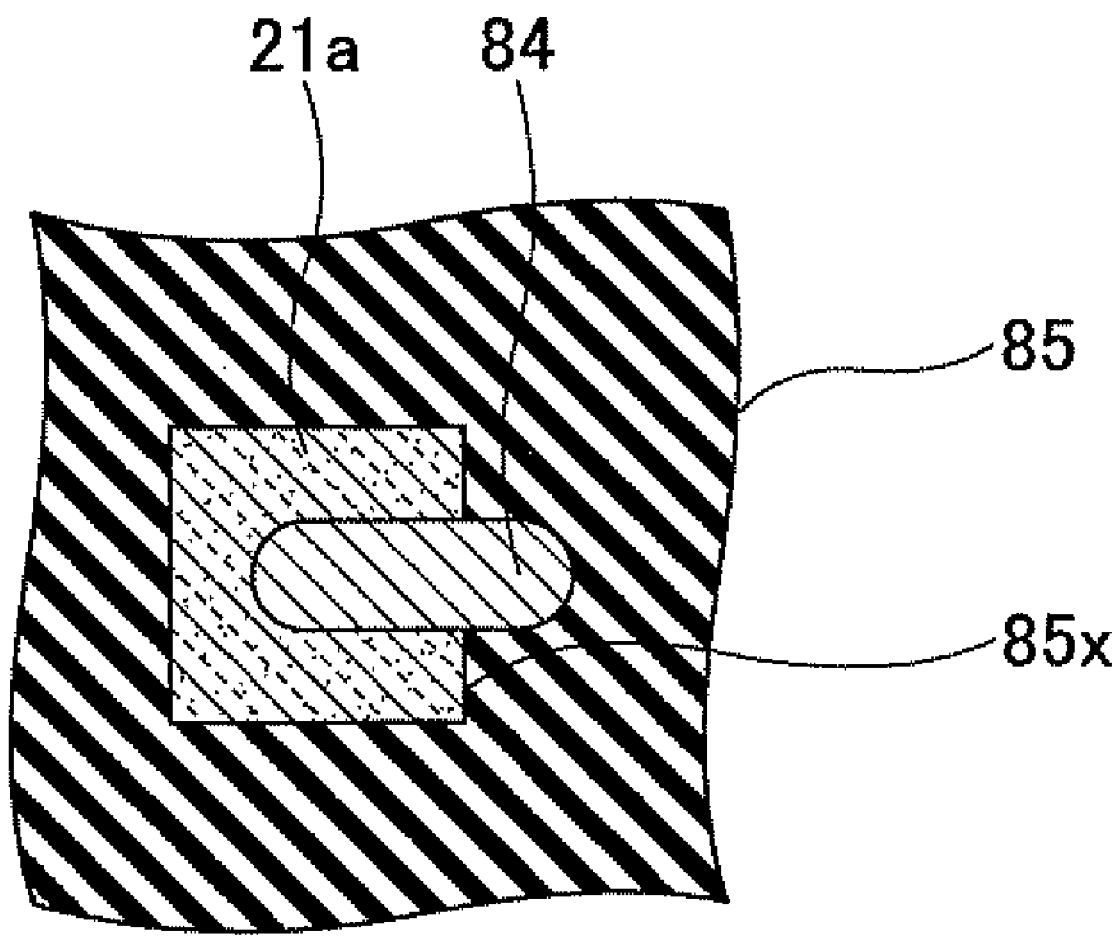
FIG. 46B is a plan view of an opening and a plated film illustrated in FIG. 46A.
Figure 47:
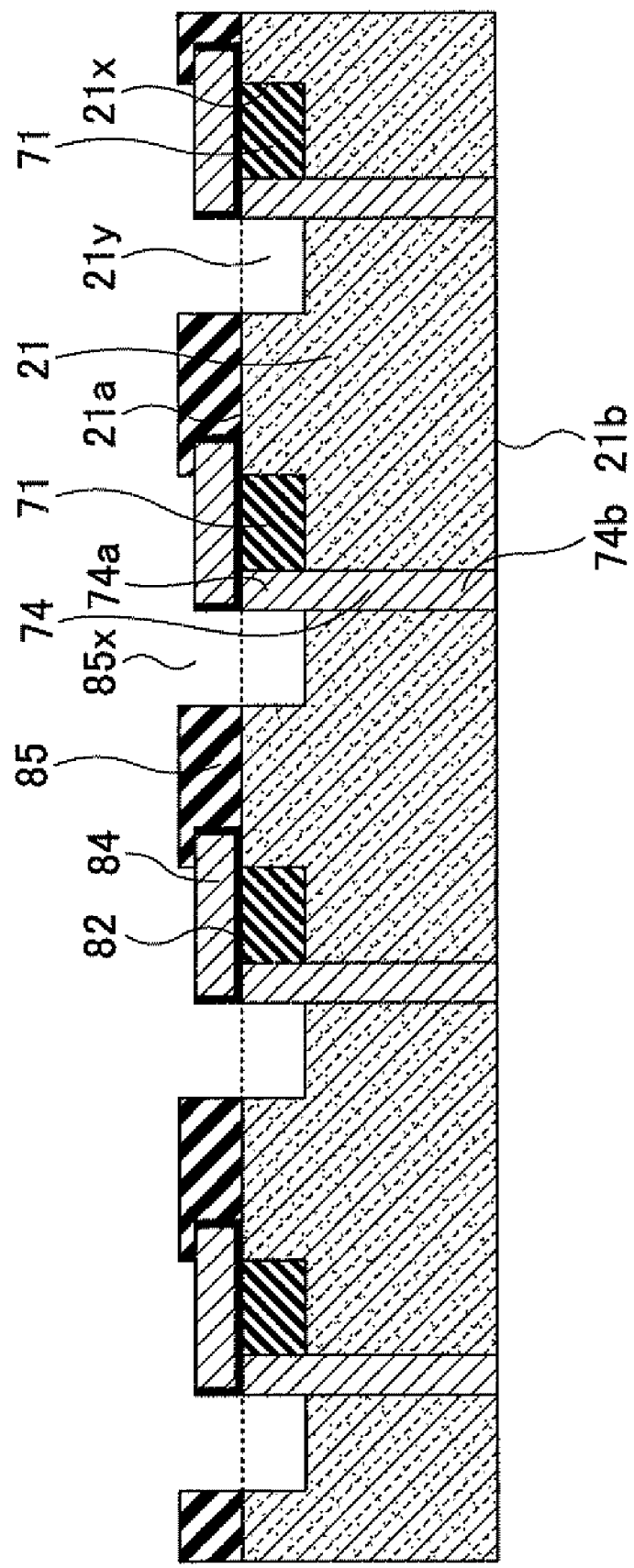
FIG. 47 is a cross-sectional view illustrating an eleventh step of the manufacturing process of the semiconductor package illustrated in FIG. 36.

Subsequently, in a tenth step of the manufacturing process illustrated in FIG. 46A, a resist film 85 having openings 85x is formed on the upper surface 21a of the semiconductor chip 21. Portions of the upper surface 21a of the semiconductor chip 21 are exposed in the openings 85x as illustrated in FIG. 46B. Then, in an eleventh step of the manufacturing process illustrated in FIG. 47, recessed parts 21y are formed in the portions of the semiconductor chip 21, which portions are not covered by the plated film 84 in the openings 85x. The recessed parts 21y can be formed by an anisotropic etching method such as, for example, a dry-etching method.

Figure 48:
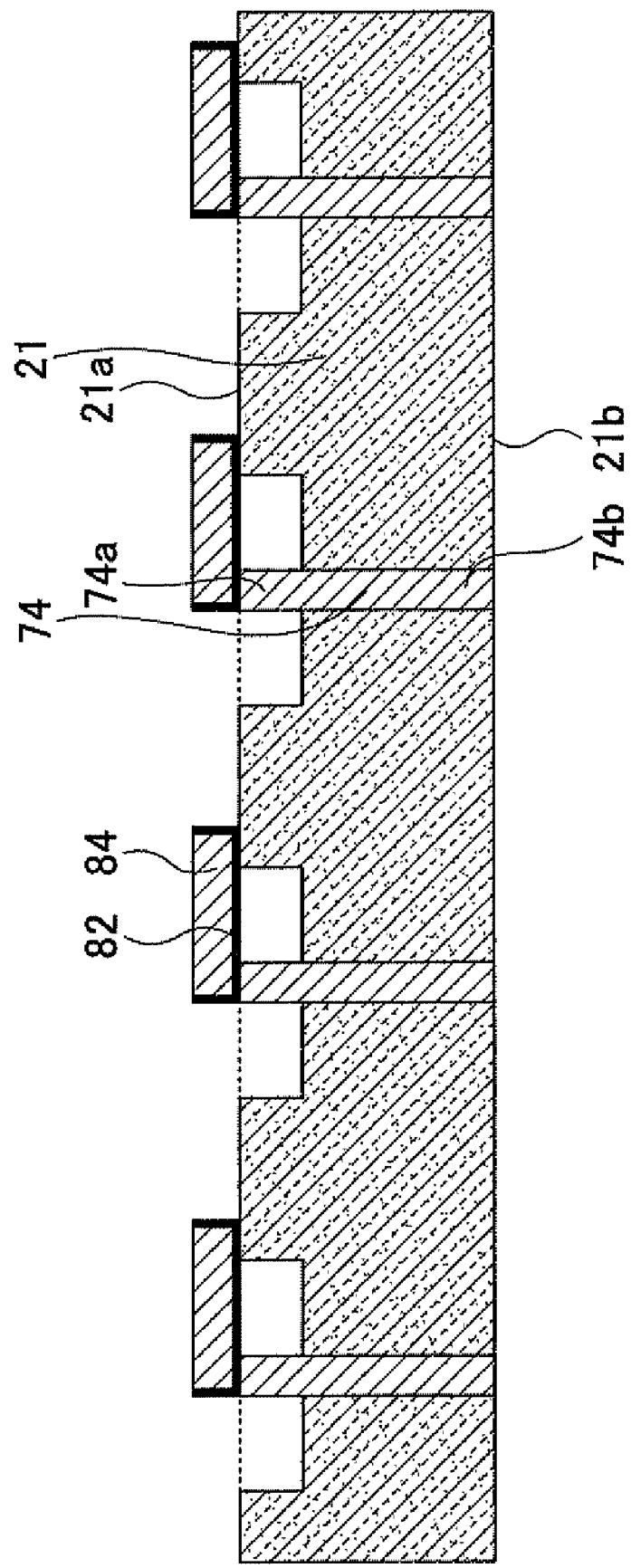
FIG. 48 is a cross-sectional view illustrating a twelfth step of the manufacturing process of the semiconductor package illustrated in FIG. 36.
Figure 49:
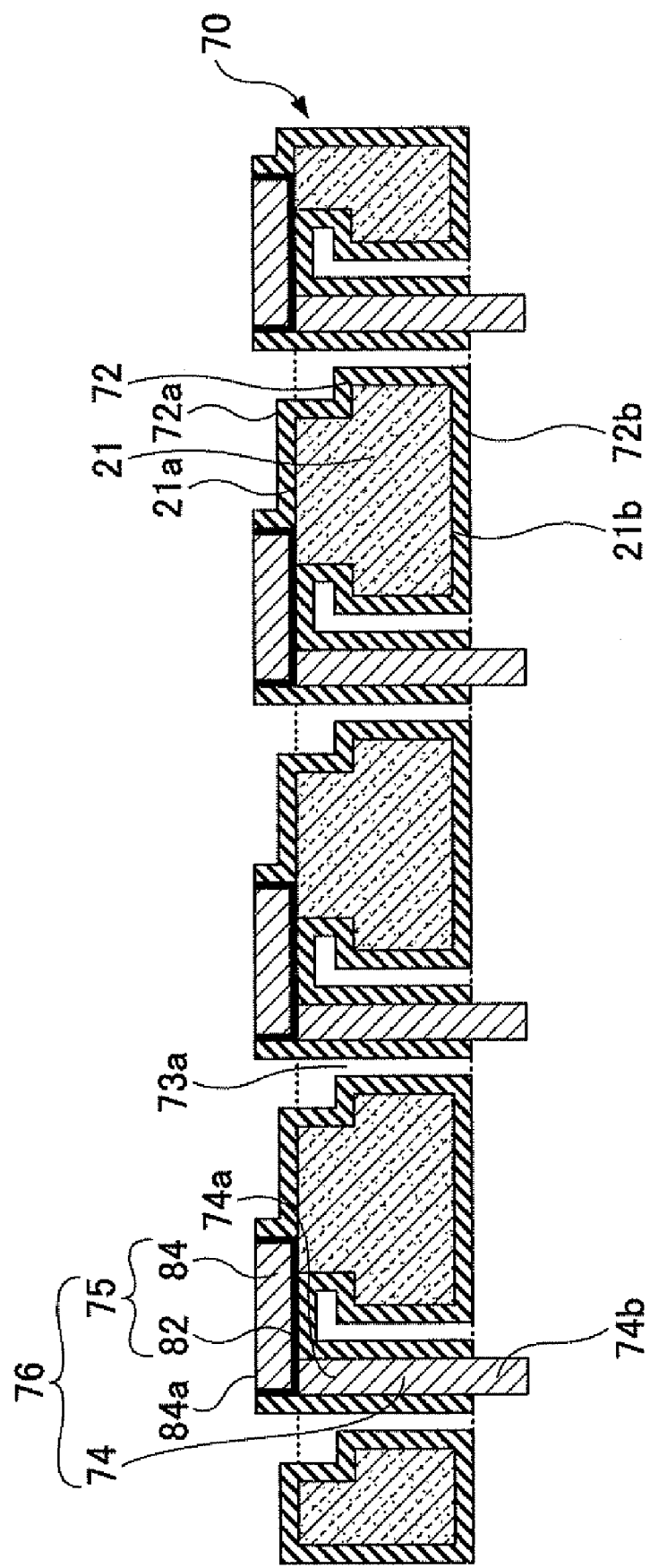
FIG. 49 is a cross-sectional view illustrating a thirteenth step of the manufacturing process of the semiconductor package illustrated in FIG. 36.

Subsequently, in a twelfth step of manufacturing process illustrated in FIG. 48, the resist film 71 and the resist film 85 are removed. Then, performing steps similar to the steps illustrated in FIG. 31 through FIG. 35, a structure illustrated in FIG. 49 is formed.

Subsequently, in a step similar to the step illustrated in FIG. 17, the connection terminal 27 is formed on the end 74b of the penetration part 74. It is desirable to form a small gap between the connection terminal 27 and the surface 72b of the insulation film 72 so that connection terminal 27 does not contact the insulation film 72. Thereby, the connection terminal can be movably supported by the support part 75 through the penetration part 74 in the Y-Y direction and the X-X direction.

The semiconductor package 12 according to the present embodiment provides the same effects as the semiconductor package 10 according to the first embodiment of the present invention.

Fourth Embodiment

Figure 50:
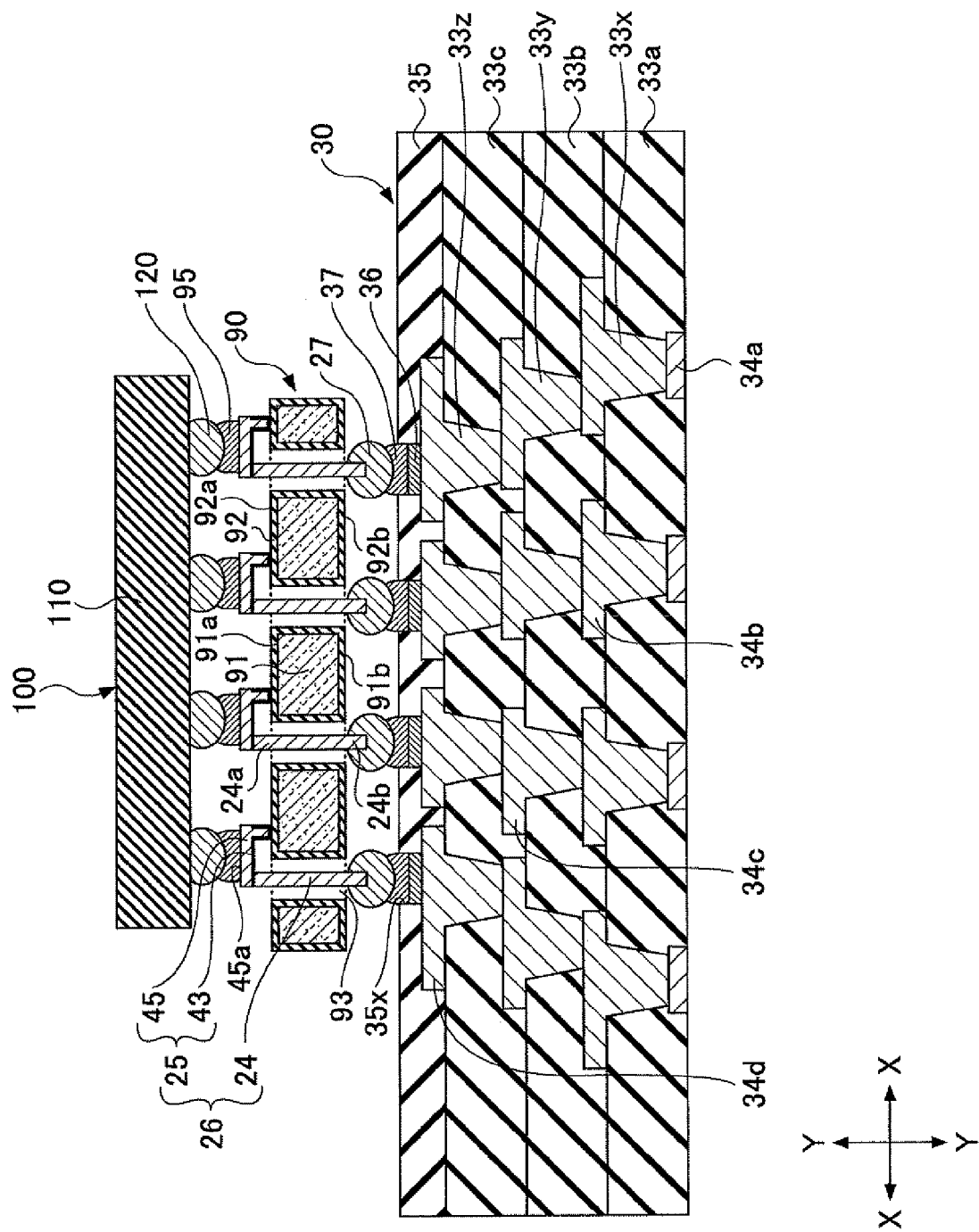
FIG. 50 is a cross-sectional view of a semiconductor package according to a fourth embodiment of the present invention.

A description will be given first of a structure of a semiconductor package according to a fourth embodiment of the present invention. FIG. 50 is a cross-sectional view of the semiconductor package according to the fourth embodiment of the present invention. In FIG. 50, parts that are the same as the parts illustrated in FIG. 2 are given the same reference numerals, and descriptions thereof will be omitted. In FIG. 50, the X-X direction indicates a direction parallel to a top surface 91a of a semiconductor chip 91, and the Y-Y direction indicates a direction perpendicular to the X-X direction.

With reference to FIG. 50, the semiconductor package 13 according to the fourth embodiment of the present invention includes an interposer 90, a semiconductor device 100 and the wiring board 30. The semiconductor device 100 includes a semiconductor chip 110 and connection terminals 120.

The semiconductor chip 110 is provided with a semiconductor integrated circuit (not illustrated in the figure). The semiconductor integrated circuit is formed by a diffusion layer (not illustrated in the figure), an insulation layer (not illustrated in the figure), vias (not illustrated in the figure), a wiring layer (not illustrated in the figure), etc. For example, silicon can be used as a material of the semiconductor chip 110. The thickness of the semiconductor chip 110 can be set to, for example, 300 μm.

The connection terminals 120 are provided for electrically connecting the semiconductor device 100 to the interposer 90. Solder balls, gold (Au) bumps, a conductive paste, etc., may be used as the connection terminals 120. If a solder ball is used as the connection terminal 120, for example, an alloy containing Pb, an alloy of Sn and Cu, an alloy of Sn and Ag, an alloy of Sn, Ag and Cu, etc., may be used as the material of the connection terminal 120.

The interposer 90 includes a substrate 91, an insulation film 92, penetration electrodes 26 and connection terminals 27. The substrate 91 can be formed of silicon, a resin (for example, an insulation resin), a metal (for example, Cu), etc. The thickness of the substrate 91 can be set to, for example, 300 μm. The substrate 91 is a plate-like material, and has a plurality of penetration holes 93. An insulation film 92 is formed on the surface of the substrate 91. The insulation film 92 covers the entire surface of the substrate 91 including inner surfaces of the penetration holes 93. The insulation film 92 insulates between the substrate 91 and each of the penetration electrodes 26. An oxide film (for example, a thermally-oxidized film) may be used as the insulation film 92. If a thermally-oxidized film is used as the insulation film 92, the thickness of the insulation film 92 can be set to, for example, 0.5 μm to 1.0 μm. If an insulation resin is used as the material of the substrate 91, there is no need to provide the insulation film 92 in the structure illustrated in FIG. 50.

The penetration holes 93 penetrate through the substrate 91 and the insulation film 92. Each of the penetration holes 93 has a circular shape in a pan view, and a diameter of each of the penetration holes 93 can be set to, for example, 50 μm. The pitch of the penetration holes 93 can be set to, for example, 100 μm, but not limited to 100 μm and other pitches are selectable.

Each of the penetration electrodes 26 includes a penetration part 24 and a support part 25. The penetration part 24 is formed of an electrically conductive material, and arranged in the penetration hole 93 so that the penetration part 24 does not contact with the substrate 91 and the insulation film 92. One end 24a of the penetration part 24 protrudes from a surface 92a of the insulation film 92 provided on an upper surface 91a of the substrate 91.

The end 24a of the penetration part 24 is integrally formed with the support part 25. The other end 24b of the penetration part 24 protrudes from a surface 92b of the insulation film 92 provided on a lower surface 91b of the substrate 91. The penetration part 24 has a circular shape in a plan view, and a diameter of the penetration part 24 can be set to, for example, 30 μm.

The support part 25 constituting the penetration electrode 26 includes a seed layer 43 and a plated film 45. The seed layer 43 is formed of an electrically conductive material. One end of the support part 25 is integrally formed with the end 24a of the penetration part 24, and the other end of the support part 25 is fixed to the upper surface 91a of the substrate 91 via the insulation film 92.

The support part 25 has a spring characteristic in order to movably support the entire penetration part 24 in the Y-Y direction and movably support the end 24b of the penetration part 24 in the X-X direction. A portion of the support part 25 contacting with the surface 92a of the insulation film 92 has a circular shape in a plan view, and a diameter of the portion of the support part 25 can be set to, for example, 30 μm.

It is desirable to form the penetration electrode 26, which is formed by the penetration part 24 and the support part 25, by an electrically conductive material such as copper (Cu) and a brass (Cu—Zn alloy). If the penetration part 24 is formed of copper (Cu) and the support part 25 is formed of a brass (Cu—Zn alloy), a spring characteristic can be given to the penetration electrode 26 and the penetration electrode 26 can be easily formed by using a plating method.

The connection terminal 27 is formed on the end 24b of the penetration part 24. The connection terminal 27 is not fixed to the surface 92b of the insulation film 92. Although the connection terminal 27 can be brought into contact with the surface 92b of the insulation film 92, it is desirable to form a small gap (for example, about 50 μm) between the connection terminal 27 and the insulation film 92 so that the connection terminal 27 does not contact the insulation film 92. The connection terminal 27 is supported by the support part 25 through the penetration part 24. The penetration part 24 and the connection terminal 27 are electrically connected with each other.

The connection terminal 27 is provided to electrically connect the semiconductor device 100 to the wiring board 30. A terminal material such as a solder bump, a gold (Au) bump, a conductive paste or the like may be used to form the connection terminal 27. If a solder ball is selected as a material of the connection terminal 27, an alloy containing Pb, an alloy of Sn and Cu, an alloy of Sn and Ag, an alloy of Sn, Ag and Cu, etc., may be used.

A structure of the wiring board 30 is the same as the wiring board of the semiconductor package 10 according to the first embodiment, and a description thereof will be omitted. A pre-solder 95 is formed on an upper surface 25a of the support part 25 by applying a solder paste or the like. The pre-solder 95 of the interposer 90 and the connection terminal 120 of the semiconductor device 100 are electrically connected with each other. If the connection terminal 120 is formed of a solder, the connection terminal 120 and the pre-solder 95 are heated, when the semiconductor device 100 is mounted on the interposer 90, which results in formation of a bump by the connection terminal 120 and the pre-solder 95 being melted and formed into an alloy.

As mentioned above, the electrode terminal 120 of the semiconductor device 100 is mechanically and electrically connected to the pre-solder 37 of the wiring board 30 via the pre-solder 95 and the penetration electrode 26 of the interposer 90 and the connection terminal 27. The support part 25 has a spring characteristic and movably supports the entire penetration part 24 in the Y-Y direction and movably supports the end 24b of the penetration part 24 in the X-X direction, and the end 24b of the penetration part 24 is formed with the connection terminal 27. Additionally, the connection terminal 27 is not fixed to the surface 92b of the insulation layer 92. That is, the connection terminal 27 is movably supported in the Y-Y direction and X-X direction by the support part 25 through the penetration part 24.

Here, considering a case where heat is applied to the semiconductor package 13, a stress may be generated in the joining part (the electrode terminal 120, the pre-solder 95, the penetration electrode 26, the connection terminal 27 and the pre-solder 37) because a difference in thermal expansion coefficient exists between the semiconductor device 100 and the wiring board 30. However, because the connection terminal 27 is supported by the support part 25 in the movable state in the Y-Y direction and the X-X direction, the stress generated in the joining part (the electrode terminal 120, the pre-solder 95, the penetration electrode 26, the connection terminal 27 and the pre-solder 37) can be reduced greatly. Thus, the joining part is prevented from cracking.

The interposer 90 of the semiconductor package 13 according to the present embodiment can be manufactured by a manufacturing method similar to the manufacturing method of one of the semiconductor devices 20, 50 and 70 according to the first through third embodiments.

According to the semiconductor package 13 of the present embodiment, the penetration electrode 26 and the connection terminal 27 are provided in the interposer 90, and the connection terminal 27 is movably supported by the support part 25 through the penetration part 24 of the penetration electrode 26 in the Y-Y direction and the X-X direction. Additionally, the semiconductor device 100 is connected to the wiring board via the penetration electrode 26 of the interposer and the connection terminal 27. As a result, even if heat is applied to the semiconductor package 13, a stress generated in the joining part (the electrode terminal 120, the pre-solder 95, the connection terminal 27 and the pre-solder 37) due to a difference in thermal expansion coefficients between the semiconductor device 100 and the wiring board 30 is reduced greatly. Thus, the joining part is prevented from cracking.

Especially, the present embodiment is effective when it is difficult to directly form the penetration electrode 26 in the semiconductor device 100.

Fifth Embodiment

A description will now be given of a semiconductor package according to a fifth embodiment of the present invention.

The semiconductor package according to the fifth embodiment has the same structure as one of the semiconductor packages according to the first through fourth embodiments except that the penetration electrode has a different configuration. Thus, a description is focused on the penetration electrode, and descriptions of other parts of the semiconductor package will be omitted.

Figure 51A:
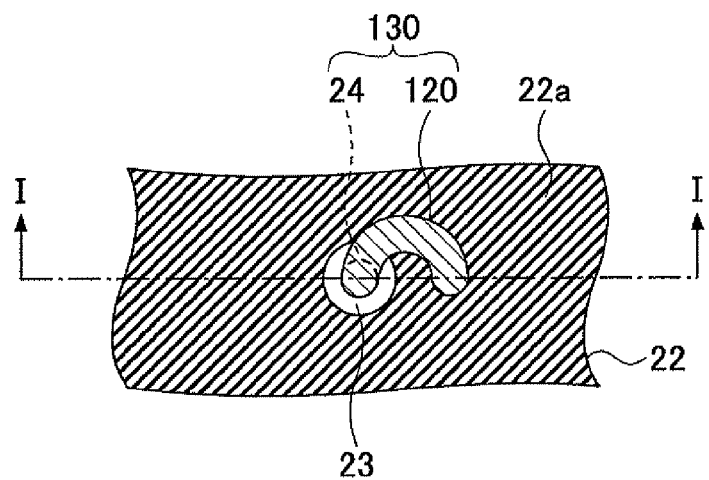
FIG. 51A is a plan view of a portion of a semiconductor package where a first example of the penetration electrode is formed.
Figure 51B:
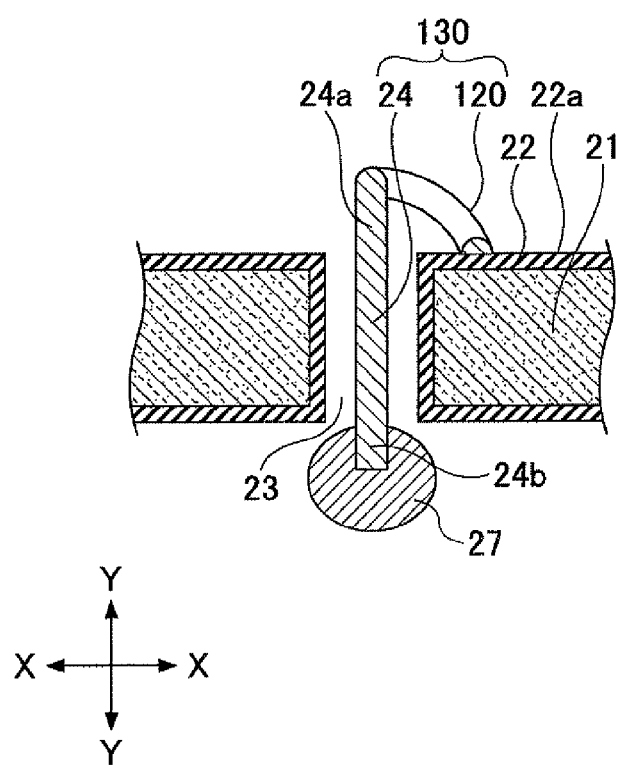
FIG. 51B is a cross-sectional view taken along a line I-I of FIG. 51A.

FIGS. 51A and 51B illustrate a first example of the penetration electrode provided in the semiconductor package according to the fifth embodiment. FIG. 51A is a plan view of a portion of the semiconductor package where the first example of the penetration electrode is formed. FIG. 51B is a cross-sectional view taken along a line I-I of FIG. 51A. The penetration electrode 130 of the first example includes the penetration part 24 and a support part 120. The support part 120 is configured to be in a spiral form and is integrally formed with the penetration part 24. The support part 120 is formed of an electrically conductive material such as, for example, a brass (Cu—Zn alloy), and has a spring characteristic.

Figure 52A:
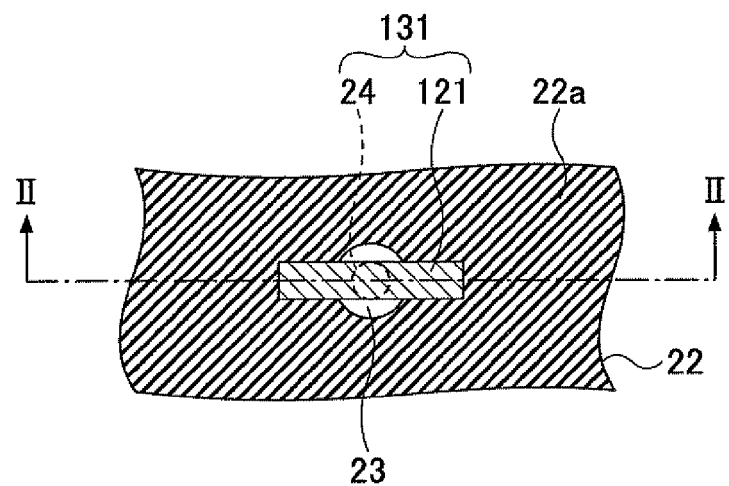
FIG. 52A is a plan view of a portion of a semiconductor package where a second example of the penetration electrode is formed.
Figure 52B:
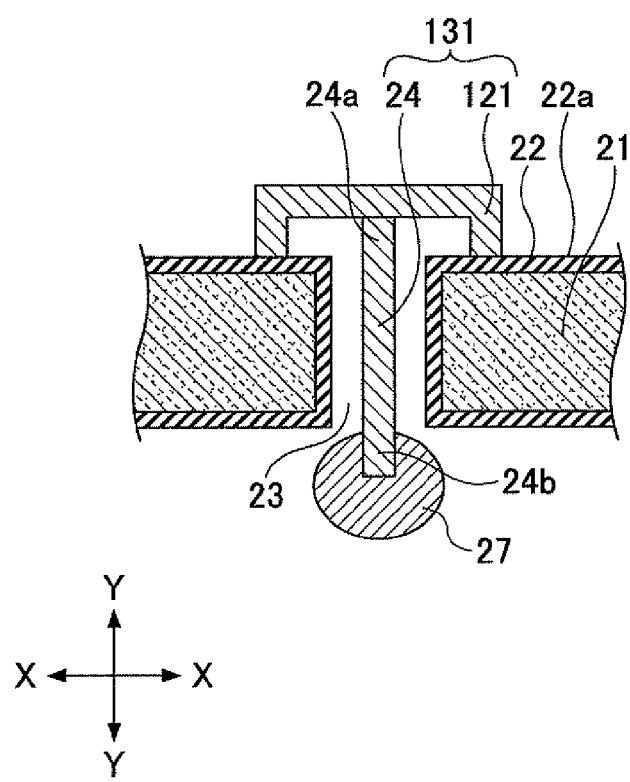
FIG. 52B is a cross-sectional view taken along a line II-II of FIG. 52A.

FIGS. 52A and 52B illustrate a second example of the penetration electrode provided in the semiconductor package according to the fifth embodiment. FIG. 52A is a plan view of a portion of the semiconductor package where the second example of the penetration electrode is formed. FIG. 52B is a cross-sectional view taken along a line II-II of FIG. 52A. The penetration electrode 131 of the second example includes the penetration part 24 and a support part 121. The support part 121 is connected to the penetration part 24 at the middle thereof. Opposite ends of the support part 121 are fixed to the upper surface 21a of the semiconductor chip 21 via the surface 22a of the insulation film 22. The support part 121 is formed of an electrically conductive material such as, for example, a brass (Cu—Zn alloy), and has a spring characteristic.

Figure 53A:
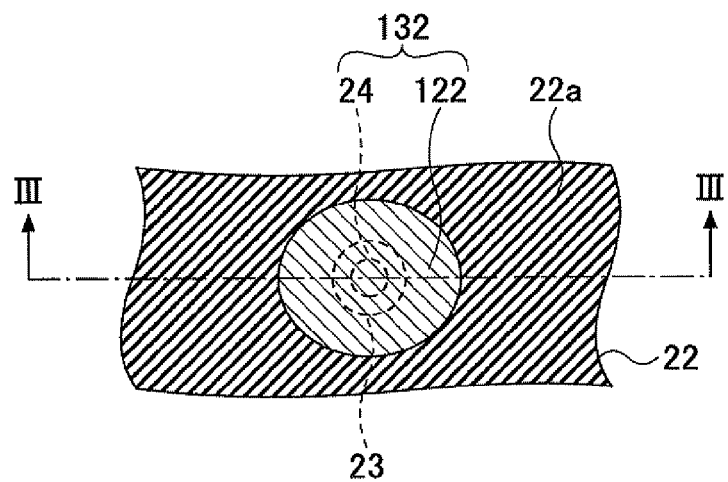
FIG. 53A is a plan view of a portion of a semiconductor package where a third example of the penetration electrode is formed.
Figure 53B:
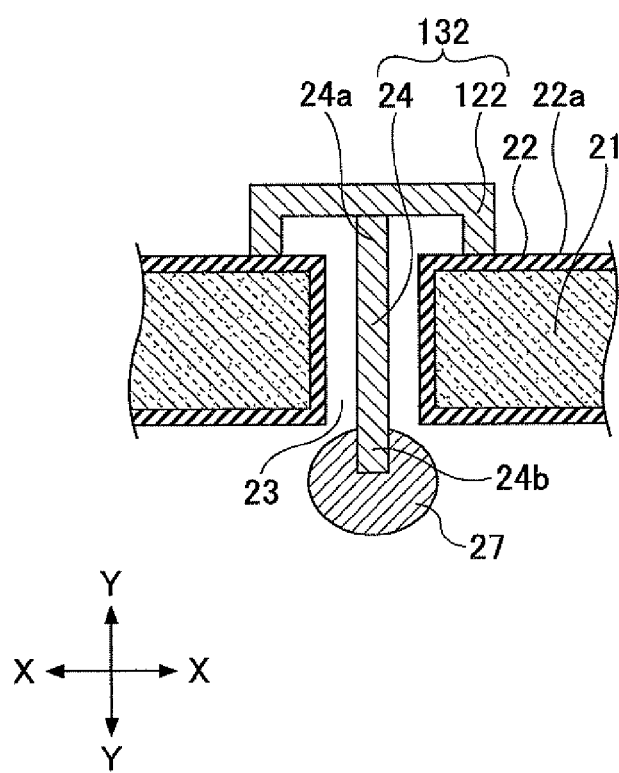
FIG. 53B is a cross-sectional view taken along a line III-III of FIG. 53A.

FIGS. 53A and 53B illustrate a third example of the penetration electrode provided in the semiconductor package according to the fifth embodiment. FIG. 53A is a plan view of a portion of the semiconductor package where the third example of the penetration electrode is formed. FIG. 53B is a cross-sectional view taken along a line III-III of FIG. 53A. The penetration electrode 132 of the second example includes the penetration part 24 and a support part 122. The support part 122 has a generally circular shape and the peripheral portion of the support part 122 extends toward the upper surface 21a of the semiconductor chip 21. The support part 122 is connected to the penetration part 24 at the center thereof. The peripheral portion of the support part 122 is fixed to the upper surface 21a of the semiconductor device 21. The support part 122 is formed of an electrically conductive material such as, for example, copper (Cu), and has a spring characteristic.

As appreciated from the above, the penetration electrode can be any shape and configuration if the penetration electrode has a spring characteristic and the entire penetration part 24 can be supported movably in the Y-Y direction and the end 24b of the penetration part 24 is supported movably in the X-X direction. The penetration electrode according to the fifth embodiment can be manufactured in a similar manner as the penetration electrodes according to the first through third embodiments.

The semiconductor package according to the present embodiment can provide the same effects as the semiconductor package according to the first embodiment of the present invention.

First Variation of Second Embodiment

Figure 54:
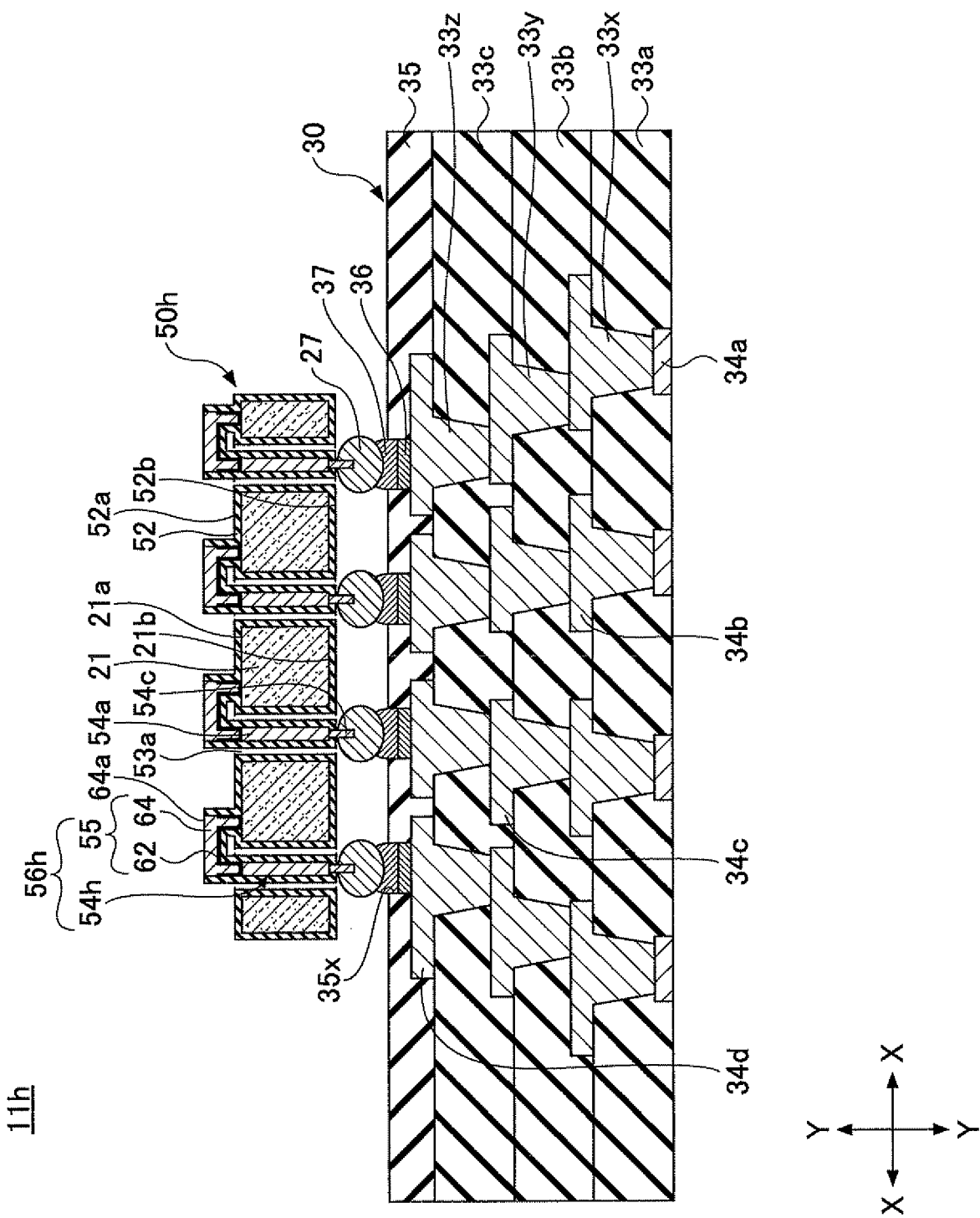
FIG. 54 is a cross-sectional view of a semiconductor package according to a first variation of the second embodiment of the present invention.

A description will be given below of a first variation of the semiconductor package according to the second embodiment. FIG. 54 is a cross-sectional view of a semiconductor package according to a first variation of the second embodiment of the present invention. In FIG. 54, parts that are the same as the parts illustrated in FIG. 20 are given the same reference numerals, and descriptions thereof will be omitted. In FIG. 54, the X-X direction is parallel to the upper surface 21a of the semiconductor chip 21 and the Y-Y direction is perpendicular to the X-X direction.

With reference to FIG. 54, the semiconductor package 11h according to the first variation of the second embodiment of the present invention has the same structure as the semiconductor package 11 illustrated in FIG. 20 except that the semiconductor device 50 is replaced by a semiconductor device 50h. The semiconductor device 50h has the same structure as the semiconductor device 50 illustrated in FIG. 54 except that the penetration electrode 56 is replaced by a penetration electrode 56h, the penetration part 54 is replaced by a penetration part 54h, and the end 54b is replaced by an end 54c. In the penetration part 54h, one end 54a is different from the other end 54c in their diameters, that is, the diameter of the end 54c is smaller than the end 54b. Other parts of the semiconductor package 11h are the same as the parts of the semiconductor package 11, and descriptions thereof will be omitted.

A description will be given below, of a manufacturing method of the semiconductor package according to the first variation of the second embodiment. FIG. 55 through FIG. 61 are cross-sectional views for explaining the manufacturing method of the semiconductor package according to the first variation of the second embodiment. In FIG. 55 through FIG. 61, parts that are the same as the parts illustrated in FIG. 21 through FIG. 35 are given the same reference numerals, and descriptions thereof may be omitted. Because the manufacturing method of parts other than the semiconductor device 50h is the same as the manufacturing method of the semiconductor package according to the first embodiment, a description will be focused on the manufacturing method of the semiconductor device 50h.

Figure 55:
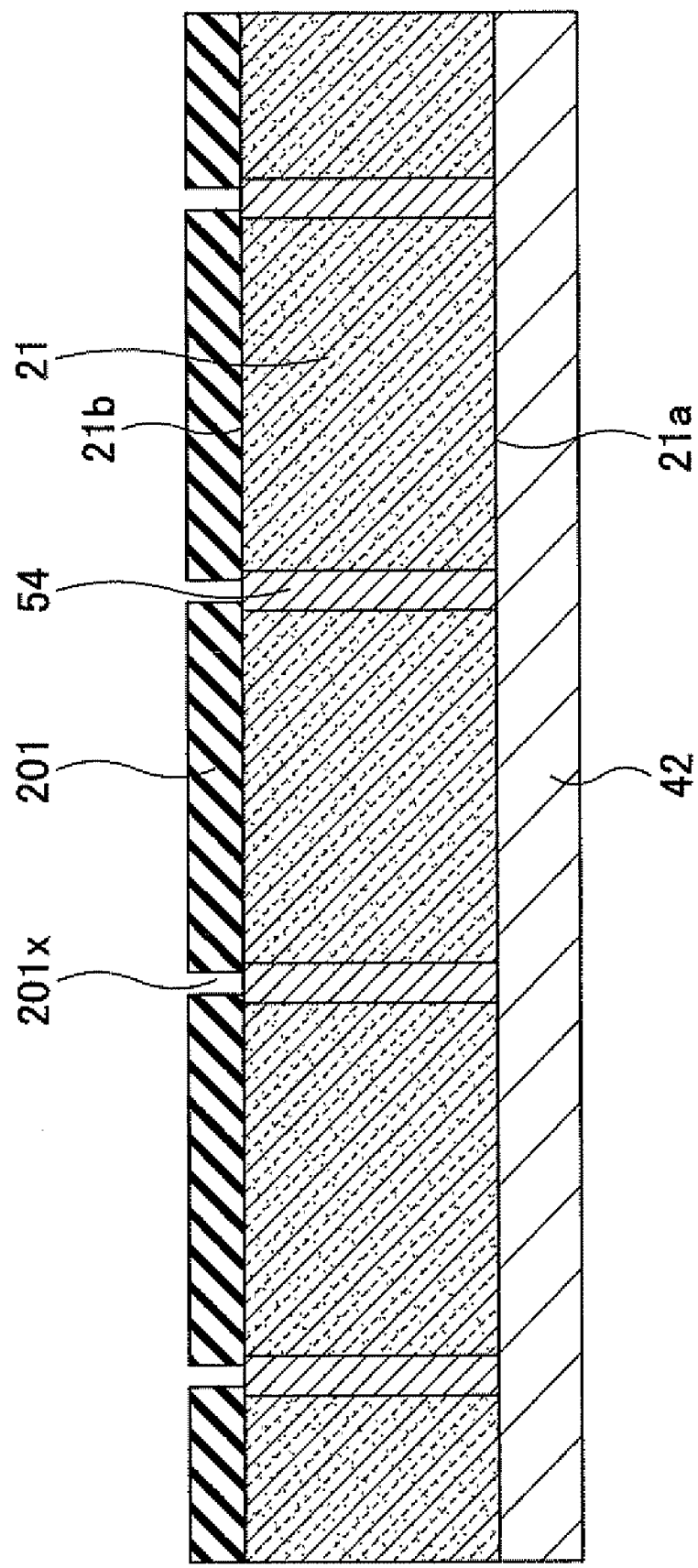
FIG. 55 is a cross-sectional view illustrating a first step of a manufacturing method of the semiconductor package illustrated in FIG. 54.

After performing the same process as illustrated in FIG. 21 and FIG. 22, openings 201x are formed in a resist film 201, in a first step as illustrated in FIG. 55, by forming the resist film 201 to cover the lower surface 21b of the semiconductor chip 21, exposing the resist film 201 though a mask, and developing the exposed resist film 201. The resist film 201 can be formed by applying a liquid resist onto the lower surface 21b of the semiconductor chip 21. The thickness of the resist film 21 can be set to, for example, 20 µm. Each opening 201x is formed so that a portion of the upper surface of the penetration part 54 is exposed. The opening 201x has a circular shape in a plan view, and the diameter thereof can be set to, for example, 20 µm.

Figure 56:
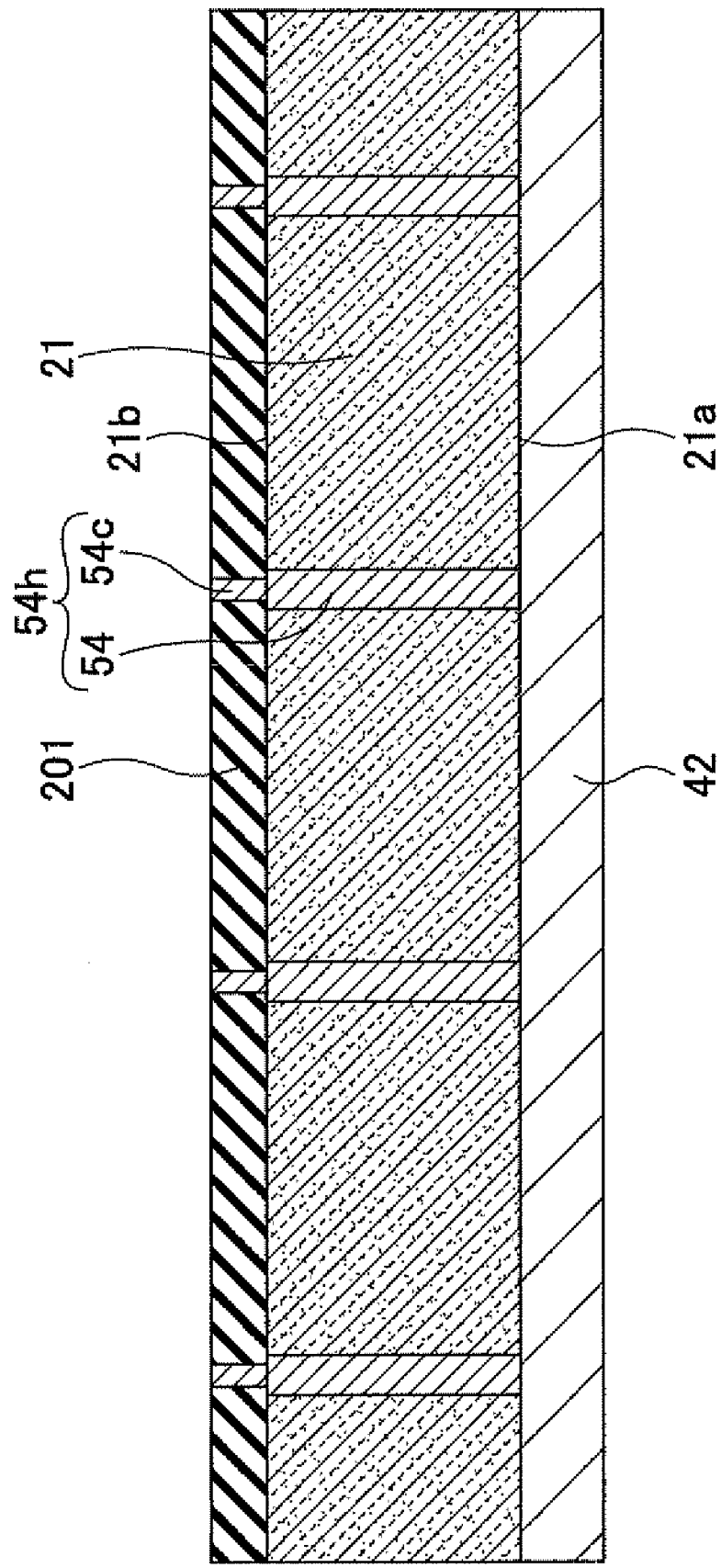
FIG. 56 is a cross-sectional view illustrating a second step of the manufacturing method of the semiconductor package illustrated in FIG. 54.

Subsequently, in a second step illustrated in FIG. 56, the end 54c is formed at the end of the penetration part by depositing a plated film to fill the opening 201x by an electrolytic plating method using the metal layer 42 as a power supply layer. The plated film to form the end 54c can be, for example, a copper (Cu) plated film. The penetration part 54 having the end 54c corresponds to the penetration part 54h. Then, similar to the step illustrated in FIG. 10, the metal plate 42 is removed from the structure illustrated in FIG. 56.

Figure 57:
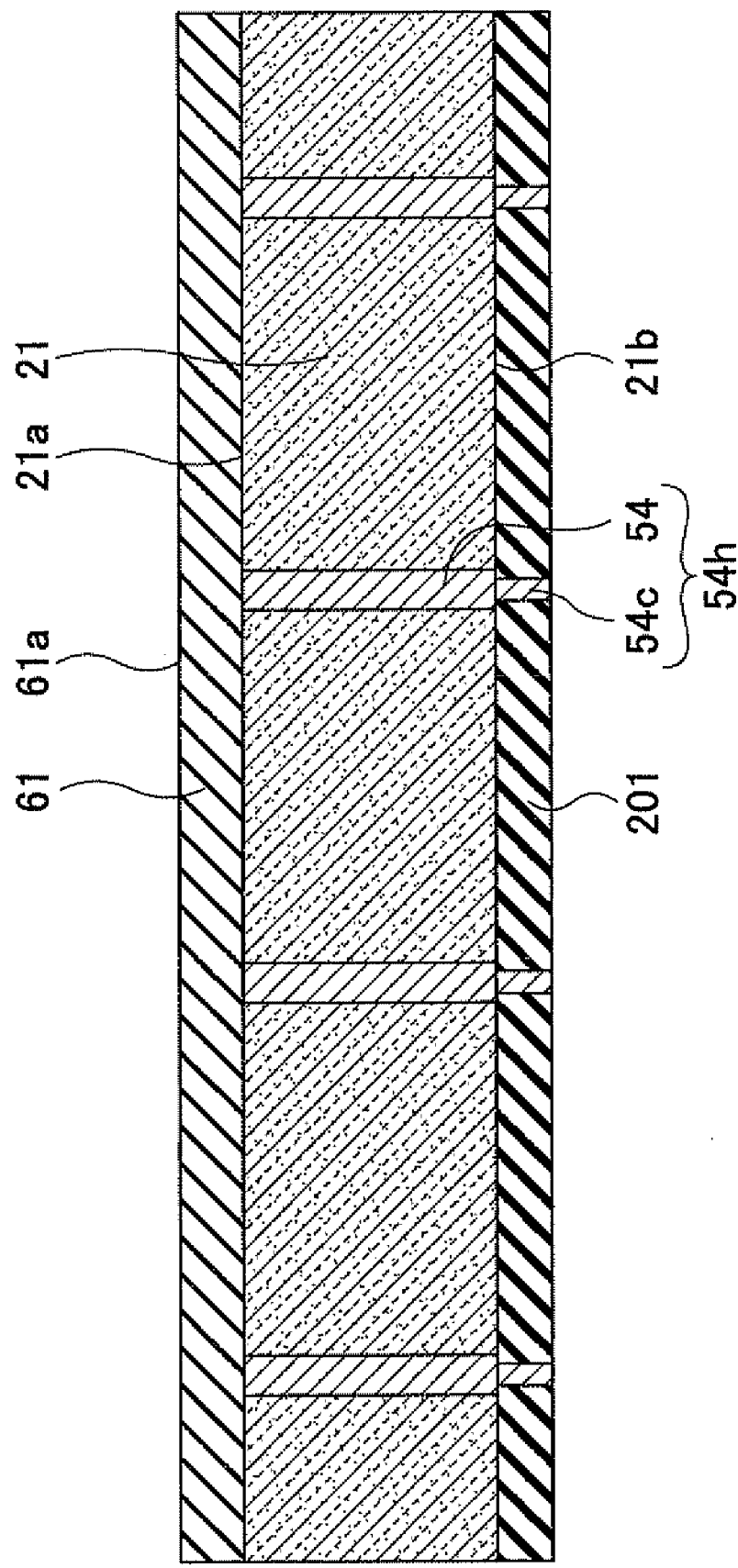
FIG. 57 is a cross-sectional view illustrating a third step of the manufacturing method of the semiconductor package illustrated in FIG. 54.

Subsequently, in a third step illustrated in FIG. 57, a resist film 61 is formed to cover the upper surface 21a of the semiconductor chip 21. The resist film 61 can be formed by applying a liquid resist onto the upper surface 21a of the semiconductor chip 21. The thickness of the resist film 61 can be set to, for example, 20 µm.

Subsequently, a process similar to the process of FIG. 24 through 28 is performed, and, thereafter, portions of the seed layer 62, which portions are not covered by the plated film 64, are removed by, for example, etching. Then, in a fifth step illustrated in FIG. 59, the resist film 61 formed on the upper surface 21a of the semiconductor chip 21 and the resist film 201 formed on the lower surface 21b of the semiconductor chip 21 are removed. Thereby, the penetration electrode 56h having the seed layer 62 and the plated film 64 is formed.

Figure 31:
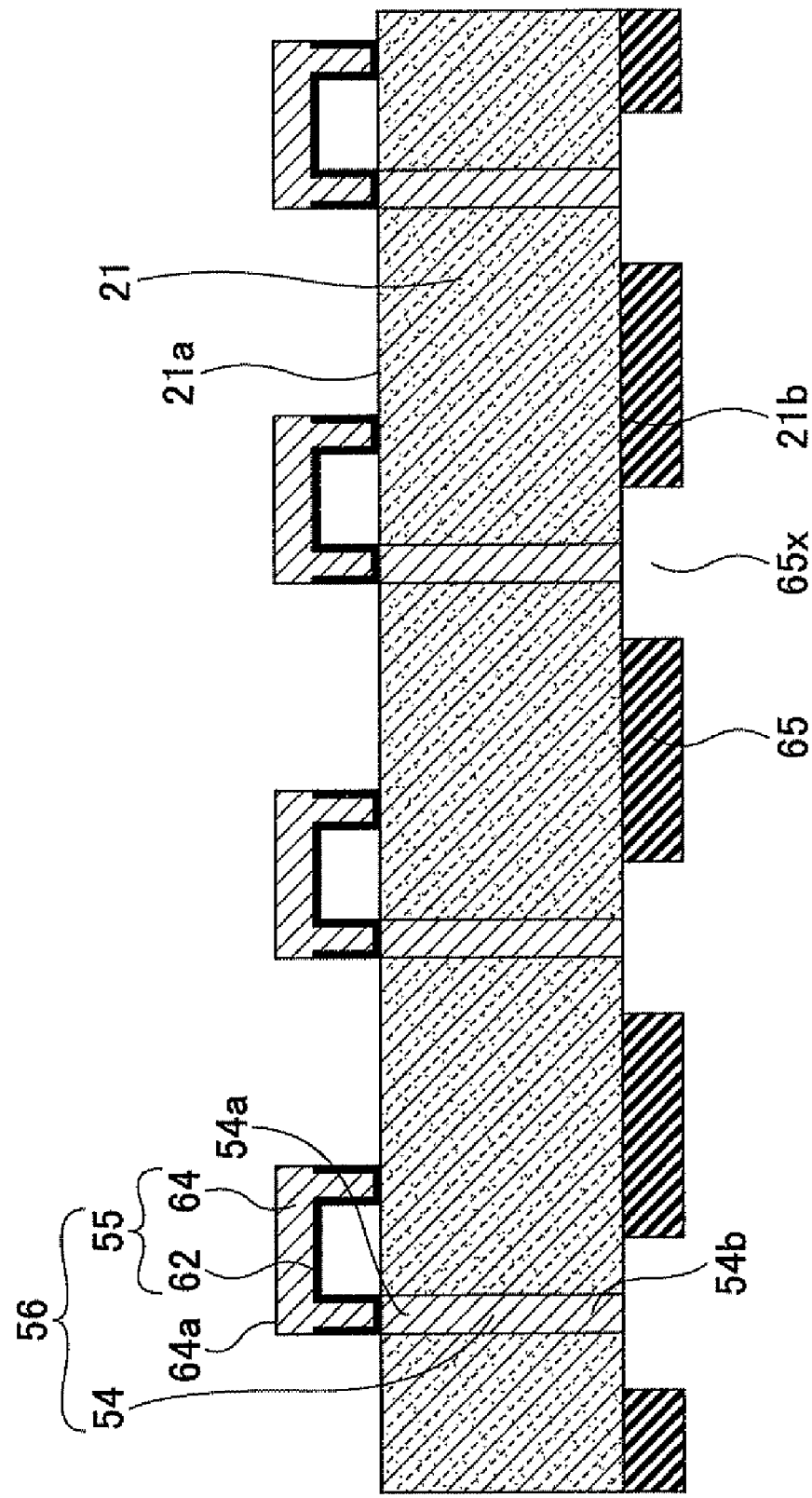
FIG. 31 is a cross-sectional view illustrating an eleventh step of the manufacturing process of the semiconductor package illustrated in FIG. 20.

Subsequently, a process similar to the process illustrated in FIG. 31 is performed, and, thereafter, in a fifth step illustrated in FIG. 59, a space 66 is formed around the penetration part 54h to expose the entire side surface of the penetration part 54h, which results in formation of the penetration hole 53a. The space 66 can be formed by an anisotropic etching method such as, for example, a dry etching. The space 66 has a circular shape in plan view. The outer diameter of the space 66 (the diameter of the penetration hole 53a) can be set to, for example, 50 µm, and the inner diameter of the space 66 can be set to, for example, 30 µm. After forming the space 66, the resist film 65 is removed. Thereby, the penetration part 54h can penetrate through the semiconductor chip 21 without being brought into contact with the semiconductor chip 21.

Figure 34:
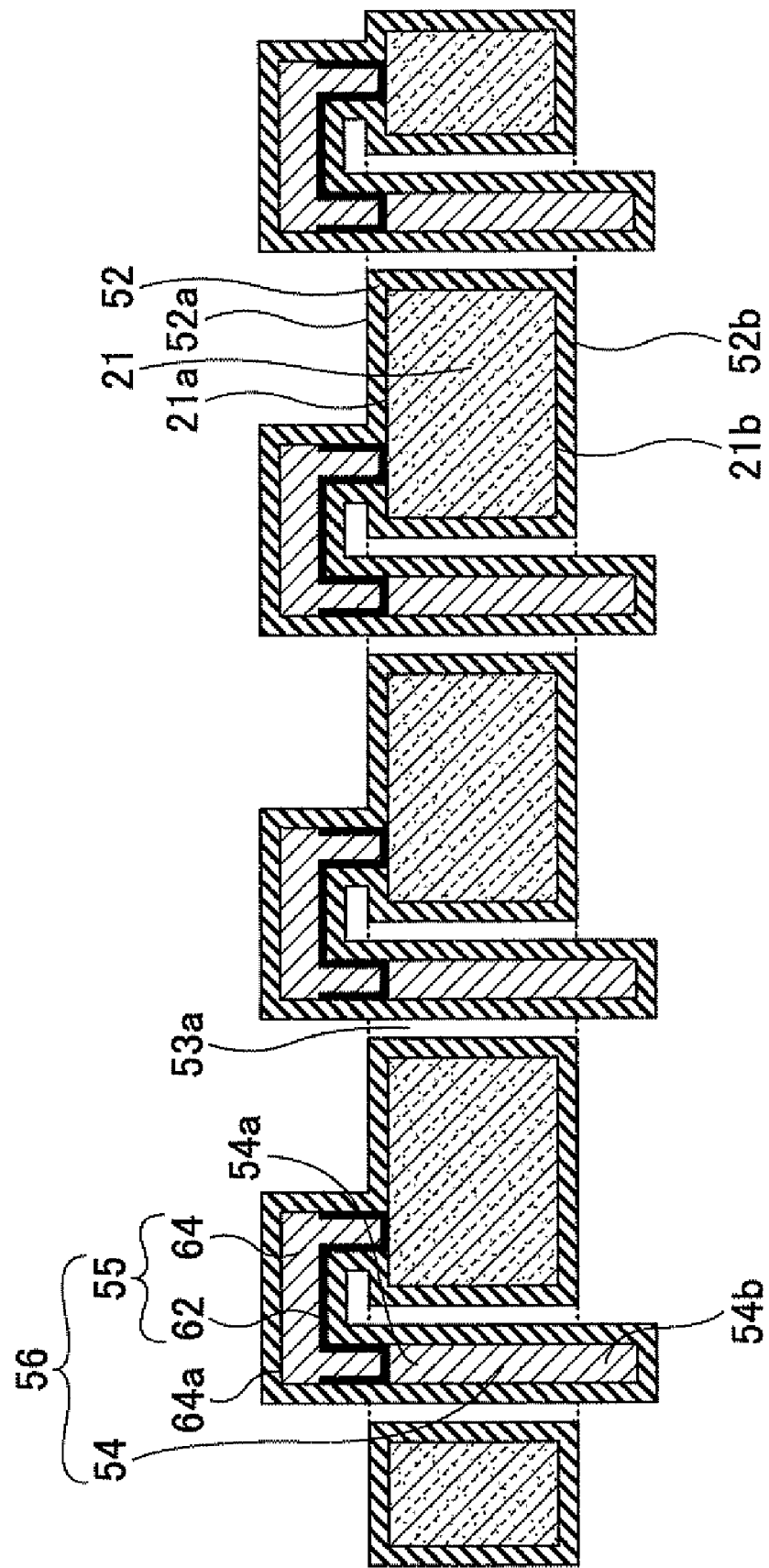
FIG. 34 is a cross-sectional view illustrating a fourteenth step of the manufacturing process of the semiconductor package illustrated in FIG. 20.
Figure 61:
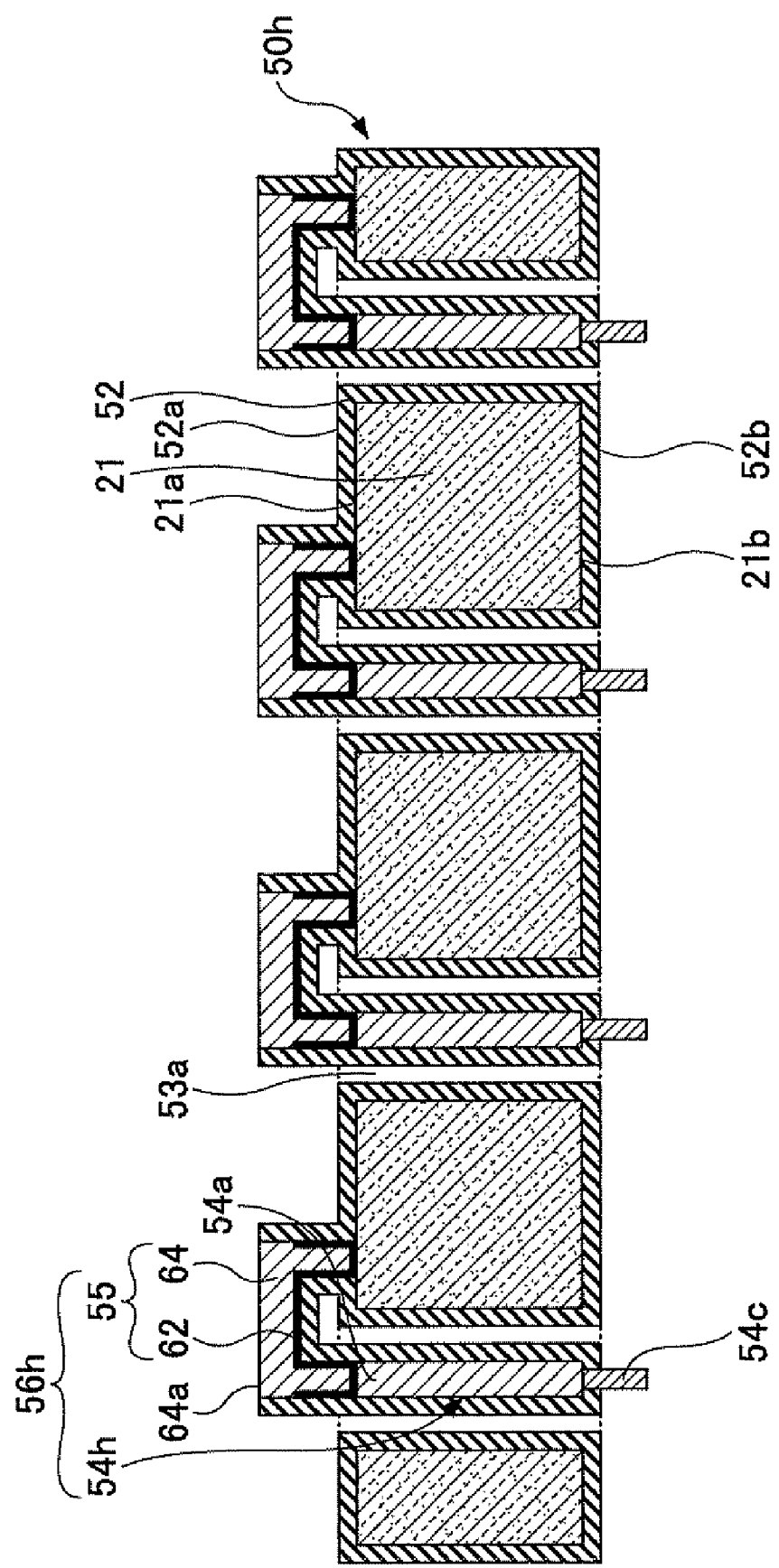
FIG. 61 is a cross-sectional view illustrating a seventh step of the manufacturing method of the semiconductor package illustrated in FIG. 54.

Subsequently, after performing a process similar to the process illustrated in FIG. 34, in a seventh step illustrated in FIG. 61, portions of the insulation film 52, which portions are formed on the end 54c of the penetration part 54h and the upper surface 64a of the plated film 64 forming the support part 55, are removed. The portions of the insulation film 52 can be removed by an anisotropic etching method such as dry etching after forming a resist film, which opens the portions of the insulation film 52 to be removed.

Subsequently, in a process similar to the process illustrated in FIG. 17, the connection terminal 27 is formed on the end 54c of the penetration part 54h. It is desirable to form a gap between the connection part 27 and the surface 52b of the insulation film 52 so that the connection terminal 27 does not contact the insulation film 52. Thereby, the connection terminal 27 can be movably supported by the support part 55 through the penetration part 54h in the Y-Y direction and X-X direction.

The semiconductor package 11h according to the first variation of the second embodiment of the present invention can provide the same effects as the semiconductor device 10 according to the first embodiment of the present invention.

Second Variation of Second Embodiment

Figure 62:
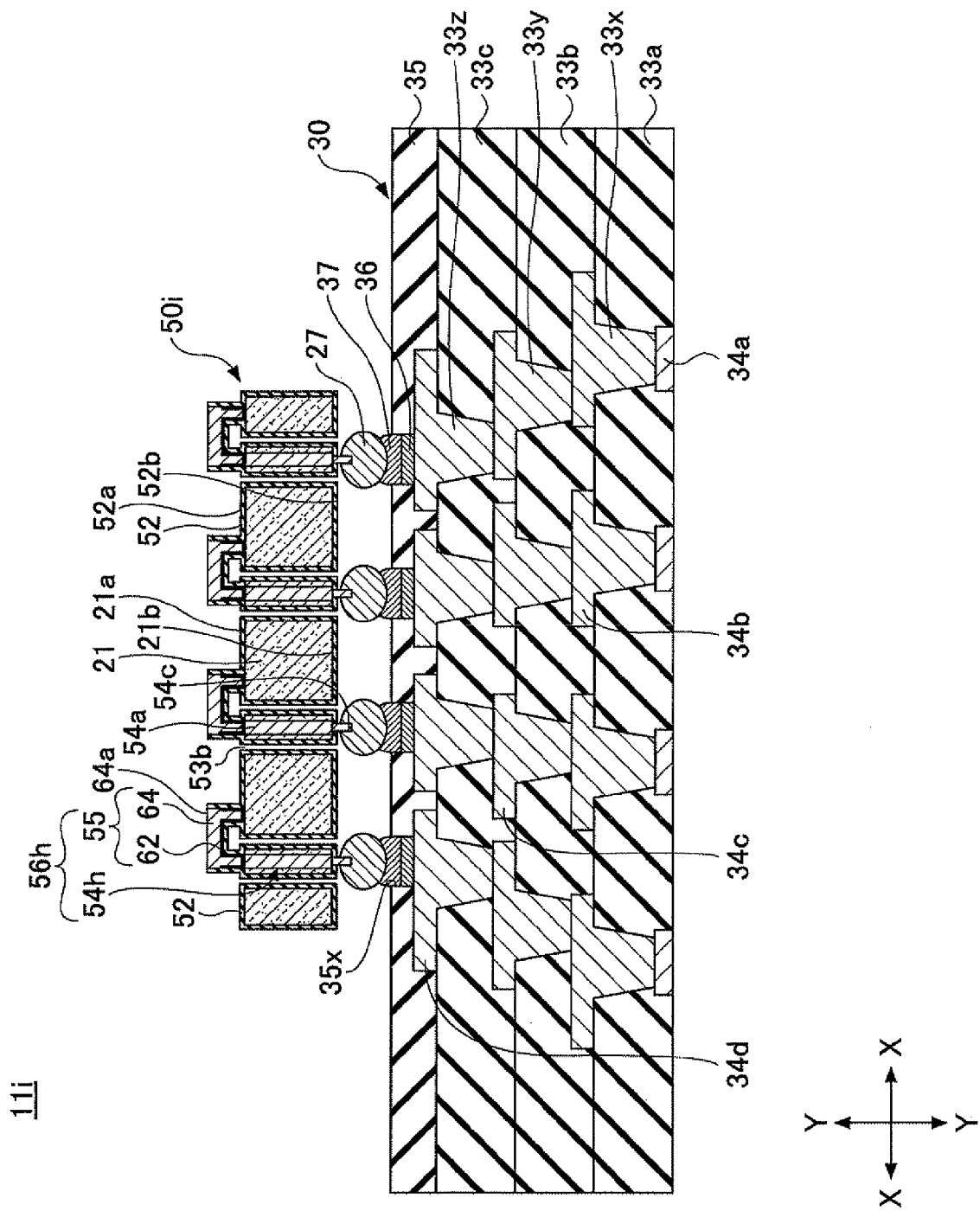
FIG. 62 is a cross-sectional view of a semiconductor package according to a second variation of the second embodiment of the present invention.

A description will be given below of a second variation of the semiconductor package according to the second embodiment. FIG. 62 is a cross-sectional view of a semiconductor package according to a second variation of the second embodiment of the present invention. In FIG. 62, parts that are the same as the parts illustrated in FIG. 54 are given the same reference numerals, and descriptions thereof will be omitted. In FIG. 62, the X-X direction is parallel to the upper surface 21a of the semiconductor chip 21 and the Y-Y direction is perpendicular to the X-X direction.

With reference to FIG. 62, the semiconductor package 11i according to the second variation of the second embodiment of the present invention has the same structure as the semiconductor package 11h illustrated in FIG. 54 except that the semiconductor device 50h is replaced by a semiconductor device 50i. The semiconductor device 50i has the same structure as the semiconductor device 50h illustrated in FIG. 54 except that the entire side surface of the penetration part 54h arranged in a through hole 53b is covered by silicon forming the semiconductor chip 21. Other parts of the semiconductor package 11*i* are the same as the parts of the semiconductor package 11*h*, and descriptions thereof will be omitted.

Figure 63:
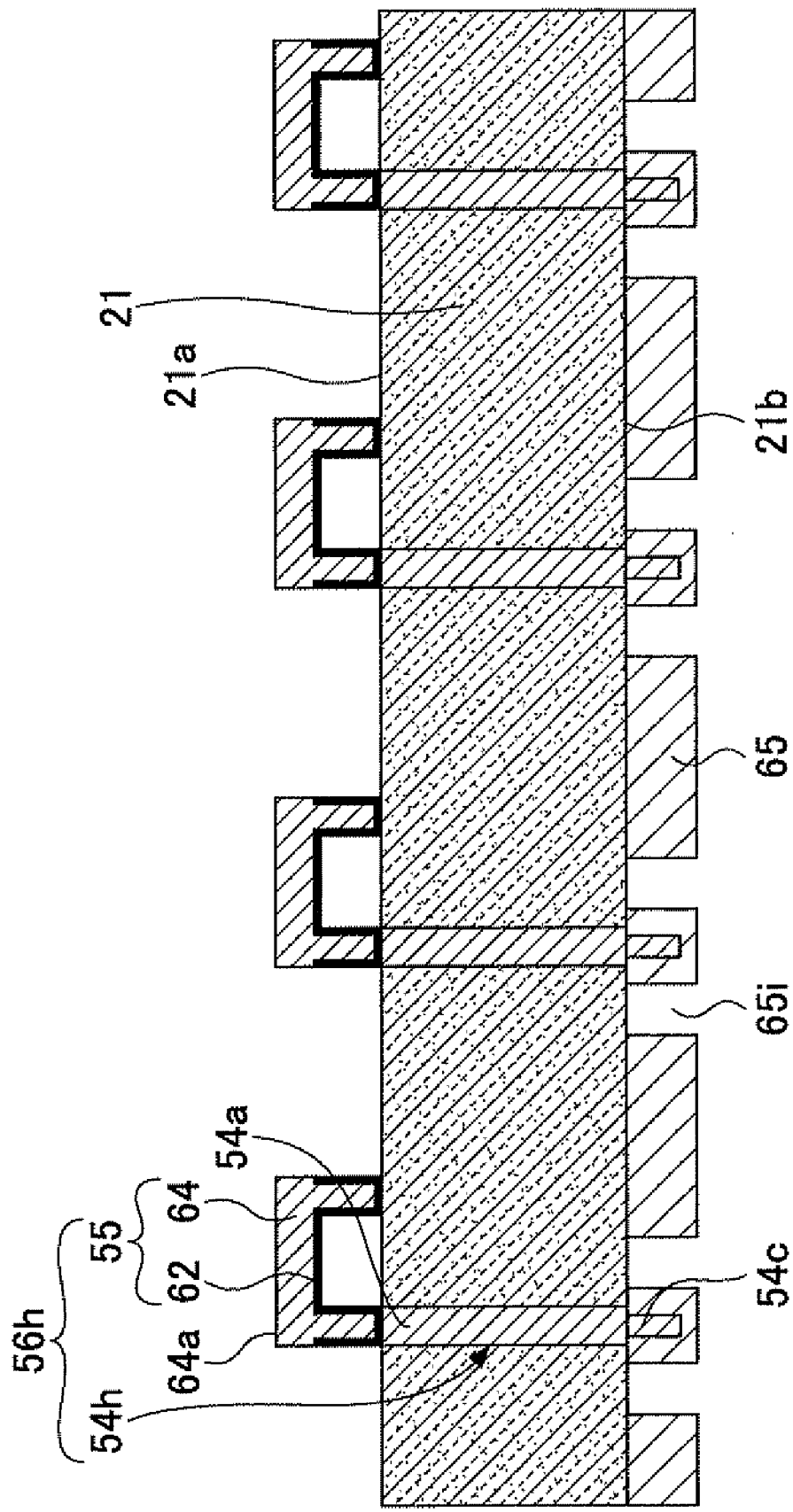
FIG. 63 is a cross-sectional view illustrating a first step of a manufacturing method of the semiconductor package illustrated in FIG. 62.
Figure 64:
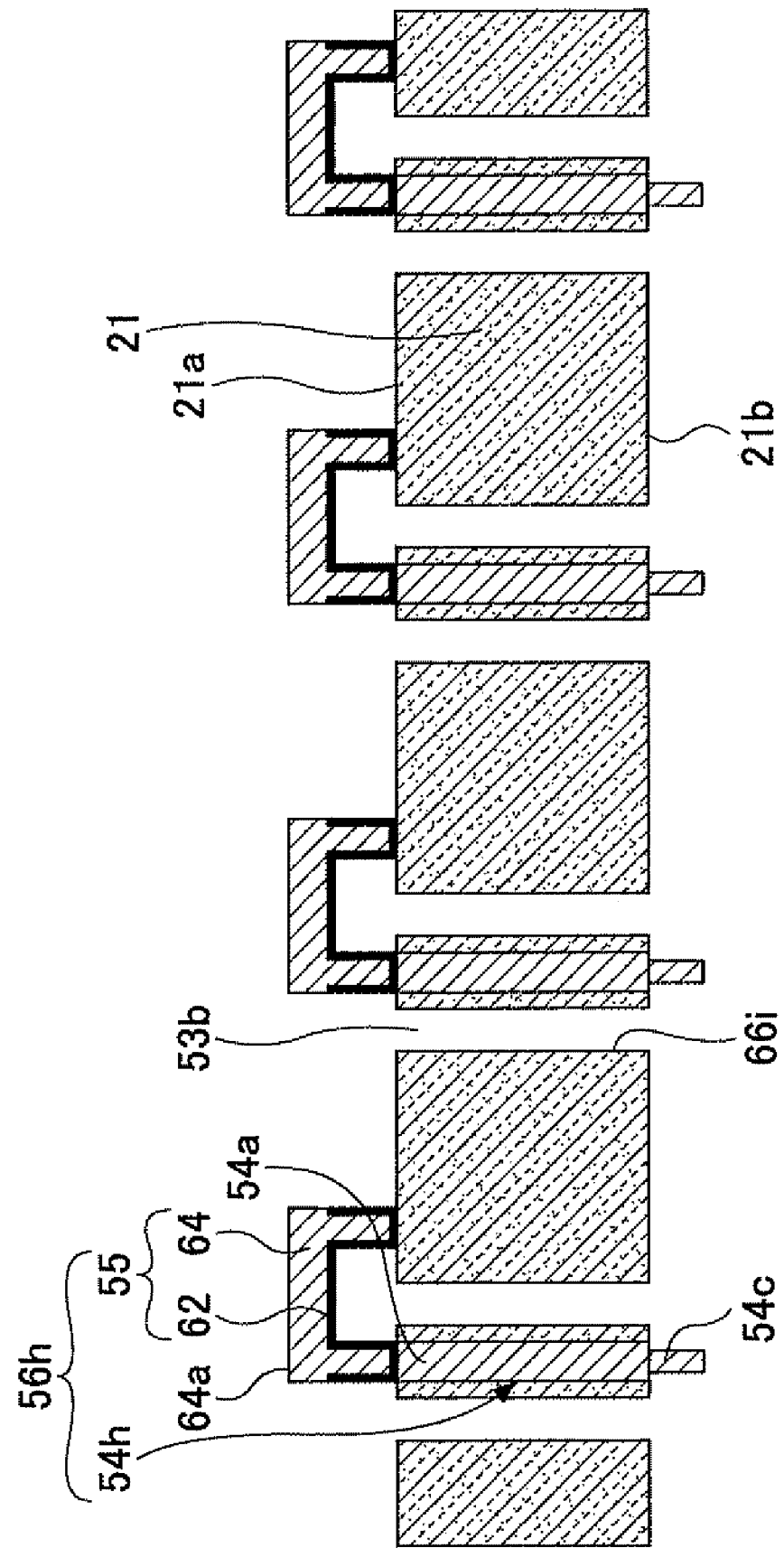
FIG. 64 is a cross-sectional view illustrating a second step of the manufacturing method of the semiconductor package illustrated in FIG. 62.

A description will be given below, of a manufacturing method of the semiconductor package according to the second variation of the second embodiment. FIG. 63 through FIG. 65 are cross-sectional views for explaining the manufacturing method of the semiconductor package according to the second variation of the second embodiment. In FIG. 63 through FIG. 65, parts that are the same as the parts illustrated in FIG. 55 through FIG. 61 are given the same reference numerals, and descriptions thereof may be omitted. Because the manufacturing method of parts other than the semiconductor device 50*i* is the same as the manufacturing method of the semiconductor package according to the first embodiment, a description will be focused on the manufacturing method of the semiconductor device 50*i*.

Figure 58:
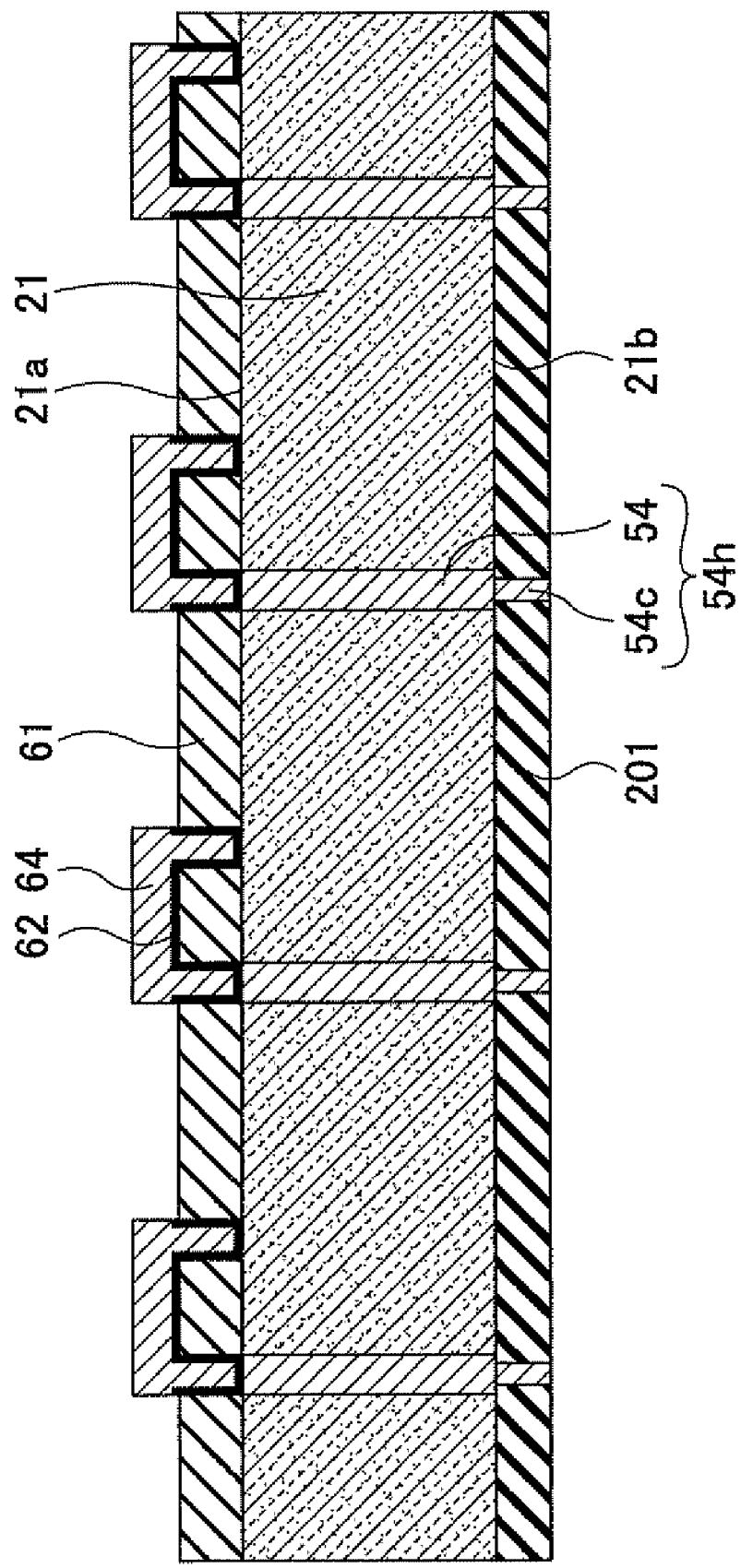
FIG. 58 is a cross-sectional view illustrating a fourth step of the manufacturing method of the semiconductor package illustrated in FIG. 54.
Figure 59:
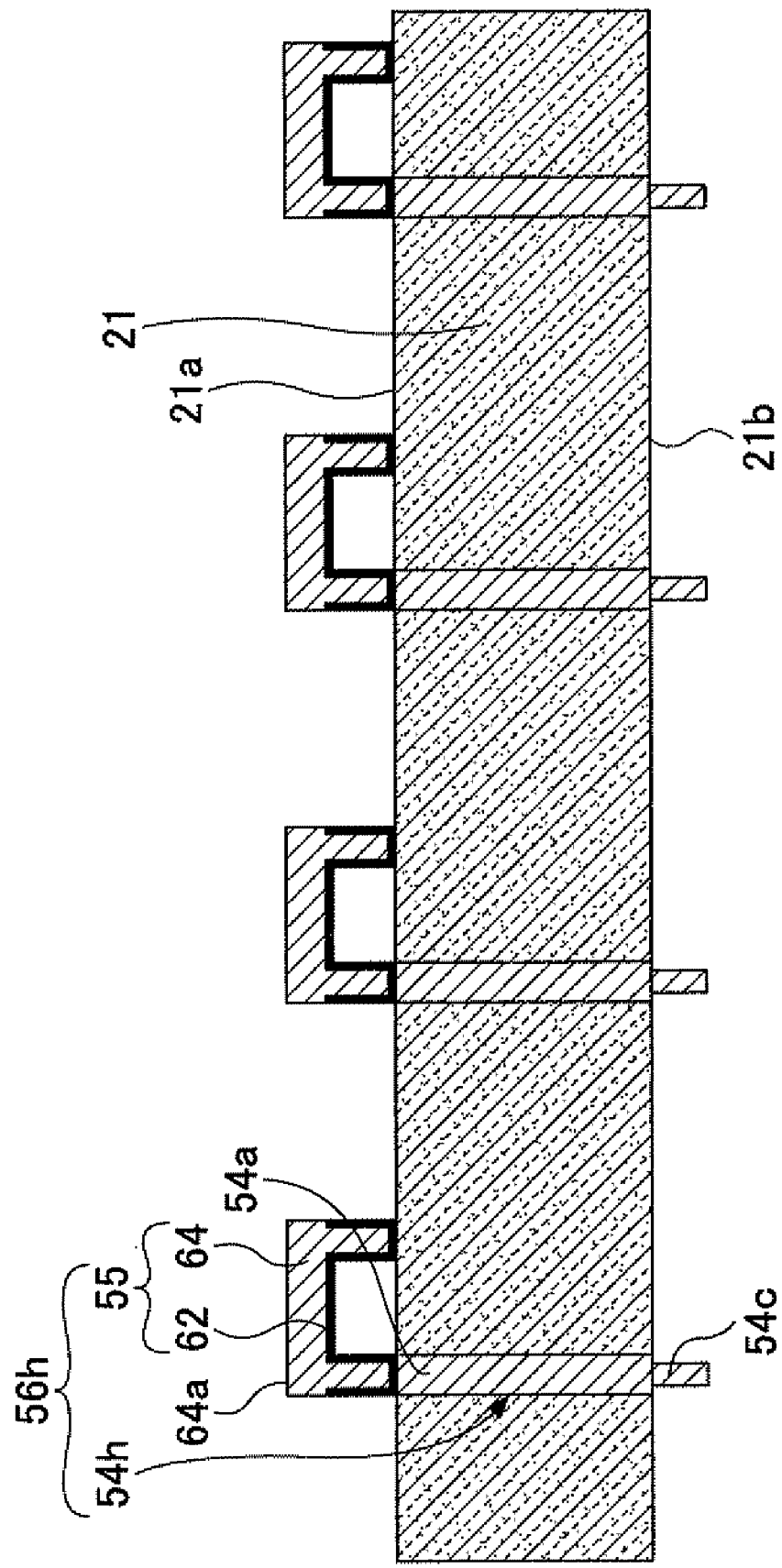
FIG. 59 is a cross-sectional view illustrating a fifth step of the manufacturing method of the semiconductor package illustrated in FIG. 54.
Figure 60:
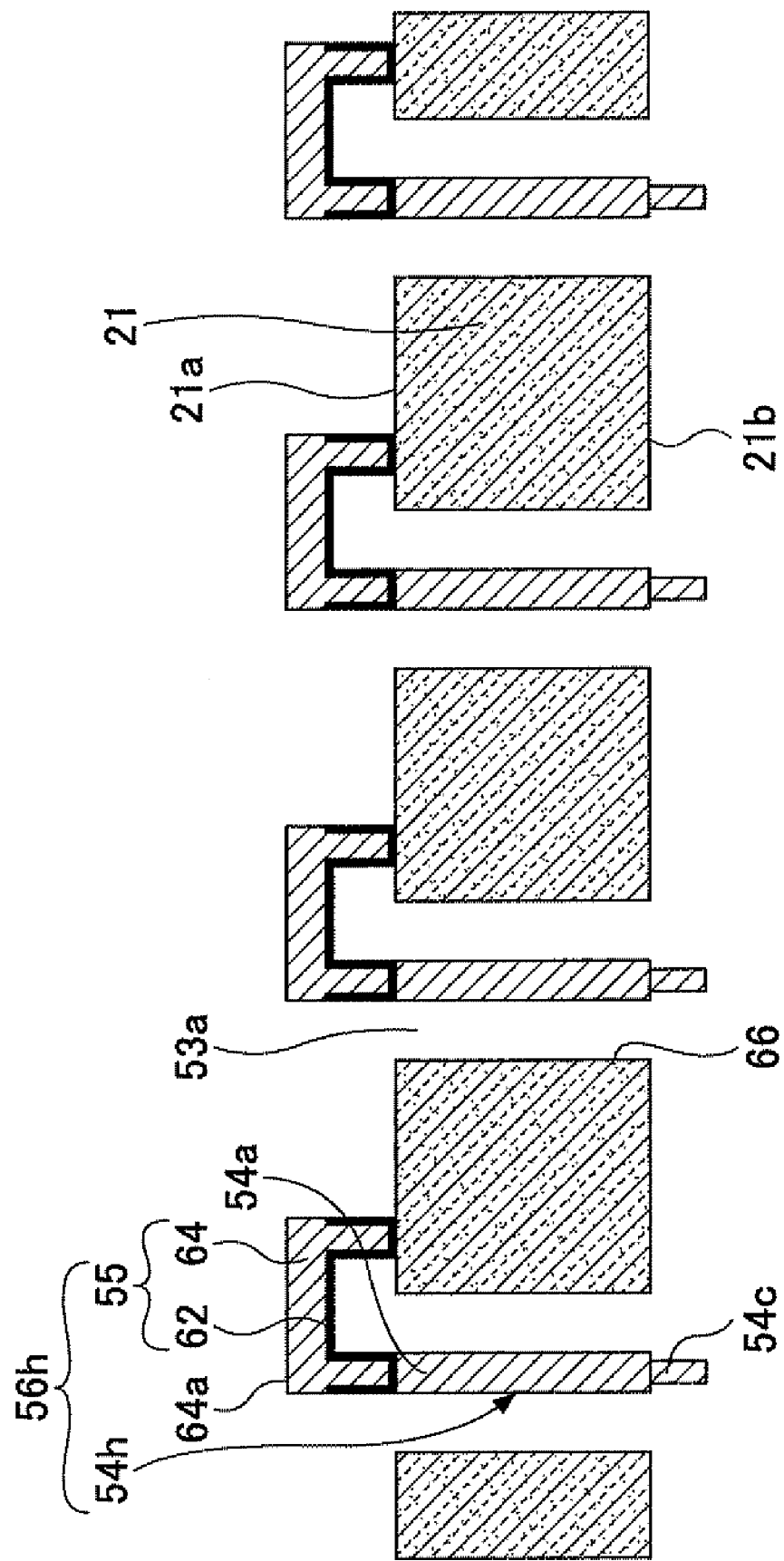
FIG. 60 is a cross-sectional view illustrating a sixth step of the manufacturing method of the semiconductor package illustrated in FIG. 54.

First, the penetration electrode 56, which consists of the penetration part 54*h* and the support part 55 having the seed layer 62 and the plated film 64 as illustrated in FIG. 59, is formed. Specifically, similar to the first variation, after performing a process similar to the process illustrated in FIGS. 21 and 22, a process similar to the process illustrated in FIGS. 55 and 56. Then, a process similar to the process illustrated in FIG. 10 is performed, and, thereafter, a process similar to the process of FIG. 57 is performed. Subsequently, a process similar to the process of FIG. 24 through FIG. 28 is performed, and, thereafter, a process similar to the process of FIG. 58 and FIG. 59 is performed.

Subsequently, in a first step illustrated in FIG. 63, a resist film 65 is formed to cover the lower surface 21*b* of the semiconductor chip 21. The thickness of a portion of the resist film 65, which portion is formed on the lower surface 21*b* of the semiconductor chip 21, can be set to, for example, 20 μm. Then, openings 65*i* are formed in the resist film 65 by exposing the resist film 65 through a mask and developing the exposed resist film 65. Each opening 65*i* has an annular shape in a plan view to surround the end 54*c* of the penetration part 54*h*. The end 54*c* of the penetration part 54*h* is covered by the resist film 65. The inner diameter of the opening 65*i* can be set to, for example, 40 μm, and the outer diameter of the opening 65*i* can be set to, for example, 60 μm.

Subsequently, in a second step illustrated in FIG. 64, a space 66*i* is formed to enlarge the penetration hole 53. The enlarged penetration hole 53 is referred to as a penetration hole 53*a*. The space 66*i* has an annular shape in a plan view to surround the end 54*c* of the penetration part 54*h* so that the entire side surface of the penetration part 54*h* is covered by the silicon, which forms the semiconductor chip 21. The space 66*i* can be formed by an anisotropic etching method such as, for example, dry etching. The inner diameter of the space 66*i* can be set to, for example, 40 μm, and the outer diameter of the space 66*i* can be set to, for example, 60 μm. After forming the space 66*i*, the resist film 65 is removed. Thereby, the penetration part 54*h* having the entire side surface covered by the silicon forming the semiconductor chip 21 can penetrate through the semiconductor chip 21 without contacting the semiconductor chip 21.

Subsequently, after performing a process similar to the process illustrated in FIG. 34, in a third step illustrated in FIG. 65, portions of the plated film 52, which portions are formed on the end 54*c* of the penetration part 54*h* and the upper surface 64*a* of the plated film 64 constituting the support part 55, are removed. The insulation film 52 can be removed by performing an anisotropic etching such as, for example, dry etching after forming a resist film which opens portions of the insulation film 52 to be removed.

Subsequently, the connection terminal 27 is formed on the end 54*c* of the penetration part 54*h* by performing a process similar to the process illustrated in FIG. 17. It is desirable to form a gap between the connection terminal 27 and the surface 52*b* of the insulation film 52 so that the connection terminal does not contact the insulation film 52. Thereby, the connection terminal 27 can be movably supported by the support part 55 through the penetration part 54*h* in the Y-Y direction and the X-X direction.

The semiconductor package 11*i* according to the second variation can provide the same effects as the semiconductor package 10 according to the first embodiment of the present invention. Further, because the entire side surface of the penetration part 54*h* is covered by the silicon forming the semiconductor chip 21, the penetration part 54*h* is reinforced and strengthened by the silicon of the semiconductor chip 21.

In each of the above-mentioned embodiments and variations thereof, the wiring board of the semiconductor package is not limited to the wiring board provided in the first embodiment, which has a built-up wiring layer without a core part. That is, various types of wiring boards can be used, such as, for example, a single-sided (single layer) wiring board having a wiring layer on one side, a double-sided (dual layer) wiring board having a wiring layer on each side, a penetration multi-layer wiring board in which wiring layers are connected by a through via, a wiring board having a built-up wiring layer with a core part, and an interstitial via hole (IVH) multi-layer wiring board in which specific wiring layers are connected by an interstitial via hole (IVH).

All examples and conditional language recited herein are intended for pedagogical purposes to aid the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A semiconductor package comprising:
   a wiring board; and
   a semiconductor device mounted on said wiring board, said semiconductor device including:
   a semiconductor chip;
   at least one penetration hole extending from one surface of said semiconductor chip to an opposite surface of said semiconductor chip;
   a penetration electrode situated inside said penetration hole without contacting a wall of said penetration hole, said penetration electrode having one end fixed to said one surface of said semiconductor chip and an opposite end protruding from said opposite surface of said semiconductor chip; and
   a connection terminal formed on said opposite end of said penetration electrode and electrically connected to said wiring board,
   wherein said penetration electrode includes:
   a penetration part situated inside said penetration hole without contacting said wall of said penetration hole; and
   a support part integrally formed with said penetration part and including said one end fixed to said one surface of said semiconductor chip, the support part having a spring characteristic, wherein a space is formed between said support part and said semiconductor chip.

2. The semiconductor package as claimed in claim 1, wherein said one end of said penetration electrode is electrically connected to a wiring layer of said semiconductor chip.

3. The semiconductor package as claimed in claim 1, wherein a side surface of said penetration part is covered by a base material of said semiconductor chip, and said base material covering said penetration part is not in contact with said wall of said penetration hole.

4. The semiconductor package as claimed in claim 3, wherein said base material of said semiconductor chip is silicon.

5. The semiconductor package as claimed in claim 1, wherein said wall of said penetration hole is covered by an insulation film.

6. The semiconductor package as claimed in claim 1, wherein said one end of said penetration electrode protrudes from said one surface of said semiconductor chip.

7. The semiconductor package as claimed in claim 1, wherein said one end of said penetration electrode is at the same level with said one surface of said semiconductor chip.

8. The semiconductor package as claimed in claim 1, wherein said penetration electrode is covered by an insulation film.

9. A semiconductor package comprising:
a wiring board;
an interposer connected to said wiring board; and
a semiconductor chip connected to said interposer, said interposer including:
a substrate;
at least one penetration hole extending from one surface of said substrate to an opposite surface of said substrate;
a penetration electrode situated inside said penetration hole without contacting a wall of said penetration hole, said penetration electrode having one end fixed to said one surface of said substrate and electrically connected to said semiconductor chip, an opposite end of said penetration electrode protruding from said opposite surface of said substrate; and
a connection terminal formed on said opposite end of said penetration electrode and electrically connected to said wiring board,
wherein said penetration electrode includes:
a penetration part situated inside said penetration hole without contacting said wall of said penetration hole; and
a support part integrally formed with said penetration part and fixed to said one surface of said substrate, the support part having a spring characteristic,
wherein a space is formed between said support part and said substrate.

10. The semiconductor package as claimed in claim 9, wherein a side surface of said penetration part is covered by a base material of said substrate, and said base material covering said penetration part is not in contact with said wall of said penetration hole.

11. The semiconductor package as claimed in claim 10, wherein said base material of said semiconductor chip is silicon.

12. The semiconductor package as claimed in claim 9, wherein said wall of said penetration hole is covered by an insulation film.

13. The semiconductor package as claimed in claim 9, wherein said penetration electrode is formed of copper.

14. The semiconductor package as claimed in claim 9, wherein said one end of said penetration electrode protrudes from said one surface of said substrate.

15. The semiconductor package as claimed in claim 9, wherein said one end of said penetration electrode is at the same level with said one surface of said semiconductor chip.

16. The semiconductor package as claimed in claim 9, wherein said penetration electrode is covered by an insulation film.

* * * * *